United States Patent
Yamane et al.

(10) Patent No.: US 9,196,818 B2
(45) Date of Patent: *Nov. 24, 2015

(54) BOUNDARY ACOUSTIC WAVE DEVICE

(71) Applicant: Murata Manufacturing Co., Ltd., Nagaokakyo-shi, Kyoto-fu (JP)

(72) Inventors: Takashi Yamane, Kusatsu (JP); Takeshi Nakao, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 141 days.

This patent is subject to a terminal disclaimer.

(21) Appl. No.: 13/845,205

(22) Filed: Mar. 18, 2013

(65) Prior Publication Data

US 2014/0117810 A1    May 1, 2014

Related U.S. Application Data

(60) Division of application No. 12/913,847, filed on Oct. 28, 2010, now Pat. No. 8,436,510, which is a continuation of application No. PCT/JP2009/001476, filed on Mar. 31, 2009.

(30) Foreign Application Priority Data

Apr. 30, 2008    (JP) ................. 2008-118601

(51) Int. Cl.
*H01L 41/187*    (2006.01)
*H01L 41/18*    (2006.01)
*H03H 9/02*    (2006.01)

(52) U.S. Cl.
CPC ............. *H01L 41/18* (2013.01); *H03H 9/0222* (2013.01); *H03H 9/02574* (2013.01); *H03H 9/02559* (2013.01)

(58) Field of Classification Search
CPC . H01L 41/18; H01L 41/1871; H01L 41/1873; H03H 9/0222
USPC ...... 310/313 R, 313 A, 313 B, 313 C, 313 D, 310/358; 252/62.9 R, 62.9 PZ
See application file for complete search history.

(56) References Cited

U.S. PATENT DOCUMENTS

2005/0057323 A1*  3/2005  Kando .................. 333/141
2007/0001549 A1*  1/2007  Kando .................. 310/320

(Continued)

FOREIGN PATENT DOCUMENTS

EP       1879291      *  5/2009  ............. H03H 9/145
WO   WO 2006/114930  *  4/2008  ............. H03H 9/145

OTHER PUBLICATIONS

Yamane et al., "Boundary Acoustic Wave Device", U.S. Appl. No. 12/913,847, filed Oct. 28, 2010.

*Primary Examiner* — Derek Rosenau
(74) *Attorney, Agent, or Firm* — Keating & Bennett, LLP

(57) ABSTRACT

A boundary acoustic wave device includes an $LiTaO_3$ piezoelectric substrate, a first dielectric medium layer disposed on the piezoelectric substrate, a second dielectric medium layer disposed on the first medium layer and having a sound velocity different from the first medium layer, and an interdigital electrode disposed at the boundary between the piezoelectric substrate and the first medium layer. The sound velocity of the first medium layer is less than the sound velocity of $LiTaO_3$. The sound velocity of the second medium layer is greater than the sound velocity of $LiTaO_3$. The inequality $(h/\lambda) \times a \leq 0.05$ is satisfied, where H is the thickness of the first medium layer, h is the thickness of the interdigital electrode, $\lambda$ is the period of electrode fingers of the interdigital electrode, and a is the ratio of the density of a metal of the interdigital electrode to the density of Au.

8 Claims, 16 Drawing Sheets

(56) References Cited

U.S. PATENT DOCUMENTS

| | | | |
|---|---|---|---|
| 2007/0132339 A1* | 6/2007 | Nishiyama et al. | 310/313 R |
| 2007/0159026 A1* | 7/2007 | Kando | 310/313 D |
| 2009/0189483 A1* | 7/2009 | Kadota et al. | 310/313 B |

* cited by examiner

Pt = 3.0%

Pt = 5.0%

Pt = 6.0%

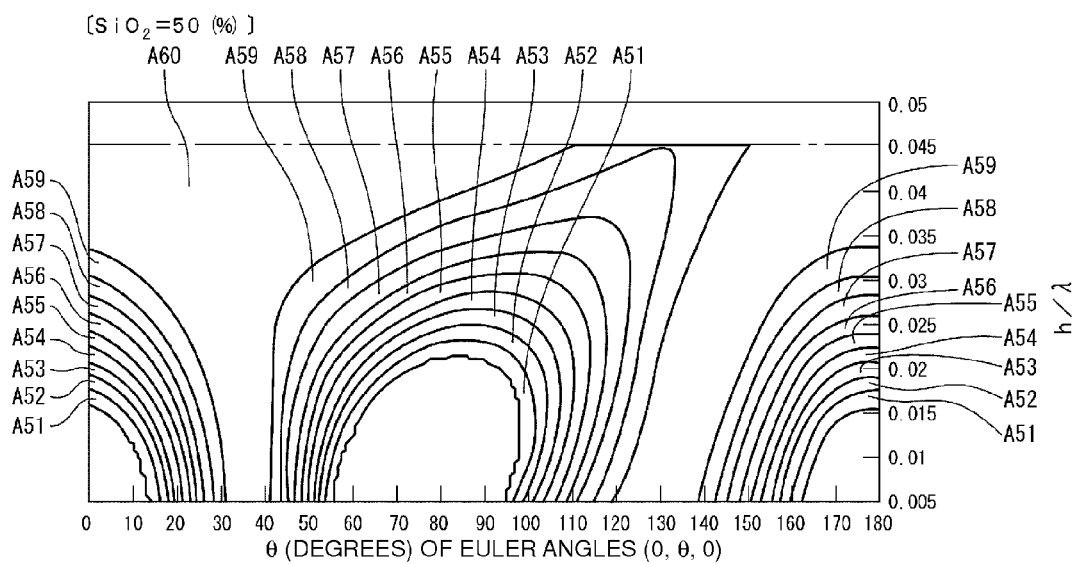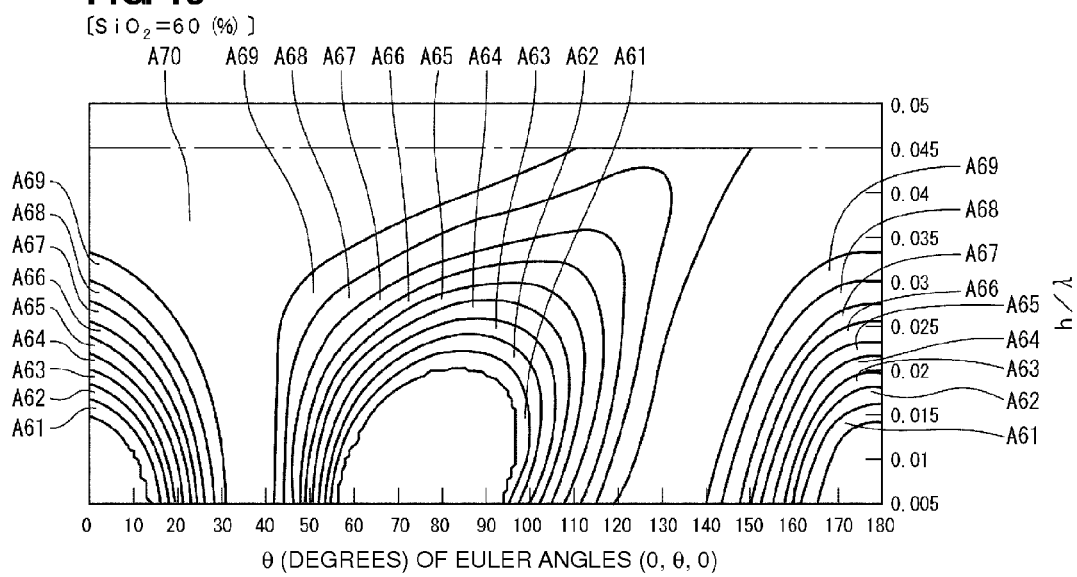

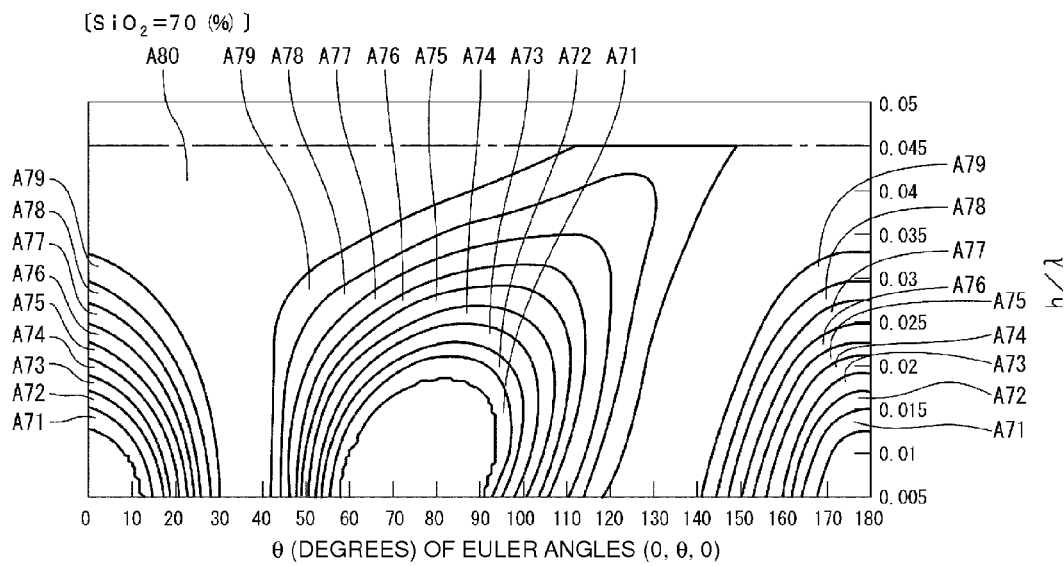
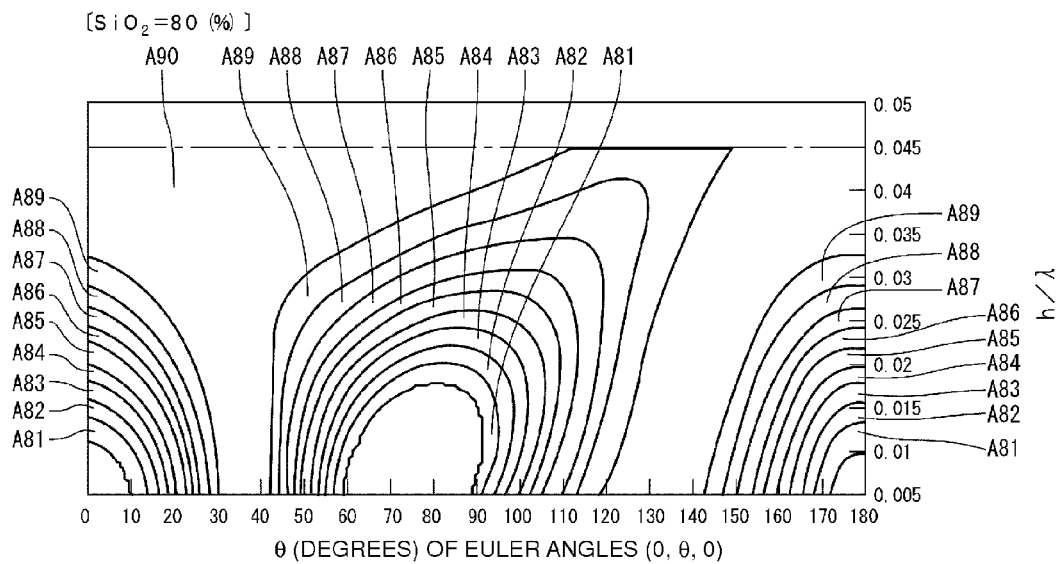

[SiO₂=90 (%)]

[SiO₂=100 (%)]

[SiO₂=20 (%)]

θ (DEGREES) OF EULER ANGLES (0, θ, 0)

[SiO₂=30 (%)]

θ (DEGREES) OF EULER ANGLES (0, θ, 0)

[SiO₂=60 (%)]

[SiO₂=70 (%)]

[SiO$_2$=80 (%)]

[SiO$_2$=90 (%)]

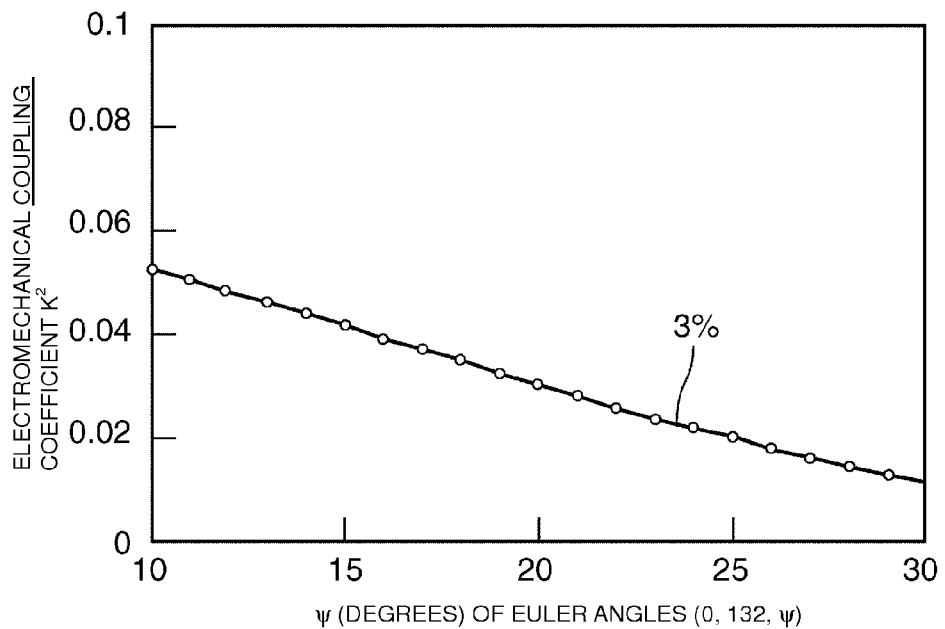
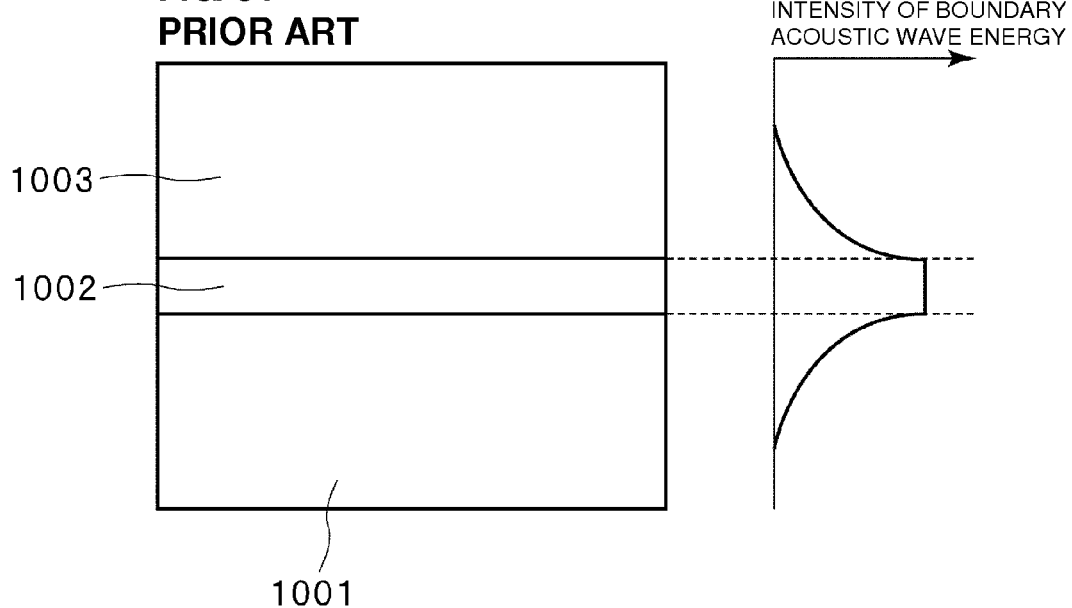

BOUNDARY ACOUSTIC WAVE DEVICE

BACKGROUND OF THE INVENTION

1. Field of the Invention

The present invention relates to boundary acoustic wave devices for use in, for example, resonators and filters, and particularly, to a boundary acoustic wave device having a three-medium structure in which a first medium layer and a second medium layer are arranged on a piezoelectric substrate made of $LiTaO_3$.

2. Description of the Related Art

In recent years, boundary acoustic wave devices have been substituted for surface acoustic wave devices and have been attracting much attention. The boundary acoustic wave devices do not require packages having cavities. Therefore, the use of the boundary acoustic wave devices is effective to achieve compact resonators and filters.

WO 98/52279 discloses an exemplary boundary acoustic wave device having a three-medium structure in which a first medium layer and a second medium layer are arranged on a piezoelectric substrate. With reference to FIG. 31, interdigital electrodes (not shown) are arranged on a piezoelectric substrate 1001 and a polycrystalline silicon oxide layer defining a first medium layer 1002 and a polycrystalline silicon layer defining a second medium layer 1003 are arranged on the piezoelectric substrate 1001. The IDT electrodes are arranged at the interface between the piezoelectric substrate and the polycrystalline silicon oxide layer.

The presence of the polycrystalline silicon layer allows the energy of a boundary acoustic wave excited by the IDT electrodes to be confined in the first medium layer 1002, which is made of the polycrystalline silicon oxide layer, as shown in FIG. 31.

Even if the quality of the polycrystalline silicon layer is deteriorated, electrical properties of the boundary acoustic wave device are unlikely to be deteriorated. Since the polycrystalline silicon oxide layer and the polycrystalline silicon layer protect the IDT electrodes, the reliability of the boundary acoustic wave device is outstanding. The use of the three-medium structure is particularly effective for higher frequencies.

WO 98/52279 does not address changes in properties depending on the thickness of the IDT electrodes. However, it has been determined that when IDT electrodes have an increased thickness or are made of a high-density metal, an undesired transverse-mode ripple is excited in such a conventional boundary acoustic wave device as disclosed in WO 98/52279. The three-medium structure, which includes $LiTaO_3$ as disclosed in WO 98/52279, is not always capable of obtaining good properties.

SUMMARY OF THE INVENTION

To overcome the problems described above, preferred embodiments of the present invention provide a boundary acoustic wave device which has a three-medium structure including a piezoelectric substrate made of single-crystalline $LiTaO_3$ and which suppresses transverse-mode ripples appearing in the frequency response, reduces the propagation constant $\alpha$, and increases the electromechanical coupling coefficient $K^2$ so as to expand the pass band.

A preferred embodiment of the present invention provides a boundary acoustic wave device that includes a piezoelectric substrate made of single-crystalline $LiTaO_3$, a first medium layer which is disposed on the piezoelectric substrate and which is made of a dielectric material, a second medium layer which is disposed on the first medium layer and which is made of a dielectric material having a sound velocity different from that of the dielectric material of the first medium layer, and at least one interdigital electrode disposed at the boundary between the piezoelectric substrate and the first medium layer. The sound velocity of the first medium layer is less than the sound velocity of $LiTaO_3$. The sound velocity of the second medium layer is greater than the sound velocity of $LiTaO_3$. The inequality $(h/\lambda) \times a \leq 0.05$ is satisfied, where H is the thickness of the first medium layer, h is the thickness of the interdigital electrode, $\lambda$ is the period of electrode fingers of the interdigital electrode, and a is the ratio of the density of a metal of the interdigital electrode to the density of Au.

In the boundary acoustic wave device according to a preferred embodiment of the present invention, the dielectric material of the first medium layer is not particularly limited and is preferably $SiO_2$, for example. This enables the absolute value of the temperature coefficient of frequency of the boundary acoustic wave device to be small because $LiTaO_3$ has a negative temperature coefficient of frequency and $SiO_2$ has a positive temperature coefficient of frequency. Therefore, changes in properties due to changes in temperature are reduced.

In the boundary acoustic wave device according to a preferred embodiment of the present invention, the dielectric material of the second medium layer is not particularly limited and is preferably at least one material selected from the group consisting of SiN, SiON, AlN, AlO, Si, SiC, diamond-like carbon, and polysilicon, for example. In this case, a boundary acoustic wave can be confined in an $SiO_2$ layer by a waveguide effect.

When the $LiTaO_3$ has Euler angles $(0°\pm5°, \theta, 0°\pm25°)$, the normalized thickness $(h/\lambda) \times a$ of the interdigital electrode is preferably within one of the ranges shown in Tables 1 to 10 below with respect to the value of $H/\lambda$ and the value of $\theta$.

TABLE 1

| For $[0.05 \leq H/\lambda < 0.15]$ | |
| --- | --- |
| When $0 \leq \theta < 75.5$ | $(h/\lambda) \times a$ is 0.005 to 0.05. |
| When $75.5 \leq \theta < 76.5$ | $(h/\lambda) \times a$ is 0.005 to 0.014 or 0.021 to 0.05. |
| When $76.5 \leq \theta < 77.5$ | $(h/\lambda) \times a$ is 0.005 to 0.014 or 0.022 to 0.05. |
| When $77.5 \leq \theta < 78.5$ | $(h/\lambda) \times a$ is 0.005 to 0.0135 or 0.023 to 0.05. |
| When $78.5 \leq \theta < 79.5$ | $(h/\lambda) \times a$ is 0.005 to 0.013 or 0.024 to 0.05. |
| When $79.5 \leq \theta < 80.5$ | $(h/\lambda) \times a$ is 0.005 to 0.013 or 0.025 to 0.05. |
| When $80.5 \leq \theta < 81.5$ | $(h/\lambda) \times a$ is 0.005 to 0.013 or 0.0255 to 0.05. |
| When $81.5 \leq \theta < 82.5$ | $(h/\lambda) \times a$ is 0.005 to 0.013 or 0.026 to 0.05. |
| When $82.5 \leq \theta < 83.5$ | $(h/\lambda) \times a$ is 0.005 to 0.013 or 0.0265 to 0.05. |
| When $83.5 \leq \theta < 84.5$ | $(h/\lambda) \times a$ is 0.005 to 0.013 or 0.027 to 0.05. |
| When $84.5 \leq \theta < 85.5$ | $(h/\lambda) \times a$ is 0.005 to 0.013 or 0.0275 to 0.05. |
| When $85.5 \leq \theta < 86.5$ | $(h/\lambda) \times a$ is 0.005 to 0.013 or 0.028 to 0.05. |
| When $86.5 \leq \theta < 87.5$ | $(h/\lambda) \times a$ is 0.005 to 0.013 or 0.0285 to 0.05. |
| When $87.5 \leq \theta < 88.5$ | $(h/\lambda) \times a$ is 0.005 to 0.0135 or 0.029 to 0.05. |
| When $88.5 \leq \theta < 90.5$ | $(h/\lambda) \times a$ is 0.005 to 0.0135 or 0.0295 to 0.05. |
| When $90.5 \leq \theta < 91.5$ | $(h/\lambda) \times a$ is 0.005 to 0.014 or 0.03 to 0.05. |
| When $91.5 \leq \theta < 92.5$ | $(h/\lambda) \times a$ is 0.005 to 0.014 or 0.0305 to 0.05. |

TABLE 1-continued

For [0.05 ≤ H/λ < 0.15]

| | |
|---|---|
| When 92.5 ≤ θ < 93.5 | (h/λ) X a is 0.005 to 0.0145 or 0.0305 to 0.05. |
| When 93.5 ≤ θ < 94.5 | (h/λ) X a is 0.005 to 0.0145 or 0.031 to 0.05. |
| When 94.5 ≤ θ < 95.5 | (h/λ) X a is 0.005 to 0.015 or 0.031 to 0.05. |
| When 95.5 ≤ θ < 96.5 | (h/λ) X a is 0.005 to 0.0155 or 0.0315 to 0.05. |
| When 96.5 ≤ θ < 97.5 | (h/λ) X a is 0.005 to 0.016 or 0.0315 to 0.05. |
| When 97.5 ≤ θ < 98.5 | (h/λ) X a is 0.005 to 0.0165 or 0.032 to 0.05. |
| When 98.5 ≤ θ < 99.5 | (h/λ) X a is 0.005 to 0.017 or 0.032 to 0.05. |
| When 99.5 ≤ θ < 100.5 | (h/λ) X a is 0.005 to 0.0175 or 0.032 to 0.05. |
| When 100.5 ≤ θ < 101.5 | (h/λ) X a is 0.005 to 0.018 or 0.0325 to 0.05. |
| When 101.5 ≤ θ < 102.5 | (h/λ) X a is 0.005 to 0.0185 or 0.0325 to 0.05. |
| When 102.5 ≤ θ < 103.5 | (h/λ) X a is 0.005 to 0.019 or 0.0325 to 0.05. |
| When 103.5 ≤ θ < 104.5 | (h/λ) X a is 0.005 to 0.0195 or 0.0325 to 0.05. |
| When 104.5 ≤ θ < 105.5 | (h/λ) X a is 0.005 to 0.0205 or 0.033 to 0.05. |
| When 105.5 ≤ θ < 106.5 | (h/λ) X a is 0.005 to 0.0215 or 0.033 to 0.05. |
| When 106.5 ≤ θ < 107.5 | (h/λ) X a is 0.005 to 0.0225 or 0.033 to 0.05. |
| When 107.5 ≤ θ < 108.5 | (h/λ) X a is 0.005 to 0.0235 or 0.033 to 0.05. |
| When 108.5 ≤ θ < 109.5 | (h/λ) X a is 0.005 to 0.024 or 0.0325 to 0.05. |
| When 109.5 ≤ θ < 110.5 | (h/λ) X a is 0.005 to 0.026 or 0.0325 to 0.05. |
| When 110.5 ≤ θ < 111.5 | (h/λ) X a is 0.005 to 0.028 or 0.032 to 0.05. |
| When 111.5 ≤ θ < 112.5 | (h/λ) X a is 0.005 to 0.0295 or 0.0305 to 0.05. |
| When 112.5 ≤ θ < 180 | (h/λ) X a is 0.005 to 0.05. |

TABLE 2

For [0.15 ≤ H/λ < 0.25]

| | |
|---|---|
| When 0 ≤ θ < 1.5 | (h/λ) X a is 0.024 to 0.05. |
| When 1.5 ≤ θ < 3.5 | (h/λ) X a is 0.0235 to 0.05. |
| When 3.5 ≤ θ < 4.5 | (h/λ) X a is 0.023 to 0.05. |
| When 4.5 ≤ θ < 5.5 | (h/λ) X a is 0.0225 to 0.05. |
| When 5.5 ≤ θ < 6.5 | (h/λ) X a is 0.022 to 0.05. |
| When 6.5 ≤ θ < 7.5 | (h/λ) X a is 0.0215 to 0.05. |
| When 7.5 ≤ θ < 8.5 | (h/λ) X a is 0.021 to 0.05. |
| When 8.5 ≤ θ < 9.5 | (h/λ) X a is 0.02 to 0.05. |
| When 9.5 ≤ θ < 10.5 | (h/λ) X a is 0.0195 to 0.05. |
| When 10.5 ≤ θ < 11.5 | (h/λ) X a is 0.0185 to 0.05. |
| When 11.5 ≤ θ < 12.5 | (h/λ) X a is 0.0175 to 0.05. |
| When 12.5 ≤ θ < 13.5 | (h/λ) X a is 0.0165 to 0.05. |
| When 13.5 ≤ θ < 14.5 | (h/λ) X a is 0.015 to 0.05. |
| When 14.5 ≤ θ < 15.5 | (h/λ) X a is 0.013 to 0.05. |
| When 15.5 ≤ θ < 16.5 | (h/λ) X a is 0.011 to 0.05. |
| When 16.5 ≤ θ < 54.5 | (h/λ) X a is 0.005 to 0.05. |
| When 54.5 ≤ θ < 55.5 | (h/λ) X a is 0.0125 to 0.05. |
| When 55.5 ≤ θ < 56.5 | (h/λ) X a is 0.0155 to 0.05. |
| When 56.5 ≤ θ < 57.5 | (h/λ) X a is 0.017 to 0.05. |
| When 57.5 ≤ θ < 58.5 | (h/λ) X a is 0.0185 to 0.05. |
| When 58.5 ≤ θ < 59.5 | (h/λ) X a is 0.0195 to 0.05. |
| When 59.5 ≤ θ < 60.5 | (h/λ) X a is 0.0205 to 0.05. |
| When 60.5 ≤ θ < 61.5 | (h/λ) X a is 0.0215 to 0.05. |
| When 61.5 ≤ θ < 62.5 | (h/λ) X a is 0.0225 to 0.05. |
| When 62.5 ≤ θ < 63.5 | (h/λ) X a is 0.023 to 0.05. |
| When 63.5 ≤ θ < 64.5 | (h/λ) X a is 0.0235 to 0.05. |
| When 64.5 ≤ θ < 65.5 | (h/λ) X a is 0.0245 to 0.05. |
| When 65.5 ≤ θ < 66.5 | (h/λ) X a is 0.025 to 0.05. |
| When 66.5 ≤ θ < 67.5 | (h/λ) X a is 0.0255 to 0.05. |

TABLE 2-continued

For [0.15 ≤ H/λ < 0.25]

| | |
|---|---|
| When 67.5 ≤ θ < 68.5 | (h/λ) X a is 0.026 to 0.05. |
| When 68.5 ≤ θ < 69.5 | (h/λ) X a is 0.0265 to 0.05. |
| When 69.5 ≤ θ < 70.5 | (h/λ) X a is 0.027 to 0.05. |
| When 70.5 ≤ θ < 72.5 | (h/λ) X a is 0.0275 to 0.05. |
| When 72.5 ≤ θ < 73.5 | (h/λ) X a is 0.028 to 0.05. |
| When 73.5 ≤ θ < 74.5 | (h/λ) X a is 0.0285 to 0.05. |
| When 74.5 ≤ θ < 76.5 | (h/λ) X a is 0.029 to 0.05. |
| When 76.5 ≤ θ < 78.5 | (h/λ) X a is 0.0295 to 0.05. |
| When 78.5 ≤ θ < 79.5 | (h/λ) X a is 0.03 to 0.05. |
| When 79.5 ≤ θ < 81.5 | (h/λ) X a is 0.0305 to 0.05. |
| When 81.5 ≤ θ < 83.5 | (h/λ) X a is 0.031 to 0.05. |
| When 83.5 ≤ θ < 86.5 | (h/λ) X a is 0.0315 to 0.05. |
| When 86.5 ≤ θ < 88.5 | (h/λ) X a is 0.032 to 0.05. |
| When 88.5 ≤ θ < 92.5 | (h/λ) X a is 0.0325 to 0.05. |
| When 92.5 ≤ θ < 97.5 | (h/λ) X a is 0.033 to 0.05. |
| When 97.5 ≤ θ < 98.5 | (h/λ) X a is 0.005 or 0.0335 to 0.05 |
| When 98.5 ≤ θ < 99.5 | (h/λ) X a is 0.005 to 0.006 or 0.0335 to 0.05. |
| When 99.5 ≤ θ < 100.5 | (h/λ) X a is 0.005 to 0.0065 or 0.0335 to 0.05. |
| When 100.5 ≤ θ < 101.5 | (h/λ) X a is 0.005 to 0.007 or 0.0335 to 0.05. |
| When 101.5 ≤ θ < 102.5 | (h/λ) X a is 0.005 to 0.0075 or 0.0335 to 0.05. |
| When 102.5 ≤ θ < 103.5 | (h/λ) X a is 0.005 to 0.0085 or 0.0335 to 0.05. |
| When 103.5 ≤ θ < 104.5 | (h/λ) X a is 0.005 to 0.009 or 0.0335 to 0.05. |
| When 104.5 ≤ θ < 105.5 | (h/λ) X a is 0.005 to 0.01 or 0.0335 to 0.05. |
| When 105.5 ≤ θ < 106.5 | (h/λ) X a is 0.005 to 0.011 or 0.0335 to 0.05. |
| When 106.5 ≤ θ < 107.5 | (h/λ) X a is 0.005 to 0.012 or 0.0335 to 0.05. |
| When 107.5 ≤ θ < 108.5 | (h/λ) X a is 0.005 to 0.0125 or 0.0335 to 0.05. |
| When 108.5 ≤ θ < 109.5 | (h/λ) X a is 0.005 to 0.0135 or 0.033 to 0.05. |
| When 109.5 ≤ θ < 110.5 | (h/λ) X a is 0.005 to 0.0145 or 0.033 to 0.05. |
| When 110.5 ≤ θ < 111.5 | (h/λ) X a is 0.005 to 0.016 or 0.0325 to 0.05. |
| When 111.5 ≤ θ < 112.5 | (h/λ) X a is 0.005 to 0.0175 or 0.0325 to 0.05. |
| When 112.5 ≤ θ < 113.5 | (h/λ) X a is 0.005 to 0.019 or 0.032 to 0.05. |
| When 113.5 ≤ θ < 114.5 | (h/λ) X a is 0.005 to 0.0215 or 0.031 to 0.05. |
| When 114.5 ≤ θ < 115.5 | (h/λ) X a is 0.005 to 0.024 or 0.028 to 0.05. |
| When 115.5 ≤ θ < 155.5 | (h/λ) X a is 0.005 to 0.05. |
| When 155.5 ≤ θ < 156.5 | (h/λ) X a is 0.0105 to 0.05. |
| When 156.5 ≤ θ < 157.5 | (h/λ) X a is 0.0125 to 0.05. |
| When 157.5 ≤ θ < 158.5 | (h/λ) X a is 0.015 to 0.05. |
| When 158.5 ≤ θ < 159.5 | (h/λ) X a is 0.016 to 0.05. |
| When 159.5 ≤ θ < 160.5 | (h/λ) X a is 0.0175 to 0.05. |
| When 160.5 ≤ θ < 161.5 | (h/λ) X a is 0.0185 to 0.05. |
| When 161.5 ≤ θ < 162.5 | (h/λ) X a is 0.0195 to 0.05. |
| When 162.5 ≤ θ < 163.5 | (h/λ) X a is 0.0205 to 0.05. |
| When 163.5 ≤ θ < 164.5 | (h/λ) X a is 0.021 to 0.05. |
| When 164.5 ≤ θ < 165.5 | (h/λ) X a is 0.0215 to 0.05. |
| When 165.5 ≤ θ < 166.5 | (h/λ) X a is 0.022 to 0.05. |
| When 166.5 ≤ θ < 167.5 | (h/λ) X a is 0.0225 to 0.05. |
| When 167.5 ≤ θ < 168.5 | (h/λ) X a is 0.023 to 0.05. |
| When 168.5 ≤ θ < 169.5 | (h/λ) X a is 0.0235 to 0.05. |
| When 169.5 ≤ θ < 171.5 | (h/λ) X a is 0.024 to 0.05. |
| When 171.5 ≤ θ < 179.5 | (h/λ) X a is 0.0245 to 0.05. |
| When 179.5 ≤ θ < 180 | (h/λ) X a is 0.024 to 0.05. |

TABLE 3

For [0.25 ≤ H/λ < 0.35]

| | |
|---|---|
| When 0 ≤ θ < 0.5 | (h/λ) X a is 0.0245 to 0.05. |
| When 0.5 ≤ θ < 3.5 | (h/λ) X a is 0.024 to 0.05. |

TABLE 3-continued

For [0.25 ≤ H/λ < 0.35]

| | |
|---|---|
| When 3.5 ≤ θ < 4.5 | (h/λ) X a is 0.0235 to 0.05. |
| When 4.5 ≤ θ < 6.5 | (h/λ) X a is 0.023 to 0.05. |
| When 6.5 ≤ θ < 7.5 | (h/λ) X a is 0.0225 to 0.05. |
| When 7.5 ≤ θ < 8.5 | (h/λ) X a is 0.022 to 0.05. |
| When 8.5 ≤ θ < 9.5 | (h/λ) X a is 0.0215 to 0.05. |
| When 9.5 ≤ θ < 10.5 | (h/λ) X a is 0.021 to 0.05. |
| When 10.5 ≤ θ < 11.5 | (h/λ) X a is 0.0205 to 0.05. |
| When 11.5 ≤ θ < 12.5 | (h/λ) X a is 0.0195 to 0.05. |
| When 12.5 ≤ θ < 13.5 | (h/λ) X a is 0.019 to 0.05. |
| When 13.5 ≤ θ < 14.5 | (h/λ) X a is 0.018 to 0.05. |
| When 14.5 ≤ θ < 15.5 | (h/λ) X a is 0.017 to 0.05. |
| When 15.5 ≤ θ < 16.5 | (h/λ) X a is 0.016 to 0.05. |
| When 16.5 ≤ θ < 17.5 | (h/λ) X a is 0.015 to 0.05. |
| When 17.5 ≤ θ < 18.5 | (h/λ) X a is 0.0135 to 0.05. |
| When 18.5 ≤ θ < 19.5 | (h/λ) X a is 0.0115 to 0.05. |
| When 19.5 ≤ θ < 20.5 | (h/λ) X a is 0.0095 to 0.05. |
| When 20.5 ≤ θ < 21.5 | (h/λ) X a is 0.006 to 0.05. |
| When 21.5 ≤ θ < 50.5 | (h/λ) X a is 0.005 to 0.05. |
| When 50.5 ≤ θ < 51.5 | (h/λ) X a is 0.008 to 0.05. |
| When 51.5 ≤ θ < 52.5 | (h/λ) X a is 0.0125 to 0.05. |
| When 52.5 ≤ θ < 53.5 | (h/λ) X a is 0.015 to 0.05. |
| When 53.5 ≤ θ < 54.5 | (h/λ) X a is 0.017 to 0.05. |
| When 54.5 ≤ θ < 55.5 | (h/λ) X a is 0.018 to 0.05. |
| When 55.5 ≤ θ < 56.5 | (h/λ) X a is 0.019 to 0.05. |
| When 56.5 ≤ θ < 57.5 | (h/λ) X a is 0.02 to 0.05. |
| When 57.5 ≤ θ < 58.5 | (h/λ) X a is 0.021 to 0.05. |
| When 58.5 ≤ θ < 59.5 | (h/λ) X a is 0.022 to 0.05. |
| When 59.5 ≤ θ < 60.5 | (h/λ) X a is 0.0225 to 0.05. |
| When 60.5 ≤ θ < 61.5 | (h/λ) X a is 0.023 to 0.05. |
| When 61.5 ≤ θ < 62.5 | (h/λ) X a is 0.0235 to 0.05. |
| When 62.5 ≤ θ < 63.5 | (h/λ) X a is 0.024 to 0.05. |
| When 63.5 ≤ θ < 64.5 | (h/λ) X a is 0.0245 to 0.05. |
| When 64.5 ≤ θ < 65.5 | (h/λ) X a is 0.025 to 0.05. |
| When 65.5 ≤ θ < 66.5 | (h/λ) X a is 0.0255 to 0.05. |
| When 66.5 ≤ θ < 67.5 | (h/λ) X a is 0.026 to 0.05. |
| When 67.5 ≤ θ < 68.5 | (h/λ) X a is 0.0265 to 0.05. |
| When 68.5 ≤ θ < 70.5 | (h/λ) X a is 0.027 to 0.05. |
| When 70.5 ≤ θ < 71.5 | (h/λ) X a is 0.0275 to 0.05. |
| When 71.5 ≤ θ < 73.5 | (h/λ) X a is 0.028 to 0.05. |
| When 73.5 ≤ θ < 75.5 | (h/λ) X a is 0.0285 to 0.05. |
| When 75.5 ≤ θ < 77.5 | (h/λ) X a is 0.029 to 0.05. |
| When 77.5 ≤ θ < 79.5 | (h/λ) X a is 0.0295 to 0.05. |
| When 79.5 ≤ θ < 82.5 | (h/λ) X a is 0.3 to 0.05. |
| When 82.5 ≤ θ < 85.5 | (h/λ) X a is 0.305 to 0.05. |
| When 85.5 ≤ θ < 89.5 | (h/λ) X a is 0.031 to 0.05. |
| When 89.5 ≤ θ < 102.5 | (h/λ) X a is 0.0351 to 0.05. |
| When 102.5 ≤ θ < 103.5 | (h/λ) X a is 0.005 or 0.0315 to 0.05. |
| When 103.5 ≤ θ < 104.5 | (h/λ) X a is 0.005 to 0.006 or 0.0315 to 0.05. |
| When 104.5 ≤ θ < 105.5 | (h/λ) X a is 0.005 to 0.007 or 0.0315 to 0.05. |
| When 105.5 ≤ θ < 106.5 | (h/λ) X a is 0.005 to 0.008 or 0.031 to 0.05. |
| When 106.5 ≤ θ < 107.5 | (h/λ) X a is 0.005 to 0.009 or 0.031 to 0.05. |
| When 107.5 ≤ θ < 108.5 | (h/λ) X a is 0.005 to 0.01 or 0.0305 to 0.05. |
| When 108.5 ≤ θ < 109.5 | (h/λ) X a is 0.005 to 0.0115 or 0.0305 to 0.05. |
| When 109.5 ≤ θ < 110.5 | (h/λ) X a is 0.005 to 0.0125 or 0.03 to 0.05. |
| When 110.5 ≤ θ < 111.5 | (h/λ) X a is 0.005 to 0.014 or 0.029 to 0.05. |
| When 111.5 ≤ θ < 112.5 | (h/λ) X a is 0.005 to 0.016 or 0.028 to 0.05. |
| When 112.5 ≤ θ < 113.5 | (h/λ) X a is 0.005 to 0.0185 or 0.0265 to 0.05. |
| When 113.5 ≤ θ < 152.5 | (h/λ) X a is 0.005 to 0.05. |
| When 152.5 ≤ θ < 153.5 | (h/λ) X a is 0.008 to 0.05. |
| When 153.5 ≤ θ < 154.5 | (h/λ) X a is 0.0105 to 0.05. |
| When 154.5 ≤ θ < 155.5 | (h/λ) X a is 0.012 to 0.05. |
| When 155.5 ≤ θ < 156.5 | (h/λ) X a is 0.035 to 0.05. |
| When 156.5 ≤ θ < 157.5 | (h/λ) X a is 0.015 to 0.05. |
| When 157.5 ≤ θ < 158.5 | (h/λ) X a is 0.0165 to 0.05. |
| When 158.5 ≤ θ < 159.5 | (h/λ) X a is 0.0175 to 0.05. |
| When 159.5 ≤ θ < 160.5 | (h/λ) X a is 0.018 to 0.05. |
| When 160.5 ≤ θ < 161.5 | (h/λ) X a is 0.019 to 0.05. |
| When 161.5 ≤ θ < 162.5 | (h/λ) X a is 0.02 to 0.05. |
| When 162.5 ≤ θ < 163.5 | (h/λ) X a is 0.0205 to 0.05. |
| When 163.5 ≤ θ < 164.5 | (h/λ) X a is 0.021 to 0.05. |
| When 164.5 ≤ θ < 165.5 | (h/λ) X a is 0.022 to 0.05. |
| When 165.5 ≤ θ < 166.5 | (h/λ) X a is 0.0225 to 0.05. |
| When 166.5 ≤ θ < 168.5 | (h/λ) X a is 0.023 to 0.05. |
| When 168.5 ≤ θ < 169.5 | (h/λ) X a is 0.0235 to 0.05. |
| When 169.5 ≤ θ < 171.5 | (h/λ) X a is 0.024 to 0.05. |
| When 171.5 ≤ θ < 180 | (h/λ) X a is 0.0245 to 0.05. |

TABLE 4

For [0.35 ≤ H/λ < 0.45]

| | |
|---|---|
| When 0 ≤ θ < 2.5 | (h/λ) X a is 0.0235 to 0.05. |
| When 2.5 ≤ θ < 4.5 | (h/λ) X a is 0.023 to 0.05. |
| When 4.5 ≤ θ < 5.5 | (h/λ) X a is 0.0225 to 0.05. |
| When 5.5 ≤ θ < 7.5 | (h/λ) X a is 0.022 to 0.05. |
| When 7.5 ≤ θ < 8.5 | (h/λ) X a is 0.0215 to 0.05. |
| When 8.5 ≤ θ < 9.5 | (h/λ) X a is 0.021 to 0.05. |
| When 9.5 ≤ θ < 10.5 | (h/λ) X a is 0.0205 to 0.05. |
| When 10.5 ≤ θ < 11.5 | (h/λ) X a is 0.02 to 0.05. |
| When 11.5 ≤ θ < 12.5 | (h/λ) X a is 0.0195 to 0.05. |
| When 12.5 ≤ θ < 13.5 | (h/λ) X a is 0.0185 to 0.05. |
| When 13.5 ≤ θ < 14.5 | (h/λ) X a is 0.018 to 0.05. |
| When 14.5 ≤ θ < 15.5 | (h/λ) X a is 0.017 to 0.05. |
| When 15.5 ≤ θ < 16.5 | (h/λ) X a is 0.016 to 0.05. |
| When 16.5 ≤ θ < 17.5 | (h/λ) X a is 0.015 to 0.05. |
| When 17.5 ≤ θ < 18.5 | (h/λ) X a is 0.0135 to 0.05. |
| When 18.5 ≤ θ < 19.5 | (h/λ) X a is 0.0125 to 0.05. |
| When 19.5 ≤ θ < 20.5 | (h/λ) X a is 0.0105 to 0.05. |
| When 20.5 ≤ θ < 21.5 | (h/λ) X a is 0.008 to 0.05. |
| When 21.5 ≤ θ < 22.5 | (h/λ) X a is 0.0055 to 0.05. |
| When 22.5 ≤ θ < 49.5 | (h/λ) X a is 0.005 to 0.05. |
| When 49.5 ≤ θ < 50.5 | (h/λ) X a is 0.0055 to 0.05. |
| When 50.5 ≤ θ < 51.5 | (h/λ) X a is 0.011 to 0.05. |
| When 51.5 ≤ θ < 52.5 | (h/λ) X a is 0.0135 to 0.05. |
| When 52.5 ≤ θ < 53.5 | (h/λ) X a is 0.0155 to 0.05. |
| When 53.5 ≤ θ < 54.5 | (h/λ) X a is 0.017 to 0.05. |
| When 54.5 ≤ θ < 55.5 | (h/λ) X a is 0.018 to 0.05. |
| When 55.5 ≤ θ < 56.5 | (h/λ) X a is 0.019 to 0.05. |
| When 56.5 ≤ θ < 57.5 | (h/λ) X a is 0.02 to 0.05. |
| When 57.5 ≤ θ < 58.5 | (h/λ) X a is 0.0205 to 0.05. |
| When 58.5 ≤ θ < 59.5 | (h/λ) X a is 0.0215 to 0.05. |
| When 59.5 ≤ θ < 60.5 | (h/λ) X a is 0.022 to 0.05. |
| When 60.5 ≤ θ < 61.5 | (h/λ) X a is 0.0225 to 0.05. |
| When 61.5 ≤ θ < 62.5 | (h/λ) X a is 0.023 to 0.05. |
| When 62.5 ≤ θ < 63.5 | (h/λ) X a is 0.0235 to 0.05. |
| When 63.5 ≤ θ < 64.5 | (h/λ) X a is 0.024 to 0.05. |
| When 64.5 ≤ θ < 65.5 | (h/λ) X a is 0.0245 to 0.05. |
| When 65.5 ≤ θ < 67.5 | (h/λ) X a is 0.025 to 0.05. |
| When 67.5 ≤ θ < 68.5 | (h/λ) X a is 0.0255 to 0.05. |
| When 68.5 ≤ θ < 69.5 | (h/λ) X a is 0.026 to 0.05. |
| When 69.5 ≤ θ < 71.5 | (h/λ) X a is 0.0265 to 0.05. |
| When 71.5 ≤ θ < 72.5 | (h/λ) X a is 0.027 to 0.05. |
| When 72.5 ≤ θ < 74.5 | (h/λ) X a is 0.0275 to 0.05. |
| When 74.5 ≤ θ < 76.5 | (h/λ) X a is 0.028 to 0.05. |
| When 76.5 ≤ θ < 79.5 | (h/λ) X a is 0.0285 to 0.05. |
| When 79.5 ≤ θ < 82.5 | (h/λ) X a is 0.029 to 0.05. |
| When 82.5 ≤ θ < 86.5 | (h/λ) X a is 0.0295 to 0.05. |
| When 86.5 ≤ θ < 101.5 | (h/λ) X a is 0.03 to 0.05. |
| When 101.5 ≤ θ < 103.5 | (h/λ) X a is 0.0295 to 0.05. |
| When 103.5 ≤ θ < 104.5 | (h/λ) X a is 0.005 or 0.0295 to 0.05 |
| When 104.5 ≤ θ < 105.5 | (h/λ) X a is 0.005 to 0.006 or 0.029 to 0.05. |
| When 105.5 ≤ θ < 106.5 | (h/λ) X a is 0.005 to 0.007 or 0.0285 to 0.05. |
| When 106.5 ≤ θ < 107.5 | (h/λ) X a is 0.005 to 0.0085 or 0.0285 to 0.05. |
| When 107.5 ≤ θ < 108.5 | (h/λ) X a is 0.005 to 0.0095 or 0.028 to 0.05. |
| When 108.5 ≤ θ < 109.5 | (h/λ) X a is 0.005 to 0.011 or 0.027 to 0.05. |
| When 109.5 ≤ θ < 110.5 | (h/λ) X a is 0.005 to 0.013 or 0.0265 to 0.05. |

TABLE 4-continued

For [0.35 ≤ H/λ < 0.45]

| | |
|---|---|
| When 110.5 ≤ θ < 111.5 | (h/λ) X a is 0.005 to 0.0145 or 0.0255 to 0.05. |
| When 111.5 ≤ θ < 112.5 | (h/λ) X a is 0.005 to 0.019 or 0.0215 to 0.05. |
| When 112.5 ≤ θ < 151.5 | (h/λ) X a is 0.005 to 0.05. |
| When 151.5 ≤ θ < 152.5 | (h/λ) X a is 0.0055 to 0.05. |
| When 152.5 ≤ θ < 153.5 | (h/λ) X a is 0.0075 to 0.05. |
| When 153.5 ≤ θ < 154.5 | (h/λ) X a is 0.01 to 0.05. |
| When 154.5 ≤ θ < 155.5 | (h/λ) X a is 0.0115 to 0.05. |
| When 155.5 ≤ θ < 156.5 | (h/λ) X a is 0.013 to 0.05. |
| When 156.5 ≤ θ < 157.5 | (h/λ) X a is 0.014 to 0.05. |
| When 157.5 ≤ θ < 158.5 | (h/λ) X a is 0.0155 to 0.05. |
| When 158.5 ≤ θ < 159.5 | (h/λ) X a is 0.0165 to 0.05. |
| When 159.5 ≤ θ < 160.5 | (h/λ) X a is 0.017 to 0.05. |
| When 160.5 ≤ θ < 161.5 | (h/λ) X a is 0.018 to 0.05. |
| When 161.5 ≤ θ < 162.5 | (h/λ) X a is 0.018 to 0.05. |
| When 162.5 ≤ θ < 163.5 | (h/λ) X a is 0.0195 to 0.05. |
| When 163.5 ≤ θ < 164.5 | (h/λ) X a is 0.02 to 0.05. |
| When 164.5 ≤ θ < 165.5 | (h/λ) X a is 0.021 to 0.05. |
| When 165.5 ≤ θ < 166.5 | (h/λ) X a is 0.0215 to 0.05. |
| When 166.5 ≤ θ < 168.5 | (h/λ) X a is 0.022 to 0.05. |
| When 168.5 ≤ θ < 169.5 | (h/λ) X a is 0.0225 to 0.05. |
| When 169.5 ≤ θ < 171.5 | (h/λ) X a is 0.023 to 0.05. |
| When 171.5 ≤ θ < 175.5 | (h/λ) X a is 0.0235 to 0.05. |
| When 175.5 ≤ θ < 178.5 | (h/λ) X a is 0.024 to 0.05. |
| When 178.5 ≤ θ < 180 | (h/λ) X a is 0.0235 to 0.05. |

TABLE 5

For [0.45 ≤ H/λ < 0.55]

| | |
|---|---|
| When 0 ≤ θ < 2.5 | (h/λ) X a is 0.0225 to 0.045. |
| When 2.5 ≤ θ < 4.5 | (h/λ) X a is 0.022 to 0.045. |
| When 4.5 ≤ θ < 6.5 | (h/λ) X a is 0.0215 to 0.045. |
| When 6.5 ≤ θ < 7.5 | (h/λ) X a is 0.021 to 0.045. |
| When 7.5 ≤ θ < 8.5 | (h/λ) X a is 0.0205 to 0.045. |
| When 8.5 ≤ θ < 9.5 | (h/λ) X a is 0.02 to 0.045. |
| When 9.5 ≤ θ < 10.5 | (h/λ) X a is 0.0195 to 0.045. |
| When 10.5 ≤ θ < 11.5 | (h/λ) X a is 0.019 to 0.045. |
| When 11.5 ≤ θ < 12.5 | (h/λ) X a is 0.0185 to 0.045. |
| When 12.5 ≤ θ < 13.5 | (h/λ) X a is 0.018 to 0.045. |
| When 13.5 ≤ θ < 14.5 | (h/λ) X a is 0.017 to 0.045. |
| When 14.5 ≤ θ < 15.5 | (h/λ) X a is 0.0165 to 0.045. |
| When 15.5 ≤ θ < 16.5 | (h/λ) X a is 0.0155 to 0.045. |
| When 16.5 ≤ θ < 17.5 | (h/λ) X a is 0.0145 to 0.045. |
| When 17.5 ≤ θ < 18.5 | (h/λ) X a is 0.013 to 0.045. |
| When 18.5 ≤ θ < 19.5 | (h/λ) X a is 0.0115 to 0.045. |
| When 19.5 ≤ θ < 20.5 | (h/λ) X a is 0.01 to 0.045. |
| When 20.5 ≤ θ < 21.5 | (h/λ) X a is 0.008 to 0.045. |
| When 21.5 ≤ θ < 50.5 | (h/λ) X a is 0.005 to 0.045. |
| When 50.5 ≤ θ < 51.5 | (h/λ) X a is 0.0105 to 0.045. |
| When 51.5 ≤ θ < 52.5 | (h/λ) X a is 0.013 to 0.045. |
| When 52.5 ≤ θ < 53.5 | (h/λ) X a is 0.015 to 0.045. |
| When 53.5 ≤ θ < 54.5 | (h/λ) X a is 0.016 to 0.045. |
| When 54.5 ≤ θ < 55.5 | (h/λ) X a is 0.0175 to 0.045. |
| When 55.5 ≤ θ < 56.5 | (h/λ) X a is 0.0185 to 0.045. |
| When 56.5 ≤ θ < 57.5 | (h/λ) X a is 0.019 to 0.045. |
| When 57.5 ≤ θ < 58.5 | (h/λ) X a is 0.02 to 0.045. |
| When 58.5 ≤ θ < 59.5 | (h/λ) X a is 0.0205 to 0.045. |
| When 59.5 ≤ θ < 60.5 | (h/λ) X a is 0.0215 to 0.045. |
| When 60.5 ≤ θ < 61.5 | (h/λ) X a is 0.022 to 0.045. |
| When 61.5 ≤ θ < 62.5 | (h/λ) X a is 0.0225 to 0.045. |
| When 62.5 ≤ θ < 63.5 | (h/λ) X a is 0.023 to 0.045. |
| When 63.5 ≤ θ < 65.5 | (h/λ) X a is 0.0235 to 0.045. |
| When 65.5 ≤ θ < 66.5 | (h/λ) X a is 0.024 to 0.045. |
| When 66.5 ≤ θ < 67.5 | (h/λ) X a is 0.0245 to 0.045. |
| When 67.5 ≤ θ < 69.5 | (h/λ) X a is 0.025 to 0.045. |
| When 69.5 ≤ θ < 70.5 | (h/λ) X a is 0.0255 to 0.045. |
| When 70.5 ≤ θ < 72.5 | (h/λ) X a is 0.026 to 0.045. |
| When 72.5 ≤ θ < 74.5 | (h/λ) X a is 0.0265 to 0.045. |
| When 74.5 ≤ θ < 76.5 | (h/λ) X a is 0.027 to 0.045. |
| When 76.5 ≤ θ < 79.5 | (h/λ) X a is 0.0275 to 0.045. |
| When 79.5 ≤ θ < 82.5 | (h/λ) X a is 0.028 to 0.045. |
| When 82.5 ≤ θ < 87.5 | (h/λ) X a is 0.0285 to 0.045. |
| When 87.5 ≤ θ < 96.5 | (h/λ) X a is 0.029 to 0.045. |

TABLE 5-continued

For [0.45 ≤ H/λ < 0.55]

| | |
|---|---|
| When 96.5 ≤ θ < 100.5 | (h/λ) X a is 0.0285 to 0.045. |
| When 100.5 ≤ θ < 102.5 | (h/λ) X a is 0.028 to 0.045. |
| When 102.5 ≤ θ < 103.5 | (h/λ) X a is 0.0275 to 0.045. |
| When 103.5 ≤ θ < 153.5 | (h/λ) X a is 0.05 to 0.045. |
| When 153.5 ≤ θ < 154.5 | (h/λ) X a is 0.075 to 0.045. |
| When 154.5 ≤ θ < 155.5 | (h/λ) X a is 0.095 to 0.045. |
| When 155.5 ≤ θ < 156.5 | (h/λ) X a is 0.011 to 0.045. |
| When 156.5 ≤ θ < 157.5 | (h/λ) X a is 0.0125 to 0.045. |
| When 157.5 ≤ θ < 158.5 | (h/λ) X a is 0.0135 to 0.045. |
| When 158.5 ≤ θ < 159.5 | (h/λ) X a is 0.0145 to 0.045. |
| When 159.5 ≤ θ < 160.5 | (h/λ) X a is 0.016 to 0.045. |
| When 160.5 ≤ θ < 161.5 | (h/λ) X a is 0.0165 to 0.045. |
| When 161.5 ≤ θ < 162.5 | (h/λ) X a is 0.0175 to 0.045. |
| When 162.5 ≤ θ < 163.5 | (h/λ) X a is 0.018 to 0.045. |
| When 163.5 ≤ θ < 164.5 | (h/λ) X a is 0.019 to 0.045. |
| When 164.5 ≤ θ < 165.5 | (h/λ) X a is 0.0195 to 0.045. |
| When 165.5 ≤ θ < 166.5 | (h/λ) X a is 0.02 to 0.045. |
| When 166.5 ≤ θ < 167.5 | (h/λ) X a is 0.0205 to 0.045. |
| When 167.5 ≤ θ < 168.5 | (h/λ) X a is 0.021 to 0.045. |
| When 168.5 ≤ θ < 170.5 | (h/λ) X a is 0.0215 to 0.045. |
| When 170.5 ≤ θ < 172.5 | (h/λ) X a is 0.022 to 0.045. |
| When 172.5 ≤ θ < 175.5 | (h/λ) X a is 0.0225 to 0.045. |
| When 175.5 ≤ θ < 179.5 | (h/λ) X a is 0.023 to 0.045. |
| When 179.5 ≤ θ < 180 | (h/λ) X a is 0.0225 to 0.045. |

TABLE 6

For [0.55 ≤ H/λ < 0.65]

| | |
|---|---|
| When 0 ≤ θ < 0.5 | (h/λ) X a is 0.022 to 0.045. |
| When 0.5 ≤ θ < 3.5 | (h/λ) X a is 0.0215 to 0.045. |
| When 3.5 ≤ θ < 5.5 | (h/λ) X a is 0.021 to 0.045. |
| When 5.5 ≤ θ < 6.5 | (h/λ) X a is 0.0205 to 0.045. |
| When 6.5 ≤ θ < 7.5 | (h/λ) X a is 0.02 to 0.045. |
| When 7.5 ≤ θ < 9.5 | (h/λ) X a is 0.0195 to 0.045. |
| When 9.5 ≤ θ < 10.5 | (h/λ) X a is 0.019 to 0.045. |
| When 10.5 ≤ θ < 11.5 | (h/λ) X a is 0.0185 to 0.045. |
| When 11.5 ≤ θ < 12.5 | (h/λ) X a is 0.0175 to 0.045. |
| When 12.5 ≤ θ < 13.5 | (h/λ) X a is 0.017 to 0.045. |
| When 13.5 ≤ θ < 14.5 | (h/λ) X a is 0.0165 to 0.045. |
| When 14.5 ≤ θ < 15.5 | (h/λ) X a is 0.0155 to 0.045. |
| When 15.5 ≤ θ < 16.5 | (h/λ) X a is 0.0145 to 0.045. |
| When 16.5 ≤ θ < 17.5 | (h/λ) X a is 0.0135 to 0.045. |
| When 17.5 ≤ θ < 18.5 | (h/λ) X a is 0.012 to 0.045. |
| When 18.5 ≤ θ < 19.5 | (h/λ) X a is 0.011 to 0.045. |
| When 19.5 ≤ θ < 20.5 | (h/λ) X a is 0.009 to 0.045. |
| When 20.5 ≤ θ < 21.5 | (h/λ) X a is 0.0065 to 0.045. |
| When 21.5 ≤ θ < 50.5 | (h/λ) X a is 0.005 to 0.045. |
| When 50.5 ≤ θ < 51.5 | (h/λ) X a is 0.0085 to 0.045. |
| When 51.5 ≤ θ < 52.5 | (h/λ) X a is 0.0115 to 0.045. |
| When 52.5 ≤ θ < 53.5 | (h/λ) X a is 0.0135 to 0.045. |
| When 53.5 ≤ θ < 54.5 | (h/λ) X a is 0.0155 to 0.045. |
| When 54.5 ≤ θ < 55.5 | (h/λ) X a is 0.0165 to 0.045. |
| When 55.5 ≤ θ < 56.5 | (h/λ) X a is 0.0175 to 0.045. |
| When 56.5 ≤ θ < 57.5 | (h/λ) X a is 0.0185 to 0.045. |
| When 57.5[M1] ≤ θ < 58.5 | (h/λ) X a is 0.019 to 0.045. |
| When 58.5 ≤ θ < 59.5 | (h/λ) X a is 0.02 to 0.045. |
| When 59.5 ≤ θ < 60.5 | (h/λ) X a is 0.0205 to 0.045. |
| When 60.5 ≤ θ < 61.5 | (h/λ) X a is 0.021 to 0.045. |
| When 61.5 ≤ θ < 62.5 | (h/λ) X a is 0.0215 to 0.045. |
| When 62.5 ≤ θ < 63.5 | (h/λ) X a is 0.022 to 0.045. |
| When 63.5 ≤ θ < 64.5 | (h/λ) X a is 0.0225 to 0.045. |
| When 64.5 ≤ θ < 65.5 | (h/λ) X a is 0.023 to 0.045. |
| When 65.5 ≤ θ < 67.5 | (h/λ) X a is 0.0235 to 0.045. |
| When 67.5 ≤ θ < 68.5 | (h/λ) X a is 0.024 to 0.045. |
| When 68.5 ≤ θ < 70.5 | (h/λ) X a is 0.0245 to 0.045. |
| When 70.5 ≤ θ < 72.5 | (h/λ) X a is 0.025 to 0.045. |
| When 72.5 ≤ θ < 73.5 | (h/λ) X a is 0.0255 to 0.045. |
| When 73.5 ≤ θ < 75.5 | (h/λ) X a is 0.026 to 0.045. |
| When 75.5 ≤ θ < 78.5 | (h/λ) X a is 0.0265 to 0.045. |
| When 78.5 ≤ θ < 81.5 | (h/λ) X a is 0.027 to 0.045. |
| When 81.5 ≤ θ < 85.5 | (h/λ) X a is 0.0275 to 0.045. |
| When 85.5 ≤ θ < 95.5 | (h/λ) X a is 0.028 to 0.045. |
| When 95.5 ≤ θ < 98.5 | (h/λ) X a is 0.0275 to 0.045. |
| When 98.5 ≤ θ < 101.5 | (h/λ) X a is 0.027 to 0.045. |

TABLE 6-continued

For [0.55 ≤ H/λ < 0.65]

| | |
|---|---|
| When 101.5 ≤ θ < 102.5 | (h/λ) X a is 0.0265 to 0.045. |
| When 102.5 ≤ θ < 103.5 | (h/λ) X a is 0.026 to 0.045. |
| When 103.5 ≤ θ < 154.5 | (h/λ) X a is 0.005 to 0.045. |
| When 154.5 ≤ θ < 155.5 | (h/λ) X a is 0.0055 to 0.045. |
| When 155.5 ≤ θ < 156.5 | (h/λ) X a is 0.008 to 0.045. |
| When 156.5 ≤ θ < 157.5 | (h/λ) X a is 0.01 to 0.045. |
| When 157.5 ≤ θ < 158.5 | (h/λ) X a is 0.0115 to 0.045. |
| When 158.5 ≤ θ < 159.5 | (h/λ) X a is 0.0125 to 0.045. |
| When 159.5 ≤ θ < 160.5 | (h/λ) X a is 0.014 to 0.045. |
| When 160.5 ≤ θ < 161.5 | (h/λ) X a is 0.015 to 0.045. |
| When 161.5 ≤ θ < 162.5 | (h/λ) X a is 0.016 to 0.045. |
| When 162.5 ≤ θ < 163.5 | (h/λ) X a is 0.0165 to 0.045. |
| When 163.5 ≤ θ < 164.5 | (h/λ) X a is 0.0175 to 0.045. |
| When 164.5 ≤ θ < 165.5 | (h/λ) X a is 0.018 to 0.045. |
| When 165.5 ≤ θ < 166.5 | (h/λ) X a is 0.0185 to 0.045. |
| When 166.5 ≤ θ < 168.5 | (h/λ) X a is 0.0195 to 0.045. |
| When 168.5 ≤ θ < 169.5 | (h/λ) X a is 0.02 to 0.045. |
| When 169.5 ≤ θ < 170.5 | (h/λ) X a is 0.0205 to 0.045. |
| When 171.5 ≤ θ < 172.5 | (h/λ) X a is 0.021 to 0.045. |
| When 172.5 ≤ θ < 175.5 | (h/λ) X a is 0.0215 to 0.045. |
| When 175.5 ≤ θ < 180 | (h/λ) X a is 0.022 to 0.045. |

TABLE 7

For [0.65 ≤ H/λ < 0.75]

| | |
|---|---|
| When 0 ≤ θ < 1.5 | (h/λ) X a is 0.021 to 0.045. |
| When 1.5 ≤ θ < 4.5 | (h/λ) X a is 0.0205 to 0.045. |
| When 4.5 ≤ θ < 5.5 | (h/λ) X a is 0.02 to 0.045. |
| When 5.5 ≤ θ < 7.5 | (h/λ) X a is 0.0195 to 0.045. |
| When 7.5 ≤ θ < 8.5 | (h/λ) X a is 0.019 to 0.045. |
| When 8.5 ≤ θ < 9.5 | (h/λ) X a is 0.0185 to 0.045. |
| When 9.5 ≤ θ < 10.5 | (h/λ) X a is 0.018 to 0.045. |
| When 10.5 ≤ θ < 11.5 | (h/λ) X a is 0.0175 to 0.045. |
| When 11.5 ≤ θ < 12.5 | (h/λ) X a is 0.017 to 0.045. |
| When 12.5 ≤ θ < 13.5 | (h/λ) X a is 0.016 to 0.045. |
| When 13.5 ≤ θ < 14.5 | (h/λ) X a is 0.0155 to 0.045. |
| When 14.5 ≤ θ < 15.5 | (h/λ) X a is 0.0145 to 0.045. |
| When 15.5 ≤ θ < 16.5 | (h/λ) X a is 0.0135 to 0.045. |
| When 16.5 ≤ θ < 17.5 | (h/λ) X a is 0.0125 to 0.045. |
| When 17.5 ≤ θ < 18.5 | (h/λ) X a is 0.0115 to 0.045. |
| When 18.5 ≤ θ < 19.5 | (h/λ) X a is 0.0095 to 0.045. |
| When 19.5 ≤ θ < 20.5 | (h/λ) X a is 0.0075 to 0.045. |
| When 20.5 ≤ θ < 21.5 | (h/λ) X a is 0.0055 to 0.045. |
| When 21.5 ≤ θ < 50.5 | (h/λ) X a is 0.005 to 0.045. |
| When 50.5 ≤ θ < 51.5 | (h/λ) X a is 0.0065 to 0.045. |
| When 51.5 ≤ θ < 52.5 | (h/λ) X a is 0.0105 to 0.045. |
| When 52.5 ≤ θ < 53.5 | (h/λ) X a is 0.0125 to 0.045. |
| When 53.5 ≤ θ < 54.5 | (h/λ) X a is 0.014 to 0.045. |
| When 54.5 ≤ θ < 55.5 | (h/λ) X a is 0.0155 to 0.045. |
| When 55.5 ≤ θ < 56.5 | (h/λ) X a is 0.0165 to 0.045. |
| When 56.5 ≤ θ < 57.5 | (h/λ) X a is 0.0175 to 0.045. |
| When 57.5 ≤ θ < 58.5 | (h/λ) X a is 0.0185 to 0.045. |
| When 58.5 ≤ θ < 59.5 | (h/λ) X a is 0.019 to 0.045. |
| When 59.5 ≤ θ < 60.5 | (h/λ) X a is 0.0195 to 0.045. |
| When 60.5 ≤ θ < 61.5 | (h/λ) X a is 0.0205 to 0.045. |
| When 61.5 ≤ θ < 62.5 | (h/λ) X a is 0.021 to 0.045. |
| When 62.5 ≤ θ < 63.5 | (h/λ) X a is 0.0215 to 0.045. |
| When 63.5 ≤ θ < 64.5 | (h/λ) X a is 0.022 to 0.045. |
| When 64.5 ≤ θ < 66.5 | (h/λ) X a is 0.0225 to 0.045. |
| When 66.5 ≤ θ < 67.5 | (h/λ) X a is 0.023 to 0.045. |
| When 67.5 ≤ θ < 68.5 | (h/λ) X a is 0.0235 to 0.045. |
| When 68.5 ≤ θ < 70.5 | (h/λ) X a is 0.024 to 0.045. |
| When 70.5 ≤ θ < 72.5 | (h/λ) X a is 0.0245 to 0.045. |
| When 72.5 ≤ θ < 74.5 | (h/λ) X a is 0.025 to 0.045. |
| When 74.5 ≤ θ < 76.5 | (h/λ) X a is 0.0255 to 0.045. |
| When 76.5 ≤ θ < 79.5 | (h/λ) X a is 0.026 to 0.045. |
| When 79.5 ≤ θ < 82.5 | (h/λ) X a is 0.0265 to 0.045. |
| When 82.5 ≤ θ < 95.5 | (h/λ) X a is 0.027 to 0.045. |
| When 95.5 ≤ θ < 98.5 | (h/λ) X a is 0.0265 to 0.045. |
| When 98.5 ≤ θ < 100.5 | (h/λ) X a is 0.026 to 0.045. |
| When 100.5 ≤ θ < 101.5 | (h/λ) X a is 0.0255 to 0.045. |
| When 101.5 ≤ θ < 157.5 | (h/λ) X a is 0.005 to 0.045. |
| When 157.5 ≤ θ < 158.5 | (h/λ) X a is 0.0075 to 0.045. |
| When 158.5 ≤ θ < 159.5 | (h/λ) X a is 0.01 to 0.045. |

TABLE 7-continued

For [0.65 ≤ H/λ < 0.75]

| | |
|---|---|
| When 159.5 ≤ θ < 160.5 | (h/λ) X a is 0.0115 to 0.045. |
| When 160.5 ≤ θ < 161.5 | (h/λ) X a is 0.0125 to 0.045. |
| When 161.5 ≤ θ < 162.5 | (h/λ) X a is 0.014 to 0.045. |
| When 162.5 ≤ θ < 163.5 | (h/λ) X a is 0.015 to 0.045. |
| When 163.5 ≤ θ < 164.5 | (h/λ) X a is 0.016 to 0.045. |
| When 164.5 ≤ θ < 165.5 | (h/λ) X a is 0.0165 to 0.045. |
| When 165.5 ≤ θ < 166.5 | (h/λ) X a is 0.0175 to 0.045. |
| When 166.5 ≤ θ < 167.5 | (h/λ) X a is 0.018 to 0.045. |
| When 167.5 ≤ θ < 168.5 | (h/λ) X a is 0.0185 to 0.045. |
| When 168.5 ≤ θ < 169.5 | (h/λ) X a is 0.019 to 0.045. |
| When 169.5 ≤ θ < 170.5 | (h/λ) X a is 0.0195 to 0.045. |
| When 170.5 ≤ θ < 172.5 | (h/λ) X a is 0.02 to 0.045. |
| When 172.5 ≤ θ < 175.5 | (h/λ) X a is 0.0205 to 0.045. |
| When 175.5 ≤ θ < 180 | (h/λ) X a is 0.021 to 0.045. |

TABLE 8

For [0.75 ≤ H/λ < 0.85]

| | |
|---|---|
| When 0 ≤ θ < 3.5 | (h/λ) X a is 0.02 to 0.045. |
| When 3.5 ≤ θ < 5.5 | (h/λ) X a is 0.0195 to 0.045. |
| When 5.5 ≤ θ < 6.5 | (h/λ) X a is 0.019 to 0.045. |
| When 6.5 ≤ θ < 8.5 | (h/λ) X a is 0.0185 to 0.045. |
| When 8.5 ≤ θ < 9.5 | (h/λ) X a is 0.018 to 0.045. |
| When 9.5 ≤ θ < 10.5 | (h/λ) X a is 0.0175 to 0.045. |
| When 10.5 ≤ θ < 11.5 | (h/λ) X a is 0.017 to 0.045. |
| When 11.5 ≤ θ < 12.5 | (h/λ) X a is 0.016 to 0.045. |
| When 12.5 ≤ θ < 13.5 | (h/λ) X a is 0.0155 to 0.045. |
| When 13.5 ≤ θ < 14.5 | (h/λ) X a is 0.0145 to 0.045. |
| When 14.5 ≤ θ < 15.5 | (h/λ) X a is 0.014 to 0.045. |
| When 15.5 ≤ θ < 16.5 | (h/λ) X a is 0.013 to 0.045. |
| When 16.5 ≤ θ < 17.5 | (h/λ) X a is 0.0115 to 0.045. |
| When 17.5 ≤ θ < 18.5 | (h/λ) X a is 0.0105 to 0.045. |
| When 18.5 ≤ θ < 19.5 | (h/λ) X a is 0.0085 to 0.045. |
| When 19.5 ≤ θ < 20.5 | (h/λ) X a is 0.0065 to 0.045. |
| When 20.5 ≤ θ < 51.5 | (h/λ) X a is 0.005 to 0.045. |
| When 51.5 ≤ θ < 52.5 | (h/λ) X a is 0.0085 to 0.045. |
| When 52.5 ≤ θ < 53.5 | (h/λ) X a is 0.0115 to 0.045. |
| When 53.5 ≤ θ < 54.5 | (h/λ) X a is 0.013 to 0.045. |
| When 54.5 ≤ θ < 55.5 | (h/λ) X a is 0.0145 to 0.045. |
| When 55.5 ≤ θ < 56.5 | (h/λ) X a is 0.016 to 0.045. |
| When 56.5 ≤ θ < 57.5 | (h/λ) X a is 0.017 to 0.045. |
| When 57.5 ≤ θ < 58.5 | (h/λ) X a is 0.0175 to 0.045. |
| When 58.5 ≤ θ < 59.5 | (h/λ) X a is 0.0185 to 0.045. |
| When 59.5 ≤ θ < 60.5 | (h/λ) X a is 0.019 to 0.045. |
| When 60.5 ≤ θ < 61.5 | (h/λ) X a is 0.0195 to 0.045. |
| When 61.5 ≤ θ < 62.5 | (h/λ) X a is 0.0205 to 0.045. |
| When 62.5 ≤ θ < 63.5 | (h/λ) X a is 0.021 to 0.045. |
| When 63.5 ≤ θ < 65.5 | (h/λ) X a is 0.0215 to 0.045. |
| When 65.5 ≤ θ < 66.5 | (h/λ) X a is 0.022 to 0.045. |
| When 66.5 ≤ θ < 67.5 | (h/λ) X a is 0.0225 to 0.045. |
| When 67.5 ≤ θ < 68.5 | (h/λ) X a is 0.023 to 0.045. |
| When 68.5 ≤ θ < 70.5 | (h/λ) X a is 0.0235 to 0.045. |
| When 70.5 ≤ θ < 72.5 | (h/λ) X a is 0.024 to 0.045. |
| When 72.5 ≤ θ < 74.5 | (h/λ) X a is 0.0245 to 0.045. |
| When 74.5 ≤ θ < 76.5 | (h/λ) X a is 0.025 to 0.045. |
| When 76.5 ≤ θ < 79.5 | (h/λ) X a is 0.0255 to 0.045. |
| When 79.5 ≤ θ < 83.5 | (h/λ) X a is 0.026 to 0.045. |
| When 83.5 ≤ θ < 96.5 | (h/λ) X a is 0.0265 to 0.045. |
| When 96.5 ≤ θ < 98.5 | (h/λ) X a is 0.026 to 0.045. |
| When 98.5 ≤ θ < 99.5 | (h/λ) X a is 0.025 to 0.045. |
| When 99.5 ≤ θ < 100.5 | (h/λ) X a is 0.0245 to 0.045. |
| When 100.5 ≤ θ < 159.5 | (h/λ) X a is 0.005 to 0.045. |
| When 159.5 ≤ θ < 160.5 | (h/λ) X a is 0.0055 to 0.045. |
| When 160.5 ≤ θ < 161.5 | (h/λ) X a is 0.009 to 0.045. |
| When 161.5 ≤ θ < 162.5 | (h/λ) X a is 0.011 to 0.045. |
| When 162.5 ≤ θ < 163.5 | (h/λ) X a is 0.0125 to 0.045. |
| When 163.5 ≤ θ < 164.5 | (h/λ) X a is 0.014 to 0.045. |
| When 164.5 ≤ θ < 165.5 | (h/λ) X a is 0.015 to 0.045. |
| When 165.5 ≤ θ < 166.5 | (h/λ) X a is 0.016 to 0.045. |
| When 166.5 ≤ θ < 167.5 | (h/λ) X a is 0.0165 to 0.045. |
| When 167.5 ≤ θ < 168.5 | (h/λ) X a is 0.017 to 0.045. |
| When 168.5 ≤ θ < 169.5 | (h/λ) X a is 0.018 to 0.045. |
| When 169.5 ≤ θ < 171.5 | (h/λ) X a is 0.0185 to 0.045. |
| When 171.5 ≤ θ < 172.5 | (h/λ) X a is 0.019 to 0.045. |

TABLE 8-continued

For [0.75 ≤ H/λ < 0.85]

| | |
|---|---|
| When 172.5 ≤ θ < 174.5 | (h/λ) X a is 0.0195 to 0.045. |
| When 174.5 ≤ θ < 180 | (h/λ) X a is 0.02 to 0.045. |

TABLE 9

For [0.85 ≤ H/λ < 0.95]

| | |
|---|---|
| When 0 ≤ θ < 2.5 | (h/λ) × a is 0.0195 to 0.045. |
| When 2.5 ≤ θ < 4.5 | (h/λ) × a is 0.019 to 0.045. |
| When 4.5 ≤ θ < 6.5 | (h/λ) × a is 0.0185 to 0.045. |
| When 6.5 ≤ θ < 7.5 | (h/λ) × a is 0.018 to 0.045. |
| When 7.5 ≤ θ < 9.5 | (h/λ) × a is 0.0175 to 0.045. |
| When 9.5 ≤ θ < 10.5 | (h/λ) × a is 0.017 to 0.045. |
| When 10.5 ≤ θ < 11.5 | (h/λ) × a is 0.016 to 0.045. |
| When 11.5 ≤ θ < 12.5 | (h/λ) × a is 0.0155 to 0.045. |
| When 12.5 ≤ θ < 13.5 | (h/λ) × a is 0.015 to 0.045. |
| When 13.5 ≤ θ < 14.5 | (h/λ) × a is 0.014 to 0.045. |
| When 14.5 ≤ θ < 15.5 | (h/λ) × a is 0.013 to 0.045. |
| When 15.5 ≤ θ < 16.5 | (h/λ) × a is 0.012 to 0.045. |
| When 16.5 ≤ θ < 17.5 | (h/λ) × a is 0.011 to 0.045. |
| When 17.5 ≤ θ < 18.5 | (h/λ) × a is 0.009 to 0.045. |
| When 18.5 ≤ θ < 19.5 | (h/λ) × a is 0.007 to 0.045. |
| When 19.5 ≤ θ < 51.5 | (h/λ) × a is 0.007 to 0.045. |
| When 51.5 ≤ θ < 52.5 | (h/λ) × a is 0.0065 to 0.045. |
| When 52.5 ≤ θ < 53.5 | (h/λ) × a is 0.0105 to 0.045. |
| When 53.5 ≤ θ < 54.5 | (h/λ) × a is 0.0125 to 0.045. |
| When 54.5 ≤ θ < 55.5 | (h/λ) × a is 0.014 to 0.045. |
| When 55.5 ≤ θ < 56.5 | (h/λ) × a is 0.015 to 0.045. |
| When 56.5 ≤ θ < 57.5 | (h/λ) × a is 0.016 to 0.045. |
| When 57.5 ≤ θ < 58.5 | (h/λ) × a is 0.017 to 0.045. |
| When 58.5 ≤ θ < 59.5 | (h/λ) × a is 0.018 to 0.045. |
| When 59.5 ≤ θ < 60.5 | (h/λ) × a is 0.0185 to 0.045. |
| When 60.5 ≤ θ < 61.5 | (h/λ) × a is 0.019 to 0.045. |
| When 61.5 ≤ θ < 62.5 | (h/λ) × a is 0.02 to 0.045. |
| When 62.5 ≤ θ < 63.5 | (h/λ) × a is 0.0205 to 0.045. |
| When 63.5 ≤ θ < 64.5 | (h/λ) × a is 0.021 to 0.045. |
| When 64.5 ≤ θ < 65.5 | (h/λ) × a is 0.0215 to 0.045. |
| When 65.5 ≤ θ < 66.5 | (h/λ) × a is 0.022 to 0.045. |
| When 66.5 ≤ θ < 68.5 | (h/λ) × a is 0.0225 to 0.045. |
| When 68.5 ≤ θ < 70.5 | (h/λ) × a is 0.023 to 0.045. |
| When 70.5 ≤ θ < 72.5 | (h/λ) × a is 0.0235 to 0.045. |
| When 72.5 ≤ θ < 74.5 | (h/λ) × a is 0.024 to 0.045. |
| When 74.5 ≤ θ < 76.5 | (h/λ) × a is 0.0245 to 0.045. |
| When 76.5 ≤ θ < 79.5 | (h/λ) × a is 0.025 to 0.045. |
| When 79.5 ≤ θ < 82.5 | (h/λ) × a is 0.0255 to 0.045. |
| When 82.5 ≤ θ < 92.5 | (h/λ) × a is 0.026 to 0.045. |
| When 92.5 ≤ θ < 95.5 | (h/λ) × a is 0.0255 to 0.045. |
| When 95.5 ≤ θ < 97.5 | (h/λ) × a is 0.025 to 0.045. |
| When 97.5 ≤ θ < 98.5 | (h/λ) × a is 0.0245 to 0.045. |
| When 98.5 ≤ θ < 163.5 | (h/λ) × a is 0.05 to 0.045. |
| When 163.5 ≤ θ < 164.5 | (h/λ) × a is 0.0105 to 0.045. |
| When 164.5 ≤ θ < 165.5 | (h/λ) × a is 0.012 to 0.045. |
| When 165.5 ≤ θ < 166.5 | (h/λ) × a is 0.0135 to 0.045. |
| When 166.5 ≤ θ < 167.5 | (h/λ) × a is 0.015 to 0.045. |
| When 167.5 ≤ θ < 168.5 | (h/λ) × a is 0.016 to 0.045. |
| When 168.5 ≤ θ < 169.5 | (h/λ) × a is 0.0165 to 0.045. |
| When 169.5 ≤ θ < 170.5 | (h/λ) × a is 0.017 to 0.045. |
| When 170.5 ≤ θ < 171.5 | (h/λ) × a is 0.0175 to 0.045. |
| When 171.5 ≤ θ < 172.5 | (h/λ) × a is 0.018 to 0.045. |
| When 172.5 ≤ θ < 174.5 | (h/λ) × a is 0.0185 to 0.045. |
| When 174.5 ≤ θ < 176.5 | (h/λ) × a is 0.019 to 0.045. |
| When 176.5 ≤ θ < 180 | (h/λ) × a is 0.0195 to 0.045. |

TABLE 10

For [0.95 ≤ H/λ < 1.00]

| | |
|---|---|
| When 0 ≤ θ < 1.5 | (h/λ) × a is 0.019 to 0.04. |
| When 1.5 ≤ θ < 4.5 | (h/λ) × a is 0.0185 to 0.04. |
| When 4.5 ≤ θ < 6.5 | (h/λ) × a is 0.018 to 0.04. |
| When 6.5 ≤ θ < 7.5 | (h/λ) × a is 0.0175 to 0.04. |
| When 7.5 ≤ θ < 8.5 | (h/λ) × a is 0.017 to 0.04. |
| When 8.5 ≤ θ < 9.5 | (h/λ) × a is 0.0165 to 0.04. |

TABLE 10-continued

For [0.95 ≤ H/λ < 1.00]

| | |
|---|---|
| When 9.5 ≤ θ < 10.5 | (h/λ) × a is 0.016 to 0.04. |
| When 10.5 ≤ θ < 11.5 | (h/λ) × a is 0.0155 to 0.04. |
| When 11.5 ≤ θ < 12.5 | (h/λ) × a is 0.015 to 0.04. |
| When 12.5 ≤ θ < 13.5 | (h/λ) × a is 0.014 to 0.04. |
| When 13.5 ≤ θ < 14.5 | (h/λ) × a is 0.0135 to 0.04. |
| When 14.5 ≤ θ < 15.5 | (h/λ) × a is 0.0125 to 0.04. |
| When 15.5 ≤ θ < 16.5 | (h/λ) × a is 0.0115 to 0.04. |
| When 16.5 ≤ θ < 17.5 | (h/λ) × a is 0.01 to 0.04. |
| When 17.5 ≤ θ < 18.5 | (h/λ) × a is 0.008 to 0.04. |
| When 18.5 ≤ θ < 19.5 | (h/λ) × a is 0.006 to 0.04. |
| When 19.5 ≤ θ < 52.5 | (h/λ) × a is 0.005 to 0.04. |
| When 52.5 ≤ θ < 53.5 | (h/λ) × a is 0.009 to 0.04. |
| When 53.5 ≤ θ < 54.5 | (h/λ) × a is 0.0115 to 0.04. |
| When 54.5 ≤ θ < 55.5 | (h/λ) × a is 0.013 to 0.04. |
| When 55.5 ≤ θ < 56.5 | (h/λ) × a is 0.0145 to 0.04. |
| When 56.5 ≤ θ < 57.5 | (h/λ) × a is 0.0155 to 0.04. |
| When 57.5 ≤ θ < 58.5 | (h/λ) × a is 0.0165 to 0.04. |
| When 58.5 ≤ θ < 59.5 | (h/λ) × a is 0.0175 to 0.04. |
| When 59.5 ≤ θ < 60.5 | (h/λ) × a is 0.018 to 0.04. |
| When 60.5 ≤ θ < 61.5 | (h/λ) × a is 0.019 to 0.04. |
| When 61.5 ≤ θ < 62.5 | (h/λ) × a is 0.0195 to 0.04. |
| When 62.5 ≤ θ < 63.5 | (h/λ) × a is 0.02 to 0.04. |
| When 63.5 ≤ θ < 64.5 | (h/λ) × a is 0.0205 to 0.04. |
| When 64.5 ≤ θ < 65.5 | (h/λ) × a is 0.021 to 0.04. |
| When 65.5 ≤ θ < 66.5 | (h/λ) × a is 0.0215 to 0.04. |
| When 66.5 ≤ θ < 68.5 | (h/λ) × a is 0.022 to 0.04. |
| When 68.5 ≤ θ < 69.5 | (h/λ) × a is 0.0225 to 0.04. |
| When 69.5 ≤ θ < 71.5 | (h/λ) × a is 0.023 to 0.04. |
| When 71.5 ≤ θ < 73.5 | (h/λ) × a is 0.0235 to 0.04. |
| When 73.5 ≤ θ < 75.5 | (h/λ) × a is 0.024 to 0.04. |
| When 75.5 ≤ θ < 78.5 | (h/λ) × a is 0.0245 to 0.04. |
| When 78.5 ≤ θ < 81.5 | (h/λ) × a is 0.025 to 0.04. |
| When 81.5 ≤ θ < 92.5 | (h/λ) × a is 0.0255 to 0.04. |
| When 92.5 ≤ θ < 94.5 | (h/λ) × a is 0.025 to 0.04. |
| When 94.5 ≤ θ < 95.5 | (h/λ) × a is 0.0245 to 0.04. |
| When 95.5 ≤ θ < 166.5 | (h/λ) × a is 0.005 to 0.04. |
| When 166.5 ≤ θ < 167.5 | (h/λ) × a is 0.0115 to 0.04. |
| When 167.5 ≤ θ < 168.5 | (h/λ) × a is 0.0135 to 0.04. |
| When 168.5 ≤ θ < 169.5 | (h/λ) × a is 0.015 to 0.04. |
| When 169.5 ≤ θ < 170.5 | (h/λ) × a is 0.0155 to 0.04. |
| When 170.5 ≤ θ < 171.5 | (h/λ) × a is 0.0165 to 0.04. |
| When 171.5 ≤ θ < 172.5 | (h/λ) × a is 0.017 to 0.04. |
| When 172.5 ≤ θ < 173.5 | (h/λ) × a is 0.0175 to 0.04. |
| When 173.5 ≤ θ < 175.5 | (h/λ) × a is 0.018 to 0.04. |
| When 175.5 ≤ θ < 178.5 | (h/λ) × a is 0.0185 to 0.04. |
| When 178.5 ≤ θ < 180 | (h/λ) × a is 0.019 to 0.04 |

Therefore, the attenuation constant α can be reduced to about 0.06 dB/λ or less.

When the LiTaO$_3$ has Euler angles (0°±5°, θ, 0°±25°), the normalized thickness (h/λ)×a of the interdigital electrode is preferably within one of ranges shown in Tables 11 to 20 below with respect to the value of H/λ and the value of θ.

TABLE 11

For [0.05 ≤ H/λ < 0.15]

| | |
|---|---|
| When 0 ≤ θ < 48.5 | (h/λ) × a does not exist. |
| When 48.5 ≤ θ < 49.5 | (h/λ) × a is 0.04 to 0.0415. |
| When 49.5 ≤ θ < 50.5 | (h/λ) × a is 0.0255 to 0.05. |
| When 50.5 ≤ θ < 51.5 | (h/λ) × a is 0.02 to 0.05. |
| When 51.5 ≤ θ < 52.5 | (h/λ) × a is 0.016 to 0.05. |
| When 52.5 ≤ θ < 53.5 | (h/λ) × a is 0.0135 to 0.05. |
| When 53.5 ≤ θ < 54.5 | (h/λ) × a is 0.011 to 0.05. |
| When 54.5 ≤ θ < 55.5 | (h/λ) × a is 0.0095 to 0.05. |
| When 55.5 ≤ θ < 56.5 | (h/λ) × a is 0.008 to 0.05. |
| When 56.5 ≤ θ < 57.5 | (h/λ) × a is 0.0065 to 0.05. |
| When 57.5 ≤ θ < 58.5 | (h/λ) × a is 0.0055 to 0.05. |
| When 58.5 ≤ θ < 122.5 | (h/λ) × a is 0.005 to 0.05. |
| When 122.5 ≤ θ < 123.5 | (h/λ) × a is 0.0055 to 0.05. |
| When 123.5 ≤ θ < 124.5 | (h/λ) × a is 0.007 to 0.05. |
| When 124.5 ≤ θ < 125.5 | (h/λ) × a is 0.0055 to 0.05. |
| When 125.5 ≤ θ < 129.5 | (h/λ) × a is 0.005 to 0.05. |
| When 129.5 ≤ θ < 130.5 | (h/λ) × a is 0.0105 to 0.05. |

TABLE 11-continued

For [0.05 ≤ H/λ < 0.15]

| | |
|---|---|
| When 130.5 ≤ θ < 132.5 | (h/λ) × a is 0.012 to 0.05. |
| When 132.5 ≤ θ < 142.5 | (h/λ) × a is 0.0115 to 0.05. |
| When 142.5 ≤ θ < 143.5 | (h/λ) × a is 0.012 to 0.05. |
| When 143.5 ≤ θ < 144.5 | (h/λ) × a is 0.0125 to 0.05. |
| When 144.5 ≤ θ < 146.5 | (h/λ) × a is 0.013 to 0.05. |
| When 146.5 ≤ θ < 150.5 | (h/λ) × a is 0.0135 to 0.05. |
| When 150.5 ≤ θ < 152.5 | (h/λ) × a is 0.013 to 0.05. |
| When 152.5 ≤ θ < 154.5 | (h/λ) × a is 0.005 or 0.013 to 0.05. |
| When 154.5 ≤ θ < 155.5 | (h/λ) × a is 0.005 to 0.0055 or 0.013 to 0.05. |
| When 155.5 ≤ θ < 156.5 | (h/λ) × a is 0.005 to 0.0055 or 0.0125 to 0.05. |
| When 156.5 ≤ θ < 157.5 | (h/λ) × a is 0.005 or 0.0125 to 0.05. |
| When 157.5 ≤ θ < 158.5 | (h/λ) × a is 0.005 to 0.0055 or 0.0125 to 0.05. |
| When 158.5 ≤ θ < 159.5 | (h/λ) × a is 0.005 to 0.006 or 0.0125 to 0.05. |
| When 159.5 ≤ θ < 160.5 | (h/λ) × a is 0.005 or 0.0125 to 0.05. |
| When 160.5 ≤ θ < 161.5 | (h/λ) × a is 0.005 to 0.0055 or 0.0125 to 0.05. |
| When 161.5 ≤ θ < 162.5 | (h/λ) × a is 0.005 to 0.0065 or 0.0125 to 0.05. |
| When 162.5 ≤ θ < 163.5 | (h/λ) × a is 0.005 to 0.0055 or 0.0125 to 0.05. |
| When 163.5 ≤ θ < 171.5 | (h/λ) × a is 0.0125 to 0.05. |
| When 171.5 ≤ θ < 172.5 | (h/λ) × a is 0.0125 to 0.0485. |
| When 172.5 ≤ θ < 173.5 | (h/λ) × a is 0.0125 to 0.0455. |
| When 173.5 ≤ θ < 174.5 | (h/λ) × a is 0.0125 to 0.042. |
| When 174.5 ≤ θ < 175.5 | (h/λ) × a is 0.0125 to 0.038. |
| When 175.5 ≤ θ < 176.5 | (h/λ) × a is 0.0125 to 0.032. |
| When 176.5 ≤ θ < 180 | (h/λ) × a is 0.013 to 0.0145. |

TABLE 12

For [0.15 ≤ H/λ < 0.25]

| | |
|---|---|
| When 0 ≤ θ < 0.5 | (h/λ) × a is 0.01 to 0.0345. |
| When 0.5 ≤ θ < 1.5 | (h/λ) × a is 0.014 to 0.0285. |
| When 1.5 ≤ θ < 45.5 | (h/λ) × a does not exist. |
| When 45.5 ≤ θ < 46.5 | (h/λ) × a is 0.0235 to 0.05. |
| When 46.5 ≤ θ < 47.5 | (h/λ) × a is 0.0165 to 0.05. |
| When 47.5 ≤ θ < 48.5 | (h/λ) × a is 0.0115 to 0.05. |
| When 48.5 ≤ θ < 49.5 | (h/λ) × a is 0.008 to 0.05. |
| When 49.5 ≤ θ < 130.5 | (h/λ) × a is 0.005 to 0.05. |
| When 130.5 ≤ θ < 131.5 | (h/λ) × a is 0.006 to 0.05. |
| When 131.5 ≤ θ < 132.5 | (h/λ) × a is 0.007 to 0.05. |
| When 132.5 ≤ θ < 142.5 | (h/λ) × a is 0.0075 to 0.05. |
| When 142.5 ≤ θ < 144.5 | (h/λ) × a is 0.008 to 0.05. |
| When 144.5 ≤ θ < 148.5 | (h/λ) × a is 0.0085 to 0.05. |
| When 148.5 ≤ θ < 157.5 | (h/λ) × a is 0.008 to 0.05. |
| When 157.5 ≤ θ < 166.5 | (h/λ) × a is 0.0075 to 0.05. |
| When 166.5 ≤ θ < 169.5 | (h/λ) × a is 0.007 to 0.05. |
| When 169.5 ≤ θ < 170.5 | (h/λ) × a is 0.0065 to 0.05. |
| When 170.5 ≤ θ < 171.5 | (h/λ) × a is 0.007 to 0.05. |
| When 171.5 ≤ θ < 172.5 | (h/λ) × a is 0.0075 to 0.05. |
| When 172.5 ≤ θ < 175.5 | (h/λ) × a is 0.008 to 0.05. |
| When 175.5 ≤ θ < 176.5 | (h/λ) × a is 0.008 to 0.0485. |
| When 176.5 ≤ θ < 177.5 | (h/λ) × a is 0.0085 to 0.0455. |
| When 177.5 ≤ θ < 178.5 | (h/λ) × a is 0.0085 to 0.0425. |
| When 178.5 ≤ θ < 179.5 | (h/λ) × a is 0.0085 to 0.0385. |
| When 179.5|[M2] ≤ θ < 180 | (h/λ) × a is 0.009 to 0.0345. |

TABLE 13

For [0.25 ≤ H/λ < 0.35]

| | |
|---|---|
| When 0 ≤ θ < 0.5 | (h/λ) × a is 0.005 to 0.0455. |
| When 0.5 ≤ θ < 1.5 | (h/λ) × a is 0.005 to 0.0445. |
| When 1.5 ≤ θ < 2.5 | (h/λ) × a is 0.005 to 0.041. |
| When 2.5 ≤ θ < 3.5 | (h/λ) × a is 0.005 to 0.037. |
| When 3.5 ≤ θ < 4.5 | (h/λ) × a is 0.005 to 0.032. |
| When 4.5 ≤ θ < 5.5 | (h/λ) × a is 0.005 to 0.025. |
| When 5.5 ≤ θ < 42.5 | (h/λ) × a does not exist. |
| When 42.5 ≤ θ < 43.5 | (h/λ) × a is 0.023 to 0.05. |
| When 43.5 ≤ θ < 44.5 | (h/λ) × a is 0.015 to 0.05. |

TABLE 13-continued

For [0.25 ≤ H/λ < 0.35]

| | |
|---|---|
| When 44.5 ≤ θ < 45.5 | (h/λ) × a is 0.01 to 0.05. |
| When 45.5 ≤ θ < 46.5 | (h/λ) × a is 0.006 to 0.05. |
| When 46.5 ≤ θ < 179.5 | (h/λ) × a is 0.005 to 0.05. |
| When 179.5 ≤ θ < 180 | (h/λ) × a is 0.005 to 0.048. |

TABLE 14

For [0.35 ≤ H/λ < 0.45]

| | |
|---|---|
| When 0 ≤ θ < 2.5 | (h/λ) × a is 0.005 to 0.045. |
| When 2.5 ≤ θ < 3.5 | (h/λ) × a is 0.005 to 0.0475. |
| When 3.5 ≤ θ < 4.5 | (h/λ) × a is 0.005 to 0.044. |
| When 4.5 ≤ θ < 5.5 | (h/λ) × a is 0.005 to 0.04. |
| When 5.5 ≤ θ < 6.5 | (h/λ) × a is 0.005 to 0.0355. |
| When 6.5 ≤ θ < 7.5 | (h/λ) × a is 0.005 to 0.029. |
| When 7.5 ≤ θ < 39.5 | (h/λ) × a does not exist. |
| When 39.5 ≤ θ < 40.5 | (h/λ) × a is 0.0355 to 0.05. |
| When 40.5 ≤ θ < 41.5 | (h/λ) × a is 0.021 to 0.05. |
| When 41.5 ≤ θ < 42.5 | (h/λ) × a is 0.0135 to 0.05. |
| When 42.5 ≤ θ < 43.5 | (h/λ) × a is 0.008 to 0.05. |
| When 43.5 ≤ θ < 180 | (h/λ) × a is 0.005 to 0.05. |

TABLE 15

For [0.45 ≤ H/λ < 0.55]

| | |
|---|---|
| When 0 ≤ θ < 7.5 | (h/λ) × a is 0.005 to 0.045. |
| When 7.5 ≤ θ < 8.5 | (h/λ) × a is 0.006 to 0.045. |
| When 8.5 ≤ θ < 9.5 | (h/λ) × a is 0.0105 to 0.045. |
| When 9.5 ≤ θ < 38.5 | (h/λ) × a is 0.0455 to 0.045. |
| When 38.5 ≤ θ < 39.5 | (h/λ) × a is 0.0265 to 0.045. |
| When 39.5 ≤ θ < 40.5 | (h/λ) × a is 0.016 to 0.045. |
| When 41.5 ≤ θ < 180 | (h/λ) × a is 0.005 to 0.045. |

TABLE 16

For [0.55 ≤ H/λ < 0.65]

| | |
|---|---|
| When 0 ≤ θ < 8.5 | (h/λ) × a is 0.005 to 0.045. |
| When 8.5 ≤ θ < 9.5 | (h/λ) × a is 0.006 to 0.045. |
| When 9.5 ≤ θ < 10.5 | (h/λ) × a is 0.0115 to 0.045. |
| When 10.5 ≤ θ < 36.5 | (h/λ) × a is 0.0455 to 0.045. |
| When 36.5 ≤ θ < 37.5 | (h/λ) × a is 0.044 to 0.045. |
| When 37.5 ≤ θ < 38.5 | (h/λ) × a is 0.026 to 0.045. |
| When 38.5 ≤ θ < 39.5 | (h/λ) × a is 0.0155 to 0.045. |
| When 39.5 ≤ θ < 40.5 | (h/λ) × a is 0.009 to 0.045. |
| When 40.5 ≤ θ < 180 | (h/λ) × a is 0.005 to 0.045. |

TABLE 17

For [0.65 ≤ H/λ < 0.75]

| | |
|---|---|
| When 0 ≤ θ < 7.5 | (h/λ) × a is 0.005 to 0.045. |
| When 7.5 ≤ θ < 8.5 | (h/λ) × a is 0.005 to 0.0435. |
| When 8.5|[M3] ≤ θ < 9.5 | (h/λ) × a is 0.005 to 0.0385. |
| When 9.5 ≤ θ < 10.5 | (h/λ) × a is 0.009 to 0.032. |
| When 10.5 ≤ θ < 36.5 | (h/λ) × a does not exist. |
| When 36.5 ≤ θ < 37.5 | (h/λ) × a is 0.0305 to 0.045. |
| When 37.5 ≤ θ < 38.5 | (h/λ) × a is 0.0185 to 0.045. |
| When 38.5 ≤ θ < 39.5 | (h/λ) × a is 0.0105 to 0.045. |
| When 39.5 ≤ θ < 40.5 | (h/λ) × a is 0.0055 to 0.045. |
| When 40.5 ≤ θ < 180 | (h/λ) × a is 0.005 to 0.045. |

TABLE 18

For [0.75 ≤ H/λ < 0.85]

| | |
|---|---|
| When 0 ≤ θ < 8.5 | (h/λ) x a is 0.005 to 0.045. |
| When 8.5 ≤ θ < 9.5 | (h/λ) x a is 0.005 to 0.0405. |
| When 9.5 ≤ θ < 10.5 | (h/λ) x a is 0.009 to 0.035. |
| When 10.5 ≤ θ < 11.5 | (h/λ) x a is 0.017 to 0.023. |
| When 11.5 ≤ θ < 35.5 | (h/λ) x a does not exist. |
| When 35.5 ≤ θ < 36.5 | (h/λ) x a is 0.042 to 0.045. |
| When 36.5 ≤ θ < 37.5 | (h/λ) x a is 0.0245 to 0.045. |
| When 37.5 ≤ θ < 38.5 | (h/λ) x a is 0.014 to 0.045. |
| When 38.5 ≤ θ < 39.5 | (h/λ) x a is 0.0075 to 0.045. |
| When 39.5 ≤ θ < 180 | (h/λ) x a is 0.005 to 0.045. |

TABLE 19

For [0.85 ≤ H/λ < 0.95]

| | |
|---|---|
| When 0 ≤ θ < 8.5 | (h/λ) x a is 0.005 to 0.045. |
| When 8.5 ≤ θ < 9.5 | (h/λ) x a is 0.007 to 0.0415. |
| When 9.5 ≤ θ < 10.5 | (h/λ) x a is 0.01 to 0.036. |
| When 10.5 ≤ θ < 11.5 | (h/λ) x a is 0.018 to 0.0255. |
| When 11.5 ≤ θ < 35.5 | (h/λ) x a does not exist. |
| When 35.5 ≤ θ < 36.5 | (h/λ) x a is 0.037 to 0.045. |
| When 36.5 ≤ θ < 37.5 | (h/λ) x a is 0.0215 to 0.045. |
| When 37.5 ≤ θ < 38.5 | (h/λ) x a is 0.012 to 0.045. |
| When 38.5 ≤ θ < 39.5 | (h/λ) x a is 0.006 to 0.045. |
| When 39.5 ≤ θ < 180 | (h/λ) x a is 0.005 to 0.045. |

TABLE 20

For [0.95 ≤ H/λ < 1.00]

| | |
|---|---|
| When 0 ≤ θ < 7.5 | (h/λ) x a is 0.005 to 0.04. |
| When 7.5 ≤ θ < 8.5 | (h/λ) x a is 0.007 to 0.04. |
| When 8.5 ≤ θ < 9.5 | (h/λ) x a is 0.009 to 0.04. |
| When 9.5 ≤ θ < 10.5 | (h/λ) x a is 0.012 to 0.04. |
| When 10.5 ≤ θ < 11.5 | (h/λ) x a is 0.02 to 0.04. |
| When 11.5 ≤ θ < 35.5 | (h/λ) x a does not exist. |
| When 35.5 ≤ θ < 36.5 | (h/λ) x a is 0.034 to 0.04. |
| When 36.5 ≤ θ < 37.5 | (h/λ) x a is 0.0195 to 0.04. |
| When 37.5 ≤ θ < 38.5 | (h/λ) x a is 0.0105 to 0.04. |
| When 38.5 ≤ θ < 180 | (h/λ) x a is 0.005 to 0.04. |

In this case, the electromechanical coupling coefficient $K^2$ can be adjusted to about 0.02 or greater and the pass band can be significantly expanded.

In preferred embodiments of the present invention, the Euler angles ($\phi$, $\theta$, $\psi$) may be Euler angles equivalent in boundary acoustic wave properties from Equation (A) below in a preferred Euler angle range.

$$F(\varphi, \theta, \psi) = F(60° + \varphi, -\theta, \psi) \quad \text{Equation (A)}$$
$$= F(60° - \varphi, -\theta, 180° - \psi)$$
$$= F(\varphi, 180° + \theta, 180° - \psi)$$
$$= F(\varphi, \theta, 180° + \psi)$$

In the boundary acoustic wave device according to a preferred embodiment the present invention, an electrode material is not particularly limited and an IDT electrode is preferably made of Pt, for example. This is effective to improve reliability of the boundary acoustic wave device.

The IDT electrode may preferably include an Al film disposed on the first medium layer side and a Pt film disposed on the piezoelectric substrate side, for example. This reduces the insertion loss.

The IDT electrode may preferably include a Pt film disposed on the first medium layer side and an Al film disposed on the piezoelectric substrate side, for example. This reduces the absolute value of the temperature coefficient of frequency TCF and also the insertion loss as compared to the case of using only the Pt layer.

The IDT electrode preferably includes a metal laminate film formed by stacking a plurality of metal layers and the metal laminate film preferably includes a layer abutting the piezoelectric substrate, a layer abutting the first medium layer, and a metal layer which is located at at least one location between the metal layers and which is made of at least one material selected from the group consisting of Ti, Ni, and NiCr, for example. This increases the adhesion of the IDT electrode to the piezoelectric substrate, the adhesion of the IDT electrode to the first medium layer, and/or the adhesion of the metal layers. Therefore, the reliability of the boundary acoustic wave device is improved.

The boundary acoustic wave device according to a preferred embodiment of the present invention has a three-medium structure in which the first and second medium layers are deposited on a piezoelectric substrate. Therefore, the boundary acoustic wave device is suitable for increased frequencies and has improved reliability. The sound velocity of the first medium layer is less than the sound velocity of $LiTaO_3$, the sound velocity of the second medium layer is greater than the sound velocity of $LiTaO_3$, and (h/λ)×a is 0.05 or less. Therefore, a transverse-mode ripple is effectively suppressed. When the $LiTaO_3$ has Euler angles (0°±5°, θ, 0°±25°), the normalized thickness (h/λ)×a of the interdigital electrode is within one of ranges shown in above Tables 1 to 10 with respect to the value of H/λ and the value of θ. Therefore, the attenuation constant α can be reduced to about 0.06 dB/λ or less, for example. The normalized thickness (h/λ)×a of the interdigital electrode is within one of ranges shown in above Tables 11 to 20 with respect to the value of H/λ and the value of θ. Therefore, the electromechanical coupling coefficient $K^2$ can be adjusted to about 0.02 or greater and the pass band can be expanded. Accordingly, a boundary acoustic wave device having outstanding resonance properties and filtering properties is provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 14 is a graph showing the distribution of the propagation loss α when the normalized thickness H/λ (%) of an $SiO_2$ film used as a first medium layer is about 50% and θ of the Euler angles (0°, θ, 0°) of $LiTaO_3$ and the normalized thickness h/λ of IDT electrodes are varied.

FIG. 15 is a graph showing the distribution of the propagation loss α when the normalized thickness H/λ (%) of an $SiO_2$ film used as a first medium layer is about 60% and θ of the Euler angles (0°, θ, 0°) of $LiTaO_3$ and the normalized thickness h/λ of IDT electrodes are varied.

FIG. 16 is a graph showing the distribution of the propagation loss α when the normalized thickness H/λ (%) of an $SiO_2$ film used as a first medium layer is about 70% and θ of the Euler angles (0°, θ, 0°) of $LiTaO_3$ and the normalized thickness h/λ of IDT electrodes are varied.

FIG. 17 is a graph showing the distribution of the propagation loss α when the normalized thickness H/λ (%) of an $SiO_2$ film used as a first medium layer is about 80% and θ of the Euler angles (0°, θ, 0°) of $LiTaO_3$ and the normalized thickness h/λ of IDT electrodes are varied.

FIG. 30 is a graph showing results obtained using IDT electrodes having a normalized thickness of about 3.0%.

FIG. 31 is an illustration showing the energy distribution of a conventional boundary acoustic wave device.

DETAILED DESCRIPTION OF THE PREFERRED EMBODIMENTS

Preferred embodiments of the present invention will be described below with reference to the attached drawings.

Figure 1A:
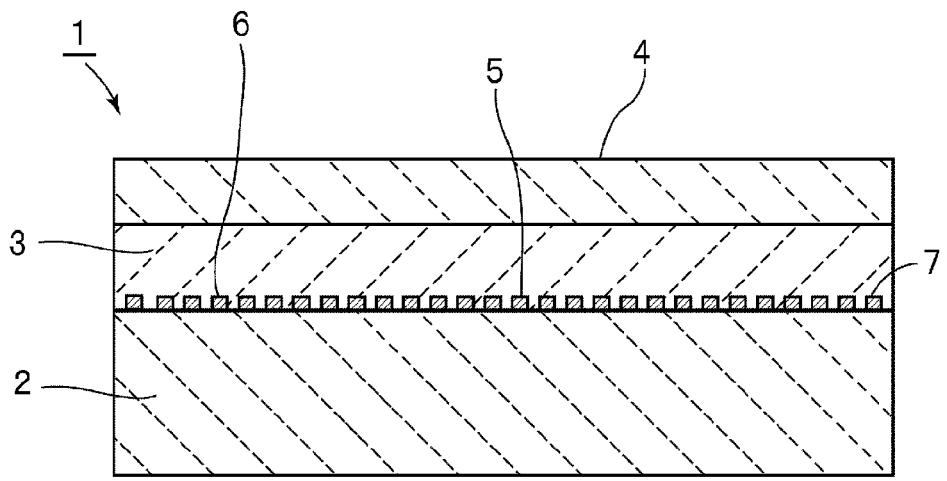
FIGS. 1A and 1B are a schematic front sectional view and a schematic horizontal sectional view, respectively, of a boundary acoustic wave device according to a preferred embodiment of the present invention.
Figure 1B:
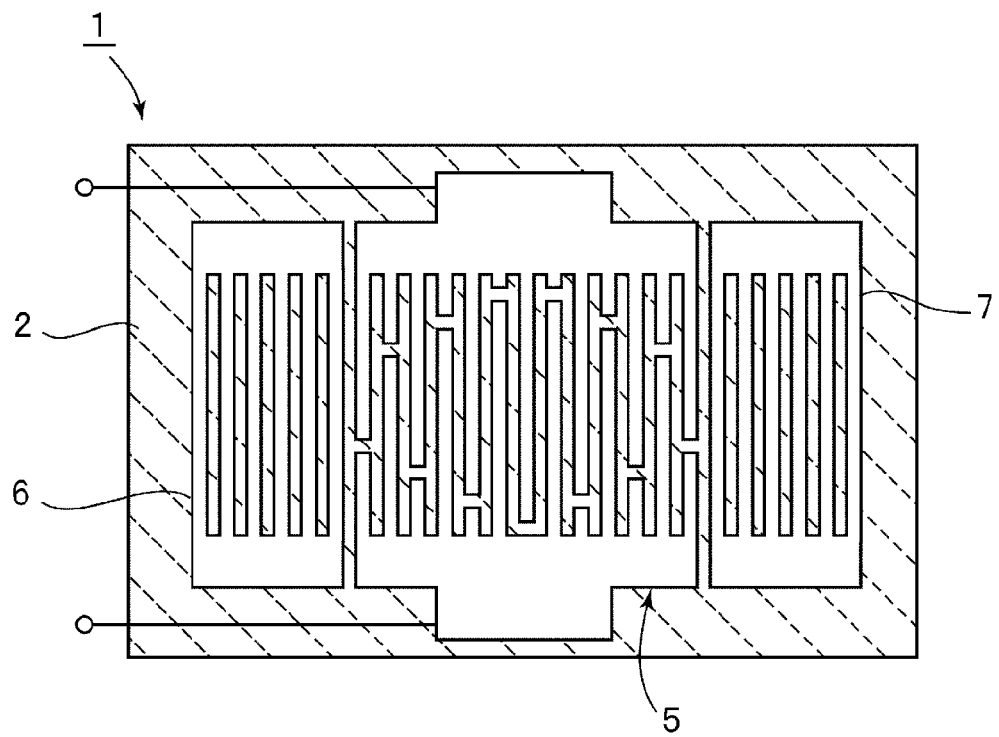

FIGS. 1A and 1B are a schematic front sectional view and a schematic horizontal sectional view, respectively, of a boundary acoustic wave device according to a preferred embodiment of the present invention.

The boundary acoustic wave device 1 includes a piezoelectric substrate 2 preferably made of single-crystalline LiTaO$_3$, for example. A first medium layer 3 and a second medium layer 4 are arranged on the piezoelectric substrate 2 in that order. That is, the boundary acoustic wave device 1 of this preferred embodiment has a three-medium structure.

In this preferred embodiment, the first medium layer 3 is made of SiO$_2$. The sound velocity of SiO$_2$ is about 3750 m/s. A dielectric used for the first medium layer 3 is not particularly limited and is preferably SiO$_2$, for example. SiO$_2$ has a positive temperature coefficient of frequency and LiTaO$_3$ has a negative temperature coefficient of frequency. This enables the absolute value of the temperature coefficient of frequency to be small. Therefore, changes in properties due to temperature changes are reduced.

In this preferred embodiment, the second medium layer 4 is made of SiN. The sound velocity of SiN is about 6000 m/s. A material forming the second medium layer 4 may preferably be one having a sound velocity different from that of the dielectric forming the first medium layer 3. The dielectric is preferably at least one material selected from the group consisting of SiN, SiON, AlN, AlO, Si, SiC, diamond-like carbon, and polysilicon, for example. The use of one material selected from the above group enables a boundary acoustic wave to be confined by a large waveguide effect.

IDT electrodes 5 and reflectors 6 and 7 are arranged at the interface between the piezoelectric substrate 2 and the first medium layer 3.

With reference to FIG. 1B, the reflectors 6 and 7 are arranged on both sides of the IDT electrodes 5 in the propagation direction of a boundary acoustic wave, whereby a one-port boundary acoustic wave resonator is provided.

The boundary acoustic wave device according to preferred embodiments of the present invention is not limited to the boundary acoustic wave resonator and is applicable to various boundary acoustic wave apparatuses, such as boundary acoustic wave filters. Therefore, the electrode structure may be appropriately modified depending on the function of the boundary acoustic wave device.

Figure 2:
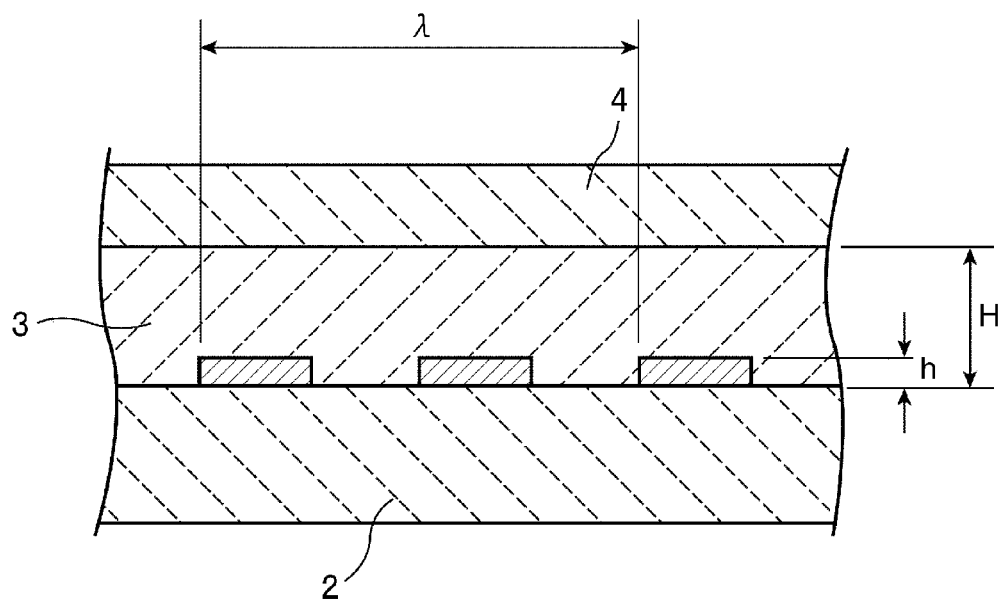
FIG. 2 is a partial cutaway front sectional view illustrating the thickness H of a first medium layer, the thickness h of an IDT electrode, and the period λ of electrode fingers according to a preferred embodiment of the present invention.

The conventional boundary acoustic wave device disclosed in WO 98/52279 has a problem in that a transverse-mode ripple occurs, as described above, when the IDT electrodes have an increased thickness or are made of a high-density metal. The inventors of the present invention have intensively studied structures for suppressing transverse-mode ripples in boundary acoustic wave devices having three-medium structures. As a result, the inventors of the present invention have discovered that a transverse-mode ripple can be effectively suppressed when the sound velocity of the first medium layer 3 is less than the sound velocity of LiTaO$_3$, the sound velocity of the second medium layer 4 is greater than the sound velocity of LiTaO$_3$, and (h/λ)×a is about 0.05 or less, that is, about 5% or less, where H is the thickness of the first medium layer 3, h is the thickness of the IDT electrodes, λ is the period of electrode fingers of the IDT electrodes, and a is the ratio of the density of the IDT electrodes to the density of Au as shown in FIG. 2. Preferred embodiments of the present invention are further described below in detail on the basis of experiments.

Experiment 1

LiTaO$_3$ having Euler angles (0°, 132°, 0°) was used for each piezoelectric substrate. SiO$_2$ films having a normalized thickness H/λ of about 0.4 were used for first medium layers. Au films having a normalized thickness h/λ of about 0.005 to about 0.05 were used for IDT electrodes 5. Second medium layers 4 were SiN films having a thickness of about 3000 nm, that is, a normalized thickness of about 1.58 (1.58 times the wavelength, that is, 158% of the wavelength).

The relationship between the thickness (h/λ) (%) of the IDT electrodes and the propagation loss α of boundary acoustic wave devices obtained as described above was determined. The expression h/λ (%) refers to a ratio represented by the formula (h/λ)×100. The results are shown in FIG. 3.

Figure 3:
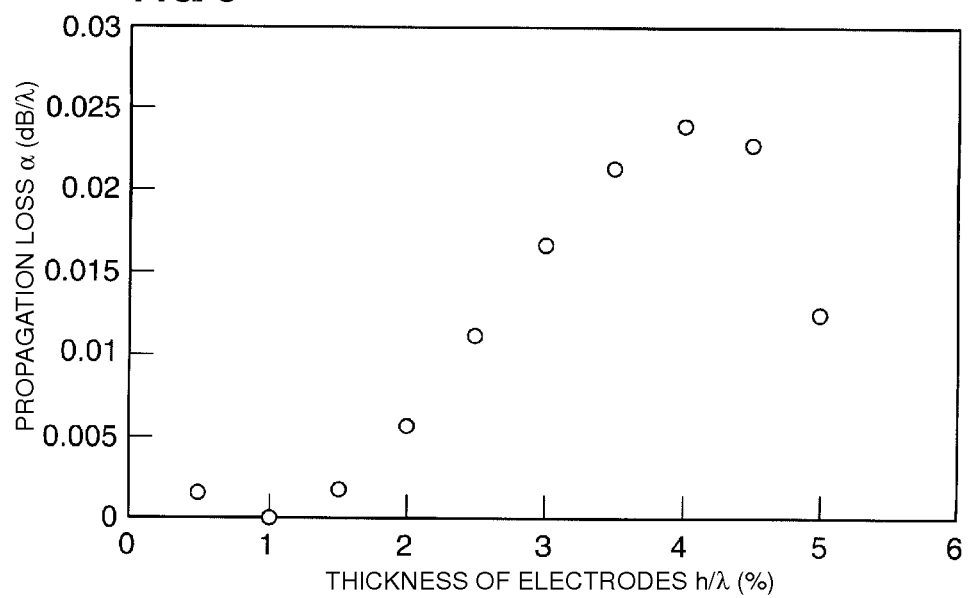
FIG. 3 is a graph showing the change in propagation loss α by varying the thickness of IDT electrodes in Example 1.

As is clear from FIG. 3, the reduction of h/λ from about 4.0% to about 2.5%, that is, about 0.04 to about 0.25 improves the propagation loss α from about 0.024 to about 0.011, that is, by about 0.013 (dB/λ).

Figure 4:
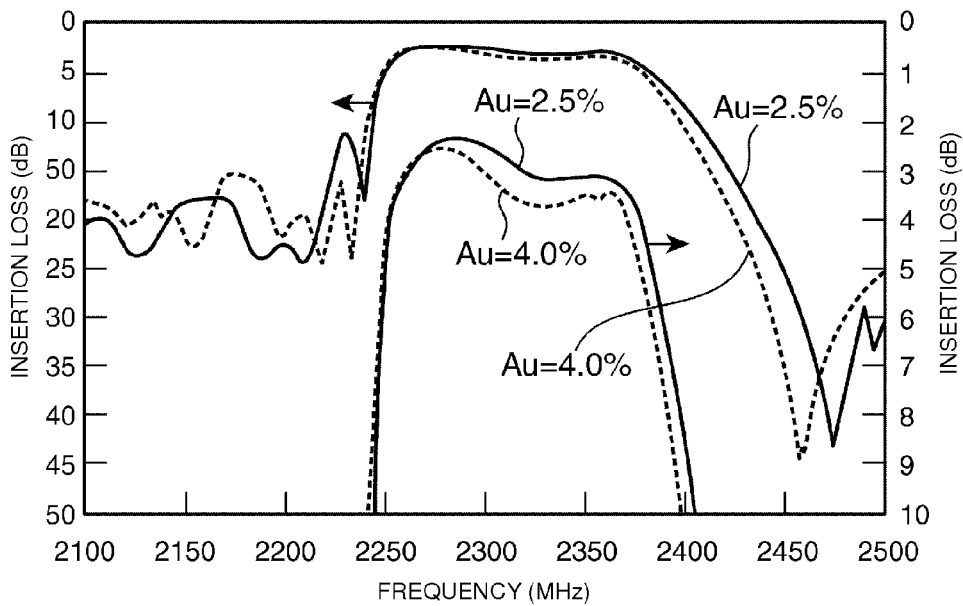
FIG. 4 is a graph showing the change in frequency response when using IDT electrodes which are made of Au and which have a normalized thickness (%) of about 4.0% and about 2.5%.

Longitudinal mode resonator-type filters including Au films, each having a normalized thickness h/λ (%) of about 2.5% or about 4.0%, as IDT electrodes were measured for frequency response. The results are shown in FIG. 4. As is clear from FIG. 4, the longitudinal mode resonator-type filter including the Au films having a normalized thickness h/λ (%) of about 4.0% has a minimum insertion loss of about 2.55 dB and the longitudinal mode resonator-type filter including the Au films having a smaller normalized thickness h/λ (%) of about 2.5% has an improved minimum insertion loss of about 2.35 dB.

This preferred embodiment of the present invention shows that when the IDT electrodes are made of Au, which is a relatively heavy metal, and a normalized thickness h/λ thereof is 4.0% or less, the reduction of the normalized thickness h/λ improves the propagation loss α.

Experiment 2

Figure 5:
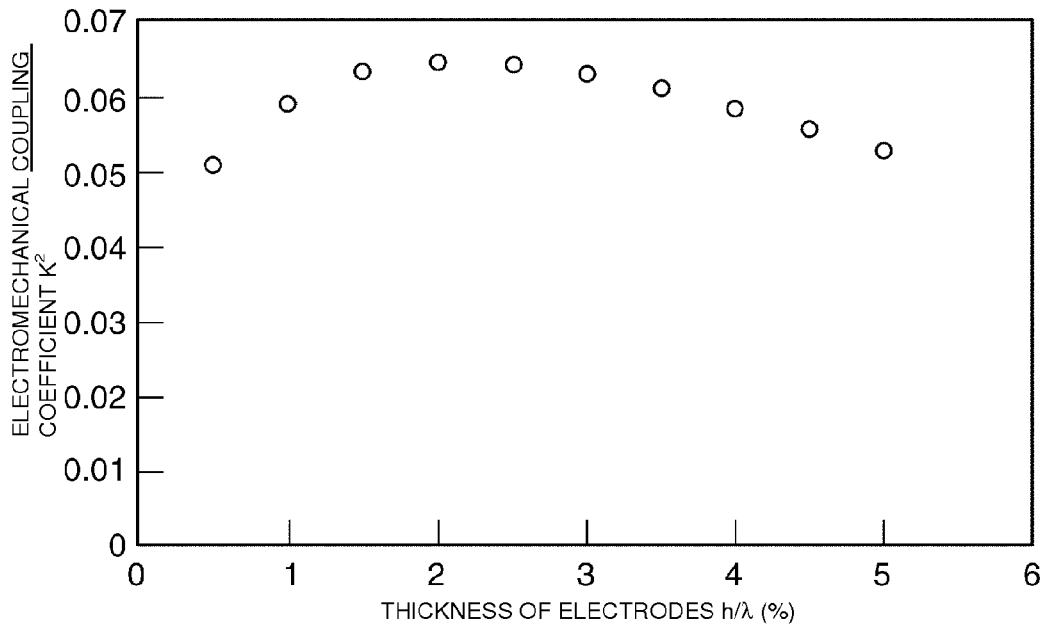
FIG. 5 is a graph showing the relationship between the normalized thickness h/λ (%) and electromechanical coefficient $K^2$ of IDT electrodes.
Figure 6:
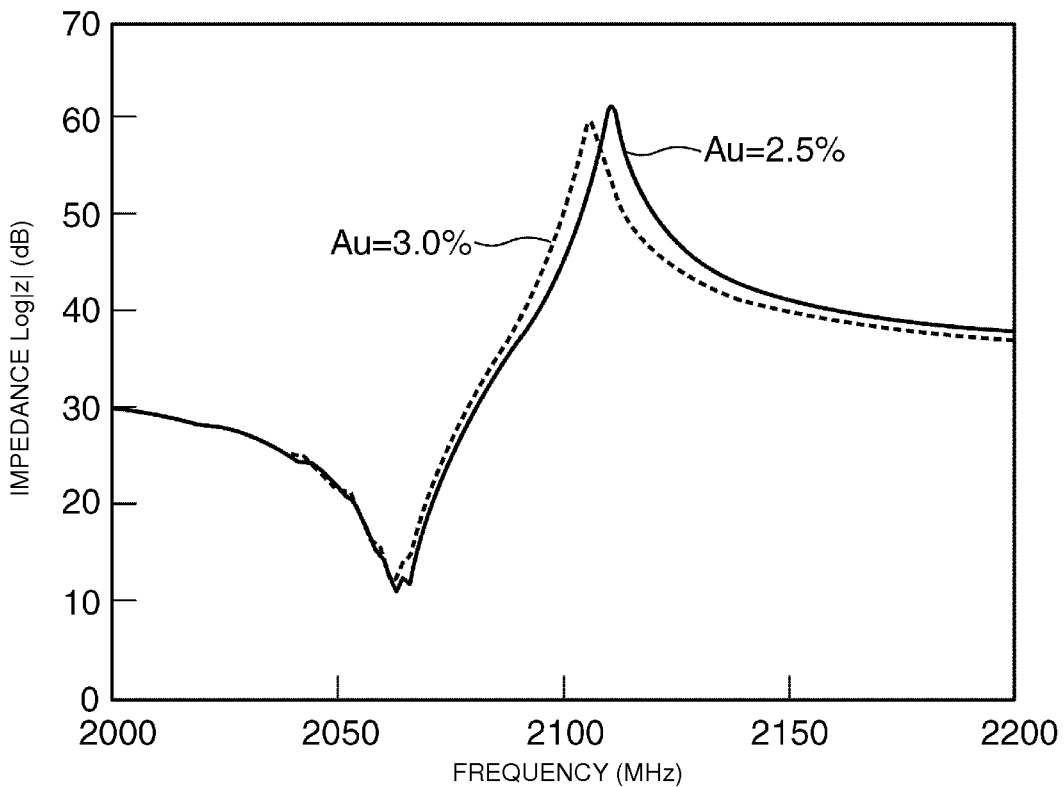
FIG. 6 is a graph showing the impedance characteristics when using Au films having a normalized thickness of about 2.5% and about 3.0% as IDT electrodes.

In boundary acoustic wave devices 1 having the same medium structure as that prepared in Experiment 1, the variation of the electromechanical coupling coefficient K$^2$ was determined by varying the normalized thickness h/λ (%) of IDT electrodes made of Au within the range of about 0.5% to about 5% in the same manner as that described in Experiment 1. The results are shown in FIG. 5. As is clear from FIG. 5, a reduction of the normalized thickness h/λ (%) of the IDT electrodes from about 3.0% to about 2.5% reduces the electromechanical coupling coefficient K$^2$ from about 6.45% to about 6.3%. That is, the electromechanical coupling coefficient K$^2$ can be controlled by adjusting the normalized thickness h/λ (%) of the IDT electrodes 5. FIG. 6 is a graph showing the impedance characteristics of boundary acoustic wave devices including the same structure as described above except that IDT electrodes 5 made of Au had a normalized thickness h/λ (%) of about 2.5% or about 3.0%.

As is clear from FIG. 6, a variation of the normalized thickness h/λ (%) of the IDT electrodes from about 3.0% to about 2.5% improves the band width ratio by about 0.2%. It is known that the equation (electromechanical coupling coefficient)=(band width ratio)×2 is substantially satisfied for the electromechanical coupling coefficient and the band width ratio. This shows that an increase of the electromechanical coupling coefficient K$^2$ increases the band width ratio.

Experiment 3

In Experiment 3, the dependence of the propagation loss α and the electromechanical coupling coefficient K$^2$ on the normalized thickness h/λ of IDT electrodes was determined by varying θ of Euler angles (0°, θ, 0°) of the LiTaO$_3$ and the normalized thickness h/λ of the IDT electrodes on the basis of the results of Experiments 1 and 2. The results are shown in FIGS. 10 to 28.

FIGS. 10 to 19 are graphs showing the relationship between θ, the normalized thickness h/λ of IDT electrodes, and the propagation loss α, θ being determined when the normalized thickness H/λ (%) of SiO$_2$ used for a first medium layer is about 10%, about 20%, about 30%, about 40%, about 50%, about 60%, about 70%, about 80%, about 90%, or about 100%.

Symbols indicating regions surrounded by contour lines in FIGS. 10 to 19 each represent the range of the propagation loss of a corresponding one of the regions. For example, the propagation loss α of each of Regions A13 to A20 corresponds to that of A13 to A20 shown in Table 21 below. That is, the propagation loss α of Region A13 is about 0.07 to about 0.08 (dB/λ). As is clear from FIG. 10, the propagation loss of Region A13 is about 0.07 to about 0.08 and Region A13, Region A14, Region A15, Region A16, Region A17, Region A18, Region A19, and Region A20 are arranged in descending order of propagation loss α in that order.

Figure 10:
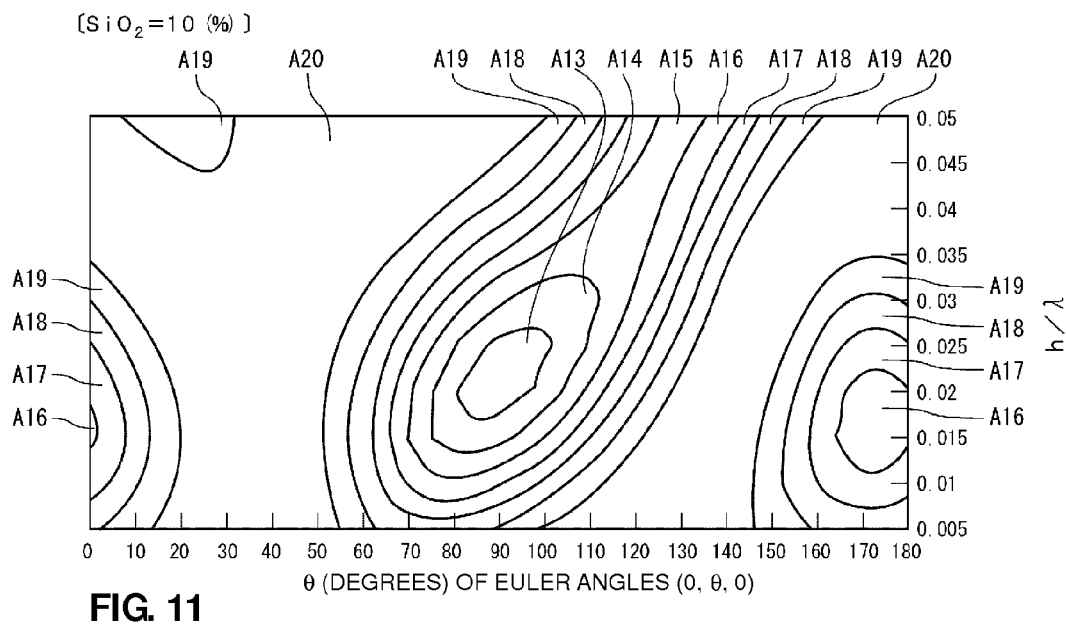
FIG. 10 is a graph showing the distribution of the propagation loss α when the normalized thickness H/λ (%) of an $SiO_2$ film used as a first medium layer is about 10% and θ of the Euler angles (0°, θ, 0°) of $LiTaO_3$ and the normalized thickness h/λ of IDT electrodes are varied.
Figure 11:
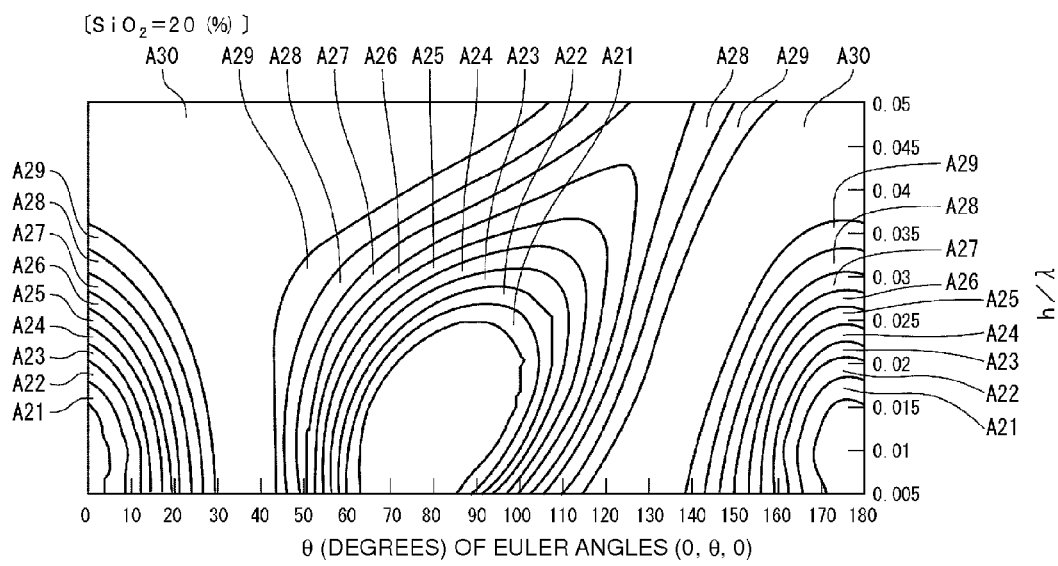
FIG. 11 is a graph showing the distribution of the propagation loss α when the normalized thickness H/λ (%) of an $SiO_2$ film used as a first medium layer is about 20% and θ of the Euler angles (0°, θ, 0°) of $LiTaO_3$ and the normalized thickness h/λ of IDT electrodes are varied.

FIG. 10 illustrates that in order to adjust the propagation loss α to about 0.06 dB/λ or less, Regions A15 to A20 may be used. That is, θ of the Euler angles and the normalized thickness h/λ of the IDT electrodes may be selected such that Regions A15 to A20 are obtained.

Likewise, FIGS. 11 to 19 illustrate that the propagation loss α can be adjusted to about 0.06 dB/λ or less in such a manner that θ of the Euler angles and the normalized thickness h/λ of the IDT electrodes are selected depending on the normalized thickness H/λ (%) of $SiO_2$ used for the first medium layer 3.

Figure 12:
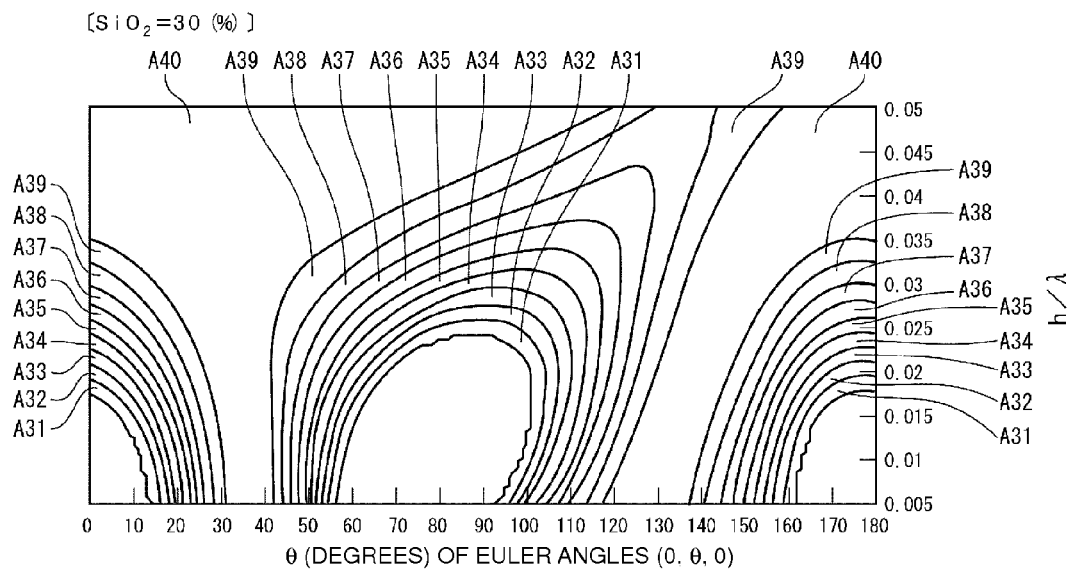
FIG. 12 is a graph showing the distribution of the propagation loss α when the normalized thickness H/λ (%) of an $SiO_2$ film used as a first medium layer is about 30% and θ of the Euler angles (0°, θ, 0°) of $LiTaO_3$ and the normalized thickness h/λ of IDT electrodes are varied.
Figure 13:
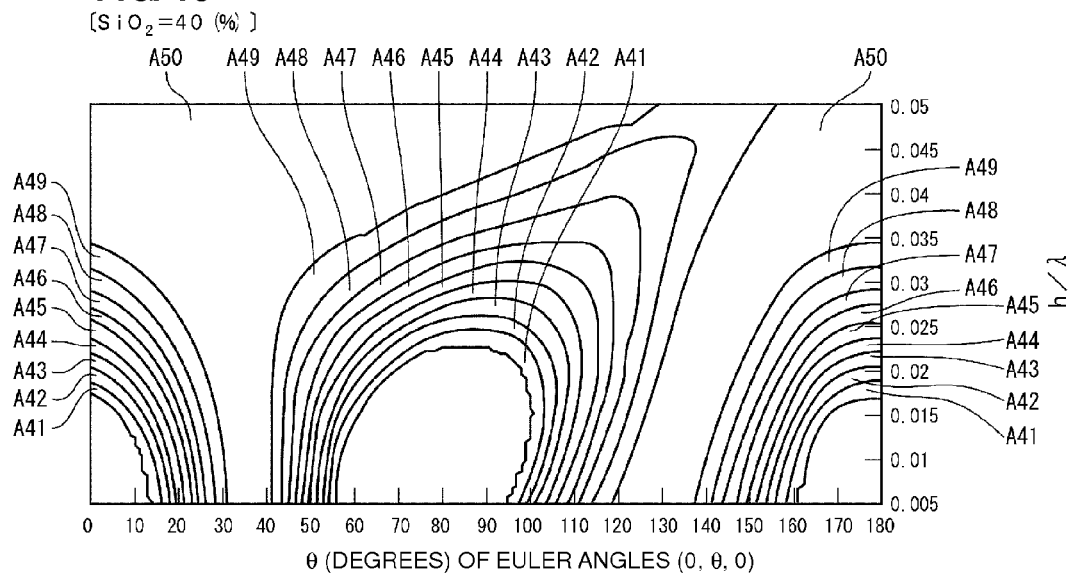
FIG. 13 is a graph showing the distribution of the propagation loss α when the normalized thickness H/λ (%) of an $SiO_2$ film used as a first medium layer is about 40% and θ of the Euler angles (0°, θ, 0°) of $LiTaO_3$ and the normalized thickness h/λ of IDT electrodes are varied.
Figure 18:
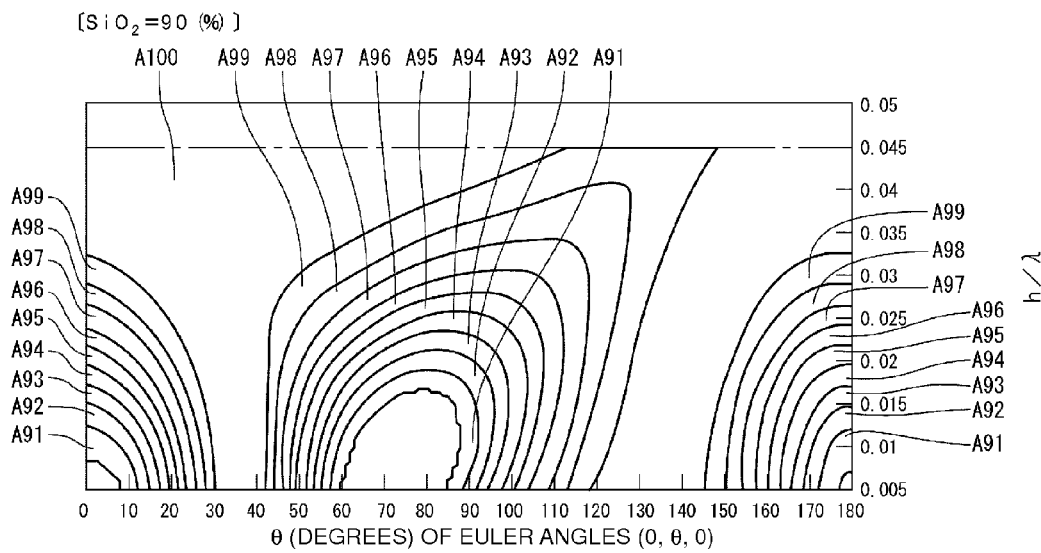
FIG. 18 is a graph showing the distribution of the propagation loss α when the normalized thickness H/λ (%) of an $SiO_2$ film used as a first medium layer is about 90% and θ of the Euler angles (0°, θ, 0°) of $LiTaO_3$ and the normalized thickness h/λ of IDT electrodes are varied.
Figure 19:
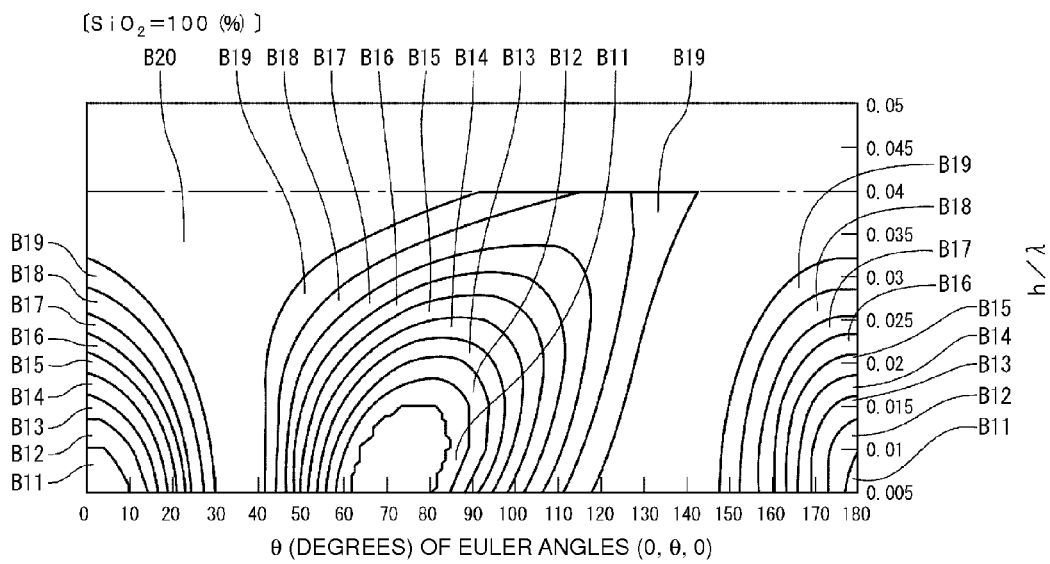
FIG. 19 is a graph showing the distribution of the propagation loss α when the normalized thickness H/λ (%) of an $SiO_2$ film used as a first medium layer is about 100% and θ of the Euler angles (0°, θ, 0°) of $LiTaO_3$ and the normalized thickness h/λ of IDT electrodes are varied.
Figure 20:
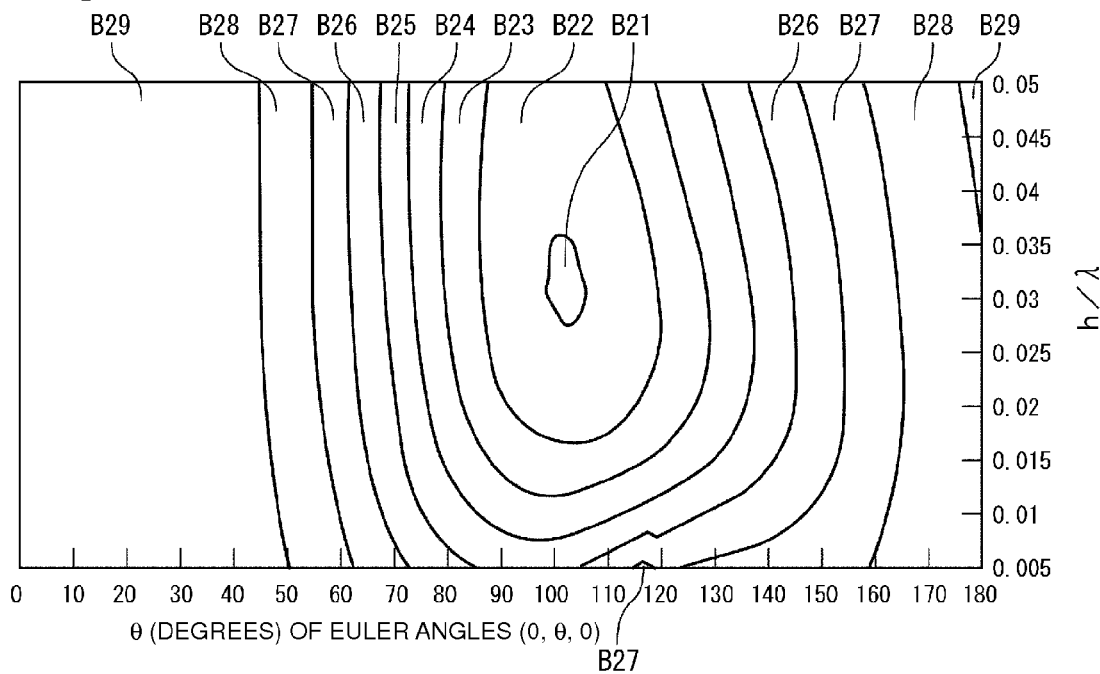
FIG. 20 is a graph showing the distribution of the electromechanical coefficient $K^2$ when the normalized thickness H/λ (%) of an $SiO_2$ film used as a first medium layer is about 20% and θ of the Euler angles (0°, θ, 0°) of $LiTaO_3$ and the normalized thickness h/λ of IDT electrodes are varied.
Figure 21:
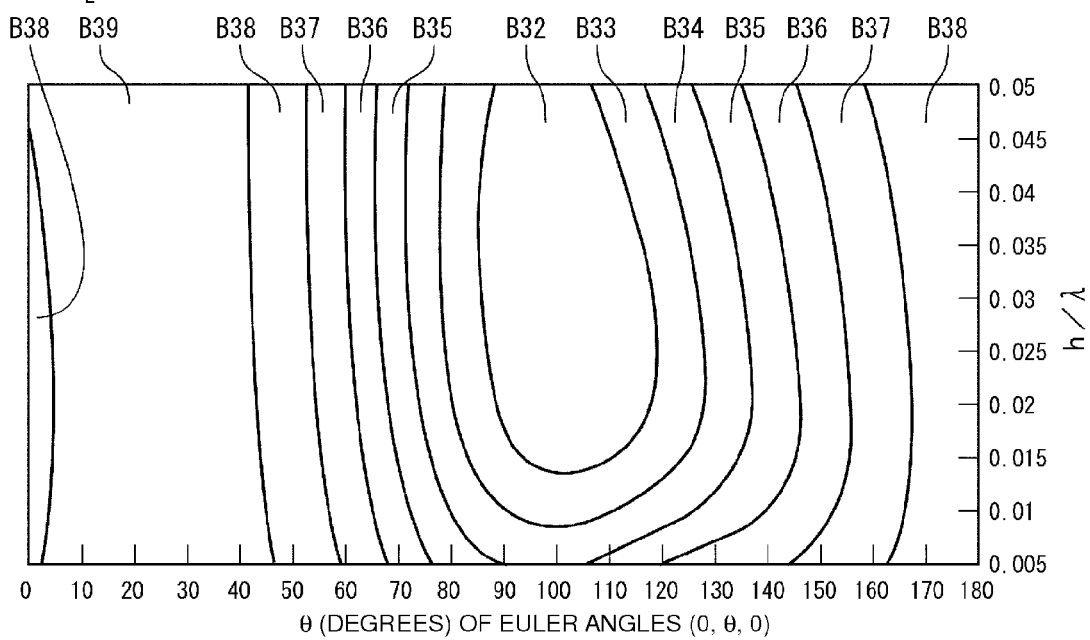
FIG. 21 is a graph showing the distribution of the electromechanical coefficient $K^2$ when the normalized thickness H/λ (%) of an $SiO_2$ film used as a first medium layer is about 30% and θ of the Euler angles (0°, θ, 0°) of $LiTaO_3$ and the normalized thickness h/λ of IDT electrodes are varied.
Figure 22:
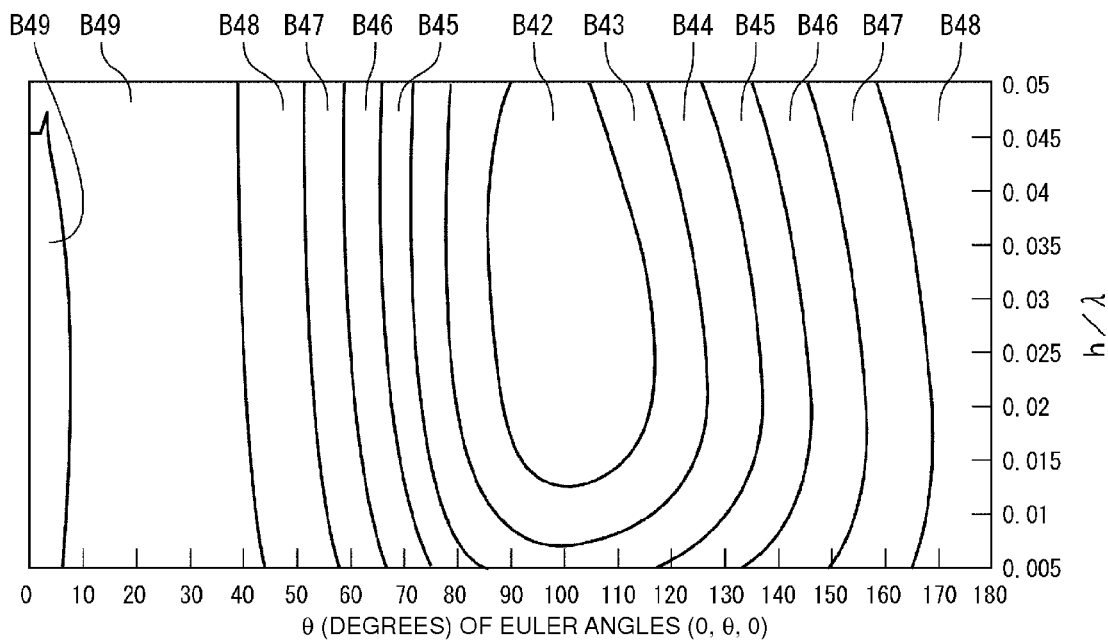
FIG. 22 is a graph showing the distribution of the electromechanical coefficient $K^2$ when the normalized thickness H/λ (%) of an $SiO_2$ film used as a first medium layer is about 40% and θ of the Euler angles (0°, θ, 0°) of $LiTaO_3$ and the normalized thickness h/λ of IDT electrodes are varied.
Figure 23:
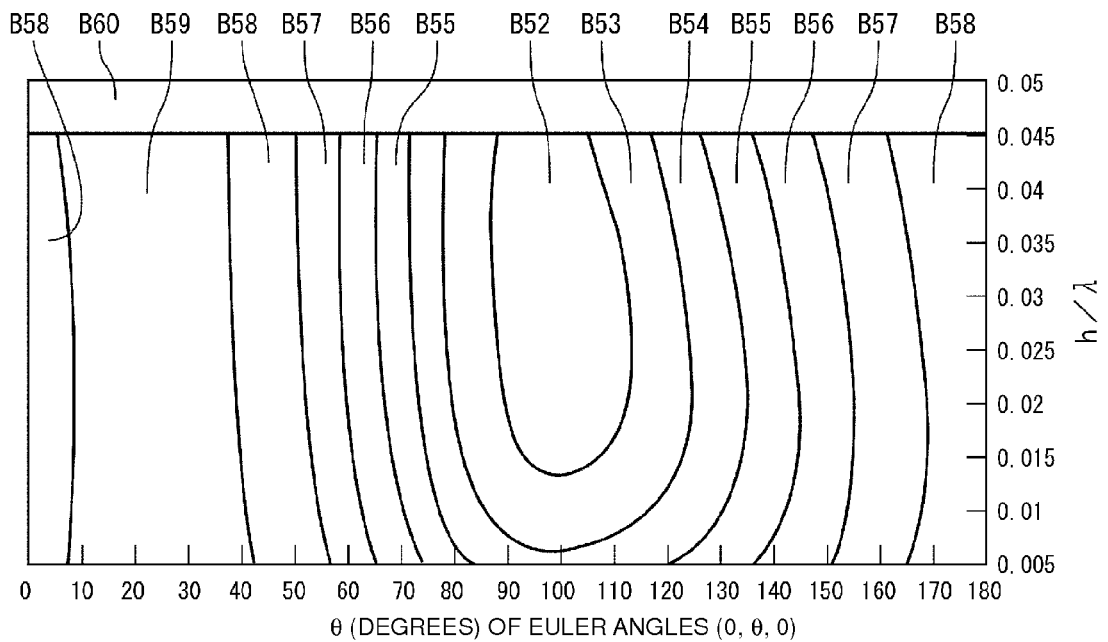
FIG. 23 is a graph showing the distribution of the electromechanical coefficient $K^2$ when the normalized thickness H/λ (%) of an $SiO_2$ film used as a first medium layer is about 50% and θ of the Euler angles (0°, θ, 0°) of $LiTaO_3$ and the normalized thickness h/λ of IDT electrodes are varied.
Figure 24:
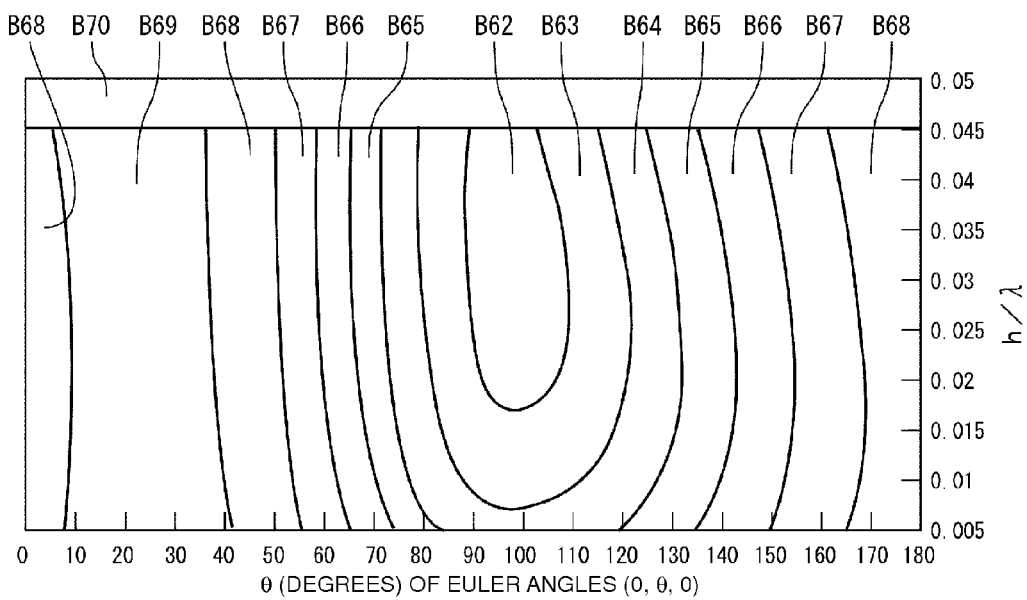
FIG. 24 is a graph showing the distribution of the electromechanical coefficient $K^2$ when the normalized thickness H/λ (%) of an $SiO_2$ film used as a first medium layer is about 60% and θ of the Euler angles (0°, θ, 0°) of $LiTaO_3$ and the normalized thickness h/λ of IDT electrodes are varied.
Figure 25:
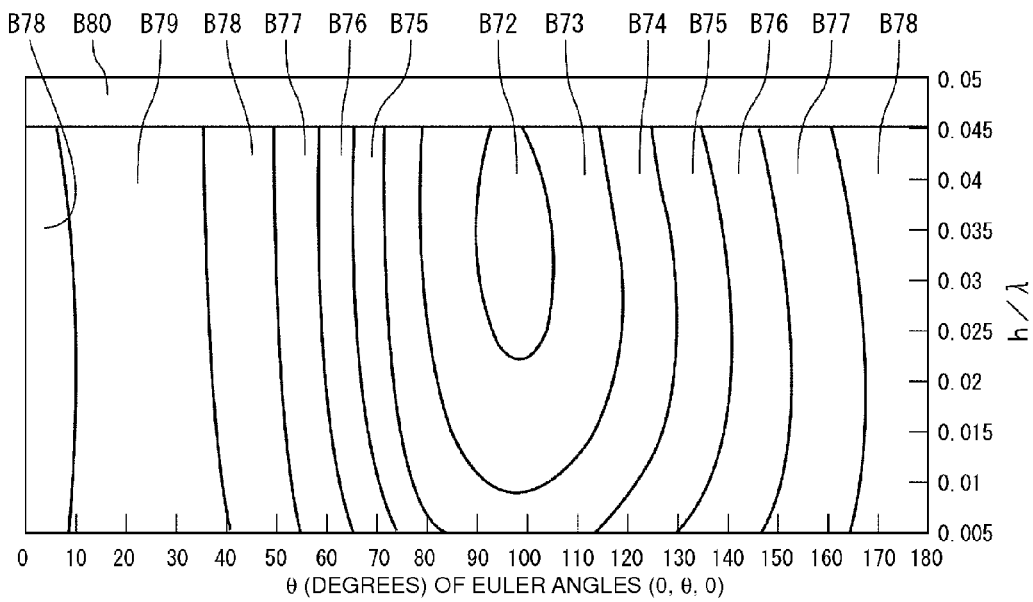
FIG. 25 is a graph showing the distribution of the electromechanical coefficient $K^2$ when the normalized thickness H/λ (%) of an $SiO_2$ film used as a first medium layer is about 70% and θ of the Euler angles (0°, θ, 0°) of $LiTaO_3$ and the normalized thickness h/λ of IDT electrodes are varied.
Figure 26:
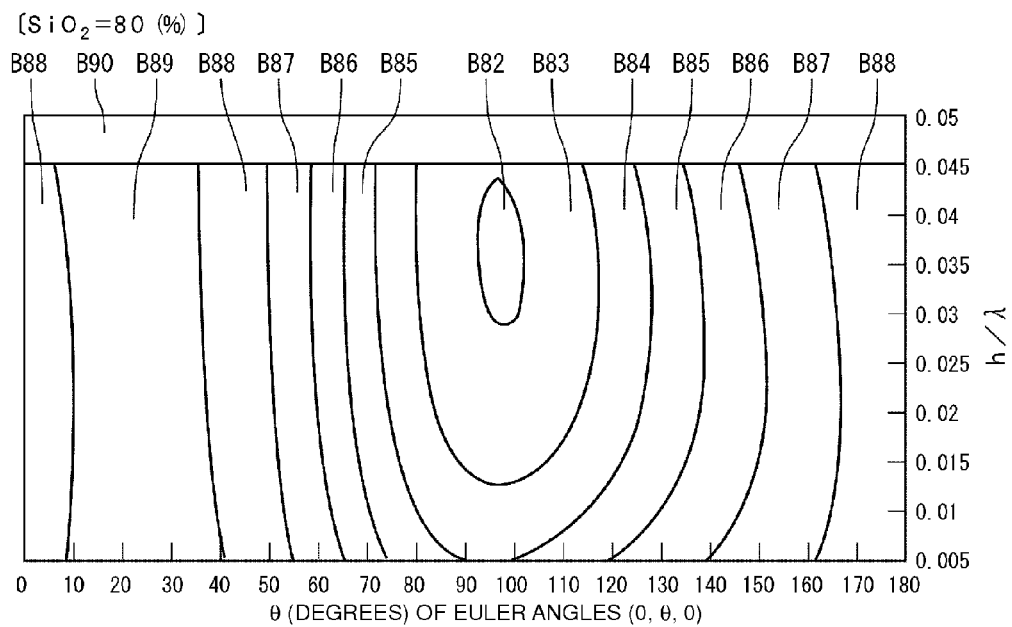
FIG. 26 is a graph showing the distribution of the electromechanical coefficient $K^2$ when the normalized thickness H/λ (%) of an $SiO_2$ film used as a first medium layer is about 80% and θ of the Euler angles (0°, θ, 0°) of $LiTaO_3$ and the normalized thickness h/λ of IDT electrodes are varied.
Figure 27:
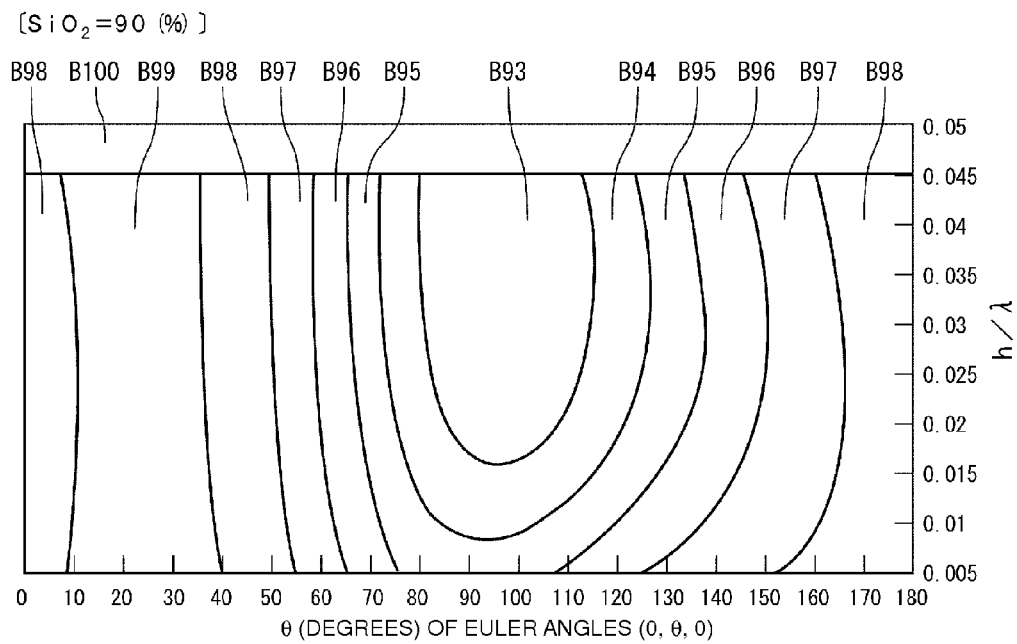
FIG. 27 is a graph showing the distribution of the electromechanical coefficient $K^2$ when the normalized thickness H/λ (%) of an $SiO_2$ film used as a first medium layer is about 90% and θ of the Euler angles (0°, θ, 0°) of $LiTaO_3$ and the normalized thickness h/λ of IDT electrodes are varied.
Figure 28:
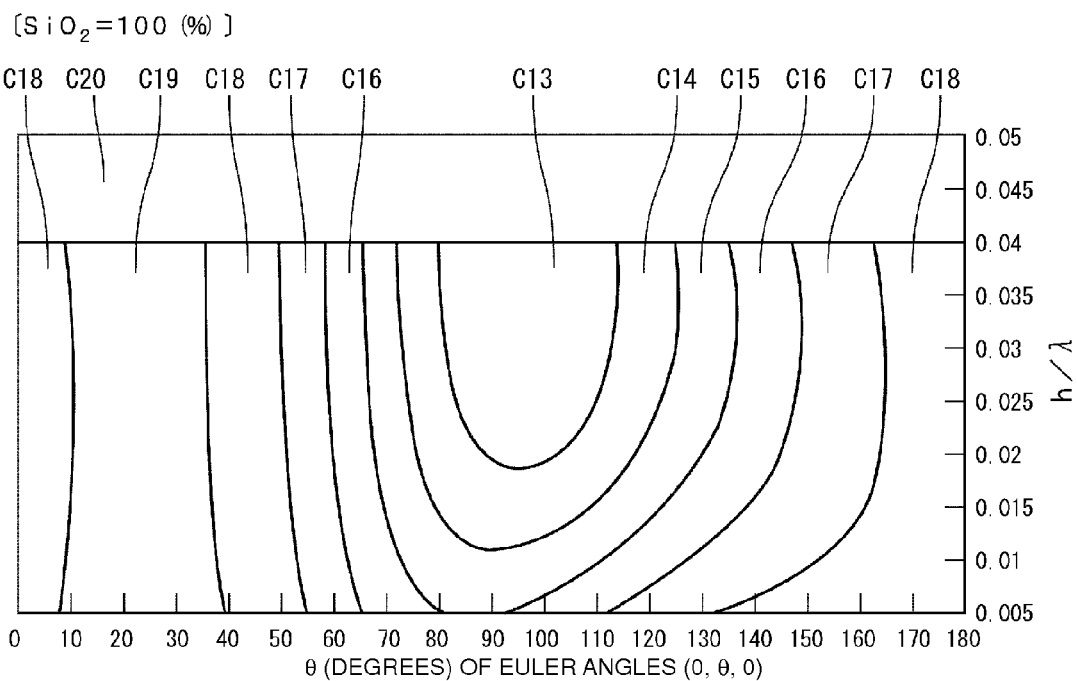
FIG. 28 is a graph showing the distribution of the electromechanical coefficient $K^2$ when the normalized thickness H/λ (%) of an $SiO_2$ film used as a first medium layer is about 100% and θ of the Euler angles (0°, θ, 0°) of $LiTaO_3$ and the normalized thickness h/λ of IDT electrodes are varied.

When h/λ is greater than about 0.05 in FIGS. 12 and 13, boundary acoustic waves are non-leaky and therefore the propagation loss α is 0. Likewise, when h/λ is greater than about 0.045 in FIGS. 14 to 18 and h/λ is greater than about 0.04 in FIG. 19, boundary acoustic waves are non-leaky and, therefore, the propagation loss α is 0. That is, although boundary acoustic waves are non-leaky at an electrode thickness of about 6% or greater as shown in FIG. 3, an increase in the normalized thickness of an $SiO_2$ layer enables a boundary acoustic wave to be non-leaky at a smaller electrode thickness.

TABLE 21

| | Propagation loss α |
|---|---|
| A13 | 0.07-0.08 |
| A14 | 0.06-0.07 |
| A15 | 0.05-0.06 |
| A16 | 0.04-0.05 |
| A17 | 0.03-0.04 |
| A18 | 0.02-0.03 |
| A19 | 0.01-0.02 |
| A20 | 0-0.01 |
| A21 | 0.09-0.1 |
| A22 | 0.08-0.09 |
| A23 | 0.07-0.08 |
| A24 | 0.06-0.07 |
| A25 | 0.05-0.06 |
| A26 | 0.04-0.05 |
| A27 | 0.03-0.04 |
| A28 | 0.02-0.03 |
| A29 | 0.01-0.02 |
| A30 | 0-0.01 |
| A31 | 0.09-0.1 |
| A32 | 0.08-0.09 |
| A33 | 0.07-0.08 |
| A34 | 0.06-0.07 |
| A35 | 0.05-0.06 |
| A36 | 0.04-0.05 |
| A37 | 0.03-0.04 |
| A38 | 0.02-0.03 |
| A39 | 0.01-0.02 |
| A40 | 0-0.01 |
| A41 | 0.09-0.1 |
| A42 | 0.08-0.09 |
| A43 | 0.07-0.08 |
| A44 | 0.06-0.07 |
| A45 | 0.05-0.06 |
| A46 | 0.04-0.05 |
| A47 | 0.03-0.04 |
| A48 | 0.02-0.03 |
| A49 | 0.01-0.02 |
| A50 | 0-0.01 |
| A51 | 0.09-0.1 |
| A52 | 0.08-0.09 |
| A53 | 0.07-0.08 |
| A54 | 0.06-0.07 |
| A55 | 0.05-0.06 |
| A56 | 0.04-0.05 |
| A57 | 0.03-0.04 |
| A58 | 0.02-0.03 |
| A59 | 0.01-0.02 |
| A60 | 0-0.01 |
| A61 | 0.09-0.1 |
| A62 | 0.08-0.09 |
| A63 | 0.07-0.08 |
| A64 | 0.06-0.07 |
| A65 | 0.05-0.06 |
| A66 | 0.04-0.05 |
| A67 | 0.03-0.04 |
| A68 | 0.02-0.03 |
| A69 | 0.01-0.02 |
| A70 | 0-0.01 |
| A71 | 0.09-0.1 |
| A72 | 0.08-0.09 |
| A73 | 0.07-0.08 |
| A74 | 0.06-0.07 |
| A75 | 0.05-0.06 |
| A76 | 0.04-0.05 |
| A77 | 0.03-0.04 |
| A78 | 0.02-0.03 |
| A79 | 0.01-0.02 |
| A80 | 0-0.01 |
| A81 | 0.09-0.1 |
| A82 | 0.08-0.09 |
| A83 | 0.07-0.08 |
| A84 | 0.06-0.07 |
| A85 | 0.05-0.06 |
| A86 | 0.04-0.05 |
| A87 | 0.03-0.04 |
| A88 | 0.02-0.03 |
| A89 | 0.01-0.02 |
| A90 | 0-0.01 |
| A91 | 0.09-0.1 |
| A92 | 0.08-0.09 |
| A93 | 0.07-0.08 |
| A94 | 0.06-0.07 |
| A95 | 0.05-0.06 |
| A96 | 0.04-0.05 |
| A97 | 0.03-0.04 |
| A98 | 0.02-0.03 |
| A99 | 0.01-0.02 |
| A100 | 0-0.01 |
| B11 | 0.09-0.1 |
| B12 | 0.08-0.09 |
| B13 | 0.07-0.08 |
| B14 | 0.06-0.07 |
| B15 | 0.05-0.06 |
| B16 | 0.04-0.05 |
| B17 | 0.03-0.04 |
| B18 | 0.02-0.03 |
| B19 | 0.01-0.02 |
| B20 | 0-0.01 |

FIGS. 10 to 19 illustrate that θ of the Euler angles and the normalized thickness h/λ of the IDT electrodes may be selected from ranges shown in Tables 23 to 32 depending on the normalized thickness H/λ of $SiO_2$ films such that the propagation loss α can be reduced to about 0.06 dB/λ or less.

FIGS. 20 to 28 are graphs showing how the electromechanical coupling coefficient $K^2$ varies depending on θ of Euler angles (0°, θ, 0°) and the normalized thickness h/λ of IDT electrodes when the normalized thickness H/λ (%) of $SiO_2$ films is about 20%, about 30%, about 40%, about 50%, about 60%, about 70%, about 80%, about 90%, or about 100%. Regions B21 to B100 and C11 to C30 shown in FIGS. 20 to 28 each indicate the range of the electromechanical coupling coefficient $K^2$ shown in Table 22 below. For example, Region B21 in Table 22 corresponds to Region B21 in FIG. 20 and indicates that the electromechanical coupling coefficient $K^2$ ranges from about 0.09 to about 0.1.

FIGS. 20 to 28 illustrate that θ of the Euler angles that are necessary to obtain an electromechanical coupling coefficient $K^2$ of about 2% or greater and the normalized thickness h/λ of the IDT electrodes may be selected depending on the normalized thickness H/λ of the $SiO_2$ films.

TABLE 22

| Electromechanical coupling coefficient $K^2$ | |
|---|---|
| B21 | 0.09-0.1 |
| B22 | 0.08-0.09 |
| B23 | 0.07-0.08 |
| B24 | 0.06-0.07 |
| B25 | 0.05-0.06 |
| B26 | 0.04-0.05 |
| B27 | 0.03-0.04 |
| B28 | 0.02-0.03 |
| B29 | 0.01-0.02 |
| B30 | 0-0.01 |
| B31 | 0.09-0.1 |
| B32 | 0.08-0.09 |
| B33 | 0.07-0.08 |
| B34 | 0.06-0.07 |
| B35 | 0.05-0.06 |
| B36 | 0.04-0.05 |
| B37 | 0.03-0.04 |
| B38 | 0.02-0.03 |
| B39 | 0.01-0.02 |
| B40 | 0-0.01 |
| B41 | 0.09-0.1 |
| B42 | 0.08-0.09 |
| B43 | 0.07-0.08 |
| B44 | 0.06-0.07 |
| B45 | 0.05-0.06 |
| B46 | 0.04-0.05 |
| B47 | 0.03-0.04 |
| B48 | 0.02-0.03 |
| B49 | 0.01-0.02 |
| B50 | 0-0.01 |
| B51 | 0.09-0.1 |
| B52 | 0.08-0.09 |
| B53 | 0.07-0.08 |
| B54 | 0.06-0.07 |
| B55 | 0.05-0.06 |
| B56 | 0.04-0.05 |
| B57 | 0.03-0.04 |
| B58 | 0.02-0.03 |
| B59 | 0.01-0.02 |
| B60 | 0-0.01 |
| B61 | 0.09-0.1 |
| B62 | 0.08-0.09 |
| B63 | 0.07-0.08 |
| B64 | 0.06-0.07 |
| B65 | 0.05-0.06 |
| B66 | 0.04-0.05 |
| B67 | 0.03-0.04 |
| B68 | 0.02-0.03 |
| B69 | 0.01-0.02 |
| B70 | 0-0.01 |
| B71 | 0.09-0.1 |
| B72 | 0.08-0.09 |
| B73 | 0.07-0.08 |
| B74 | 0.06-0.07 |
| B75 | 0.05-0.06 |
| B76 | 0.04-0.05 |
| B77 | 0.03-0.04 |
| B78 | 0.02-0.03 |
| B79 | 0.01-0.02 |
| B80 | 0-0.01 |
| B81 | 0.09-0.1 |
| B82 | 0.08-0.09 |
| B83 | 0.07-0.08 |
| B84 | 0.06-0.07 |
| B85 | 0.05-0.06 |

TABLE 22-continued

| Electromechanical coupling coefficient $K^2$ | |
|---|---|
| B86 | 0.04-0.05 |
| B87 | 0.03-0.04 |
| B88 | 0.02-0.03 |
| B89 | 0.01-0.02 |
| B90 | 0-0.01 |
| B91 | 0.09-0.1 |
| B92 | 0.08-0.09 |
| B93 | 0.07-0.08 |
| B94 | 0.06-0.07 |
| B95 | 0.05-0.06 |
| B96 | 0.04-0.05 |
| B97 | 0.03-0.04 |
| B98 | 0.02-0.03 |
| B99 | 0.01-0.02 |
| B100 | 0-0.01 |
| C11 | 0.09-0.1 |
| C12 | 0.08-0.09 |
| C13 | 0.07-0.08 |
| C14 | 0.06-0.07 |
| C15 | 0.05-0.06 |
| C16 | 0.04-0.05 |
| C17 | 0.03-0.04 |
| C18 | 0.02-0.03 |
| C19 | 0.01-0.02 |
| C20 | 0-0.01 |

The variation of the electromechanical coupling coefficient $K^2$ was determined such that the Euler angles of $LiTaO_3$ were set to (0°, 132°, ψ) and ψ of the Euler angles and the normalized thickness h/λ of IDT electrodes were varied.

Figure 29:
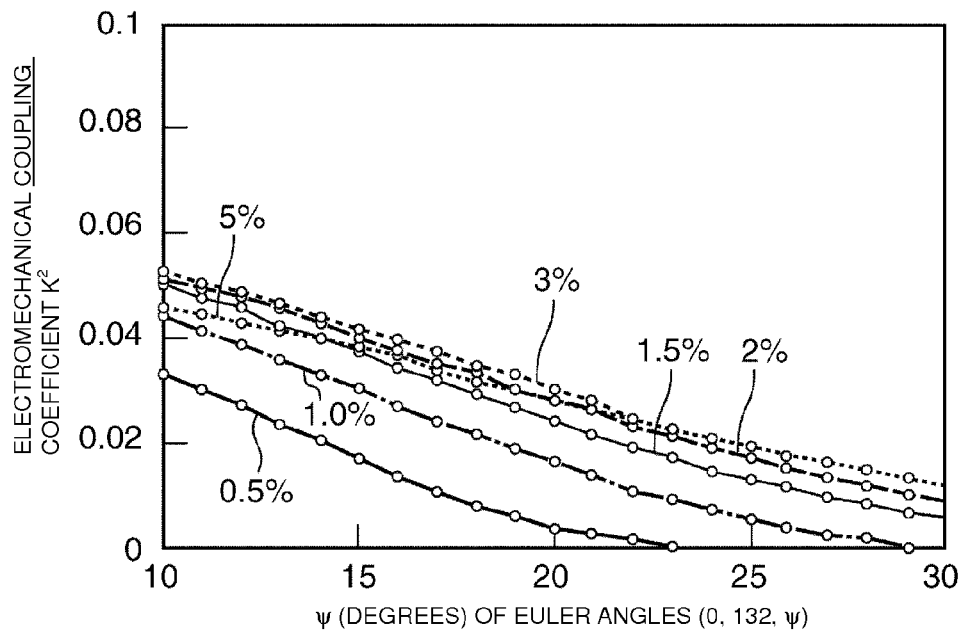
FIG. 29 is a graph showing the relationship between the electromechanical coefficient $K^2$ of boundary acoustic wave devices including IDT electrodes which are disposed on $LiTaO_3$ with Euler angles (0°, 132°, ψ°) and which are made of Au, ψ, and the normalized thickness (%) of the IDT electrodes.

FIG. 29 is a graph showing the relationship between ψ of the Euler angles, the electromechanical coupling coefficient $K^2$, and the normalized thickness (h/λ) (%) of the IDT electrodes. FIG. 29 illustrates that in order to adjust the electromechanical coupling coefficient $K^2$ to about 2% or greater, ψ thereof and the normalized thickness h/λ of the IDT electrodes may be set within a range where $K^2$ is about 0.02 or greater.

FIG. 30 is a graph showing one of a plurality of curves shown in FIG. 29 and which represents that the normalized thickness of IDT electrodes is about 3.0%. FIG. 29 shows results obtained from IDT electrodes having a normalized thickness of about 0.5% to about 5.0%. However, the results shown in FIG. 29 are not readily apparent. Therefore, the curve representing that the normalized thickness of IDT electrodes is about 3.0% has been selected and shown in FIG. 30.

FIG. 30 illustrates that $K^2$ can be adjusted to about 0.02 or greater when ψ of the Euler angles is within the range of about 0°±25°.

From the results shown in FIGS. 10 to 19, the propagation loss α can be adjusted to about 0.06 or less by selecting θ of the Euler angles and the normalized thickness h/λ of IDT electrodes as shown in Table 23 when the normalized thickness H/λ of $SiO_2$ is about 0.05 to less than about 0.15.

TABLE 23

| For [0.05 ≤ H/λ < 0.15] | |
|---|---|
| When 0 ≤ θ < 75.5 | h/λ is 0.005 to 0.05. |
| When 75.5 ≤ θ < 76.5 | h/λ is 0.005 to 0.014 or 0.021 to 0.05. |
| When 76.5 ≤ θ < 77.5 | h/λ is 0.005 to 0.014 or 0.022 to 0.05. |
| When 77.5 ≤ θ < 78.5 | h/λ is 0.005 to 0.0135 or 0.023 to 0.05. |
| When 78.5 ≤ θ < 79.5 | h/λ is 0.005 to 0.013 or 0.024 to 0.05. |
| When 79.5 ≤ θ < 80.5 | h/λ is 0.005 to 0.013 or 0.025 to 0.05. |
| When 80.5 ≤ θ < 81.5 | h/λ is 0.005 to 0.013 or 0.0255 to 0.05. |
| When 81.5 ≤ θ < 82.5 | h/λ is 0.005 to 0.013 or 0.026 to 0.05. |
| When 82.5 ≤ θ < 83.5 | h/λ is 0.005 to 0.013 or 0.0265 to 0.05. |
| When 83.5 ≤ θ < 84.5 | h/λ is 0.005 to 0.013 or 0.027 to 0.05. |

TABLE 23-continued

For [0.05 ≤ H/λ < 0.15]

| | |
|---|---|
| When 84.5 ≤ θ < 85.5 | h/λ is 0.005 to 0.013 or 0.0275 to 0.05. |
| When 85.5 ≤ θ < 86.5 | h/λ is 0.005 to 0.013 or 0.028 to 0.05. |
| When 86.5 ≤ θ < 87.5 | h/λ is 0.005 to 0.013 or 0.0285 to 0.05. |
| When 87.5 ≤ θ < 88.5 | h/λ is 0.005 to 0.0135 or 0.029 to 0.05. |
| When 88.5 ≤ θ < 90.5 | h/λ is 0.005 to 0.0135 or 0.0295 to 0.05. |
| When 90.5 ≤ θ < 91.5 | h/λ is 0.005 to 0.014 or 0.03 to 0.05. |
| When 91.5 ≤ θ < 92.5 | h/λ is 0.005 to 0.014 or 0.0305 to 0.05. |
| When 92.5 ≤ θ < 93.5 | h/λ is 0.005 to 0.0145 or 0.0305 to 0.05. |
| When 93.5 ≤ θ < 94.5 | h/λ is 0.005 to 0.0145 or 0.031 to 0.05. |
| When 94.5 ≤ θ < 95.5 | h/λ is 0.005 to 0.015 or 0.031 to 0.05. |
| When 95.5 ≤ θ < 96.5 | h/λ is 0.005 to 0.0155 or 0.0315 to 0.05. |
| When 96.5 ≤ θ < 97.5 | h/λ is 0.005 to 0.016 or 0.0315 to 0.05. |
| When 97.5 ≤ θ < 98.5 | h/λ is 0.005 to 0.0165 or 0.032 to 0.05. |
| When 98.5 ≤ θ < 99.5 | h/λ is 0.005 to 0.017 or 0.032 to 0.05. |
| When 99.5 ≤ θ < 100.5 | h/λ is 0.005 to 0.0175 or 0.032 to 0.05. |
| When 100.5 ≤ θ < 101.5 | h/λ is 0.005 to 0.018 or 0.0325 to 0.05. |
| When 101.5 ≤ θ < 102.5 | h/λ is 0.005 to 0.0185 or 0.0325 to 0.05. |
| When 102.5 ≤ θ < 103.5 | h/λ is 0.005 to 0.019 or 0.0325 to 0.05. |
| When 103.5 ≤ θ < 104.5 | h/λ is 0.005 to 0.0195 or 0.0325 to 0.05. |
| When 104.5 ≤ θ < 105.5 | h/λ is 0.005 to 0.0205 or 0.033 to 0.05. |
| When 105.5 ≤ θ < 106.5 | h/λ is 0.005 to 0.0215 or 0.033 to 0.05. |
| When 106.5 ≤ θ < 107.5 | h/λ is 0.005 to 0.0225 or 0.033 to 0.05. |
| When 107.5 ≤ θ < 108.5 | h/λ is 0.005 to 0.0235 or 0.033 to 0.05. |
| When 108.5 ≤ θ < 109.5 | h/λ is 0.005 to 0.024 or 0.0325 to 0.05. |
| When 109.5 ≤ θ < 110.5 | h/λ is 0.005 to 0.026 or 0.0325 to 0.05. |
| When 110.5 ≤ θ < 111.5 | h/λ is 0.005 to 0.028 or 0.032 to 0.05. |
| When 111.5 ≤ θ < 112.5 | h/λ is 0.005 to 0.0295 or 0.0305 to 0.05. |
| When 112.5 ≤ θ < 180 | h/λ is 0.005 to 0.05. |

Likewise, the propagation loss α can be adjusted to about 0.06 or less by selecting θ of the Euler angles and the normalized thickness h/λ of IDT electrodes as shown in Tables 24 to 32 when the normalized thickness H/λ of SiO$_2$ films is about 0.15 to less than about 0.25, about 0.25 to less than about 0.35, about 0.35 to less than about 0.45, about 0.45 to less than about 0.55, about 0.55 to less than about 0.65, about 0.65 to less than about 0.75, about 0.75 to less than about 0.85, about 0.85 to less than about 0.95, or about 0.95 to less than about 1.00.

TABLE 24

For [0.15 ≤ H/λ < 0.25]

| | |
|---|---|
| When 0 ≤ θ < 1.5 | h/λ is 0.024 to 0.05. |
| When 1.5 ≤ θ < 3.5 | h/λ is 0.0235 to 0.05. |
| When 3.5 ≤ θ < 4.5 | h/λ is 0.023 to 0.05. |
| When 4.5 ≤ θ < 5.5 | h/λ is 0.0225 to 0.05. |
| When 5.5 ≤ θ < 6.5 | h/λ is 0.022 to 0.05. |
| When 6.5 ≤ θ < 7.5 | h/λ is 0.0215 to 0.05. |
| When 7.5 ≤ θ < 8.5 | h/λ is 0.021 to 0.05. |
| When 8.5 ≤ θ < 9.5 | h/λ is 0.02 to 0.05. |
| When 9.5 ≤ θ < 10.5 | h/λ is 0.0195 to 0.05. |
| When 10.5 ≤ θ < 11.5 | h/λ is 0.0185 to 0.05. |
| When 11.5 ≤ θ < 12.5 | h/λ is 0.0175 to 0.05. |
| When 12.5 ≤ θ < 13.5 | h/λ is 0.0165 to 0.05. |
| When 13.5 ≤ θ < 14.5 | h/λ is 0.015 to 0.05. |
| When 14.5 ≤ θ < 15.5 | h/λ is 0.013 to 0.05. |
| When 15.5 ≤ θ < 16.5 | h/λ is 0.011 to 0.05. |
| When 16.5 ≤ θ < 54.5 | h/λ is 0.005 to 0.05. |
| When 54.5 ≤ θ < 55.5 | h/λ is 0.0125 to 0.05. |
| When 55.5 ≤ θ < 56.5 | h/λ is 0.0155 to 0.05. |
| When 56.5 ≤ θ < 57.5 | h/λ is 0.017 to 0.05. |
| When 57.5 ≤ θ < 58.5 | h/λ is 0.0185 to 0.05. |
| When 58.5 ≤ θ < 59.5 | h/λ is 0.0195 to 0.05. |
| When 59.5 ≤ θ < 60.5 | h/λ is 0.0205 to 0.05. |
| When 60.5 ≤ θ < 61.5 | h/λ is 0.0215 to 0.05. |
| When 61.5 ≤ θ < 62.5 | h/λ is 0.0225 to 0.05. |
| When 62.5 ≤ θ < 63.5 | h/λ is 0.023 to 0.05. |
| When 63.5 ≤ θ < 64.5 | h/λ is 0.0235 to 0.05. |
| When 64.5 ≤ θ < 65.5 | h/λ is 0.0245 to 0.05. |
| When 65.5 ≤ θ < 66.5 | h/λ is 0.025 to 0.05. |
| When 66.5 ≤ θ < 67.5 | h/λ is 0.0255 to 0.05. |
| When 67.5 ≤ θ < 68.5 | h/λ is 0.026 to 0.05. |

TABLE 24-continued

For [0.15 ≤ H/λ < 0.25]

| | |
|---|---|
| When 68.5 ≤ θ < 69.5 | h/λ is 0.0265 to 0.05. |
| When 69.5 ≤ θ < 70.5 | h/λ is 0.027 to 0.05. |
| When 70.5 ≤ θ < 72.5 | h/λ is 0.0275 to 0.05. |
| When 72.5 ≤ θ < 73.5 | h/λ is 0.028 to 0.05. |
| When 73.5 ≤ θ < 74.5 | h/λ is 0.0285 to 0.05. |
| When 74.5 ≤ θ < 76.5 | h/λ is 0.029 to 0.05. |
| When 76.5 ≤ θ < 78.5 | h/λ is 0.0295 to 0.05. |
| When 78.5 ≤ θ < 79.5 | h/λ is 0.03 to 0.05. |
| When 79.5 ≤ θ < 81.5 | h/λ is 0.0305 to 0.05. |
| When 81.5 ≤ θ < 83.5 | h/λ is 0.031 to 0.05. |
| When 83.5 ≤ θ < 86.5 | h/λ is 0.0315 to 0.05. |
| When 86.5 ≤ θ < 88.5 | h/λ is 0.032 to 0.05. |
| When 88.5 ≤ θ < 92.5 | h/λ is 0.0325 to 0.05. |
| When 92.5 ≤ θ < 97.5 | h/λ is 0.033 to 0.05. |
| When 97.5 ≤ θ < 98.5 | h/λ is 0.005 or 0.0335 to 0.05. |
| When 98.5 ≤ θ < 99.5 | h/λ is 0.005 to 0.006 or 0.0335 to 0.05. |
| When 99.5 ≤ θ < 100.5 | h/λ is 0.005 to 0.0065 or 0.0335 to 0.05. |
| When 100.5 ≤ θ < 101.5 | h/λ is 0.005 to 0.007 or 0.0335 to 0.05. |
| When 101.5 ≤ θ < 102.5 | h/λ is 0.005 to 0.0075 or 0.0335 to 0.05. |
| When 102.5 ≤ θ < 103.5 | h/λ is 0.005 to 0.0085 or 0.0335 to 0.05. |
| When 103.5 ≤ θ < 104.5 | h/λ is 0.005 to 0.009 or 0.0335 to 0.05. |
| When 104.5 ≤ θ < 105.5 | h/λ is 0.005 to 0.01 or 0.0335 to 0.05. |
| When 105.5 ≤ θ < 106.5 | h/λ is 0.005 to 0.011 or 0.0335 to 0.05. |
| When 106.5 ≤ θ < 107.5 | h/λ is 0.005 to 0.012 or 0.0335 to 0.05. |
| When 107.5 ≤ θ < 108.5 | h/λ is 0.005 to 0.0125 or 0.0335 to 0.05. |
| When 108.5 ≤ θ < 109.5 | h/λ is 0.005 to 0.0135 or 0.033 to 0.05. |
| When 109.5 ≤ θ < 110.5 | h/λ is 0.005 to 0.0145 or 0.033 to 0.05. |
| When 110.5 ≤ θ < 111.5 | h/λ is 0.005 to 0.016 or 0.0325 to 0.05. |
| When 111.5 ≤ θ < 112.5 | h/λ is 0.005 to 0.0175 or 0.0325 to 0.05. |
| When 112.5 ≤ θ < 113.5 | h/λ is 0.005 to 0.019 or 0.032 to 0.05. |
| When 113.5 ≤ θ < 114.5 | h/λ is 0.005 to 0.0215 or 0.031 to 0.05. |
| When 114.5 ≤ θ < 115.5 | h/λ is 0.005 to 0.024 or 0.028 to 0.05. |
| When 115.5 ≤ θ < 155.5 | h/λ is 0.005 to 0.05. |
| When 155.5 ≤ θ < 156.5 | h/λ is 0.0105 to 0.05. |
| When 156.5 ≤ θ < 157.5 | h/λ is 0.0125 to 0.05. |
| When 157.5 ≤ θ < 158.5 | h/λ is 0.015 to 0.05. |
| When 158.5 ≤ θ < 159.5 | h/λ is 0.016 to 0.05. |
| When 159.5 ≤ θ < 160.5 | h/λ is 0.0175 to 0.05. |
| When 160.5 ≤ θ < 161.5 | h/λ is 0.0185 to 0.05. |
| When 161.5 ≤ θ < 162.5 | h/λ is 0.0195 to 0.05. |
| When 162.5 ≤ θ < 163.5 | h/λ is 0.0205 to 0.05. |
| When 163.5 ≤ θ < 164.5 | h/λ is 0.021 to 0.05. |
| When 164.5 ≤ θ < 165.5 | h/λ is 0.0215 to 0.05. |
| When 165.5 ≤ θ < 166.5 | h/λ is 0.022 to 0.05. |
| When 166.5 ≤ θ < 167.5 | h/λ is 0.0225 to 0.05. |
| When 167.5 ≤ θ < 168.5 | h/λ is 0.023 to 0.05. |
| When 168.5 ≤ θ < 169.5 | h/λ is 0.0235 to 0.05. |
| When 169.5 ≤ θ < 171.5 | h/λ is 0.024 to 0.05. |
| When 171.5 ≤ θ < 179.5 | h/λ is 0.0245 to 0.05. |
| When 179.5 ≤ θ < 180 | h/λ is 0.024 to 0.05. |

TABLE 25

For [0.25 ≤ H/λ < 0.35]

| | |
|---|---|
| When 0 ≤ θ < 0.5 | h/λ is 0.0245 to 0.05. |
| When 0.5 ≤ θ < 3.5 | h/λ is 0.024 to 0.05. |
| When 3.5 ≤ θ < 4.5 | h/λ is 0.0235 to 0.05. |
| When 4.5 ≤ θ < 6.5 | h/λ is 0.023 to 0.05. |
| When 6.5 ≤ θ < 7.5 | h/λ is 0.0225 to 0.05. |
| When 7.5 ≤ θ < 8.5 | h/λ is 0.022 to 0.05. |
| When 8.5 ≤ θ < 9.5 | h/λ is 0.0215 to 0.05. |
| When 9.5 ≤ θ < 10.5 | h/λ is 0.021 to 0.05. |
| When 10.5 ≤ θ < 11.5 | h/λ is 0.0205 to 0.05. |
| When 11.5 ≤ θ < 12.5 | h/λ is 0.0195 to 0.05. |
| When 12.5 ≤ θ < 13.5 | h/λ is 0.019 to 0.05. |
| When 13.5 ≤ θ < 14.5 | h/λ is 0.018 to 0.05. |
| When 14.5 ≤ θ < 15.5 | h/λ is 0.017 to 0.05. |
| When 15.5 ≤ θ < 16.5 | h/λ is 0.016 to 0.05. |
| When 16.5 ≤ θ < 17.5 | h/λ is 0.015 to 0.05. |
| When 17.5 ≤ θ < 18.5 | h/λ is 0.0135 to 0.05. |
| When 18.5 ≤ θ < 19.5 | h/λ is 0.0115 to 0.05. |
| When 19.5 ≤ θ < 20.5 | h/λ is 0.0095 to 0.05. |
| When 20.5 ≤ θ < 21.5 | h/λ is 0.006 to 0.05. |
| When 21.5 ≤ θ < 50.5 | h/λ is 0.005 to 0.05. |

TABLE 25-continued

For [0.25 ≤ H/λ < 0.35]

| | |
|---|---|
| When 50.5 ≤ θ < 51.5 | h/λ is 0.008 to 0.05. |
| When 51.5 ≤ θ < 52.5 | h/λ is 0.0125 to 0.05. |
| When 52.5 ≤ θ < 53.5 | h/λ is 0.015 to 0.05. |
| When 53.5 ≤ θ < 54.5 | h/λ is 0.017 to 0.05. |
| When 54.5 ≤ θ < 55.5 | h/λ is 0.018 to 0.05. |
| When 55.5 ≤ θ < 56.5 | h/λ is 0.019 to 0.05. |
| When 56.5 ≤ θ < 57.5 | h/λ is 0.02 to 0.05. |
| When 57.5 ≤ θ < 58.5 | h/λ is 0.021 to 0.05. |
| When 58.5 ≤ θ < 59.5 | h/λ is 0.022 to 0.05. |
| When 59.5 ≤ θ < 60.5 | h/λ is 0.0225 to 0.05. |
| When 60.5 ≤ θ < 61.5 | h/λ is 0.023 to 0.05. |
| When 61.5 ≤ θ < 62.5 | h/λ is 0.0235 to 0.05. |
| When 62.5 ≤ θ < 63.5 | h/λ is 0.024 to 0.05. |
| When 63.5 ≤ θ < 64.5 | h/λ is 0.0245 to 0.05. |
| When 64.5 ≤ θ < 65.5 | h/λ is 0.025 to 0.05. |
| When 65.5 ≤ θ < 66.5 | h/λ is 0.0255 to 0.05. |
| When 66.5 ≤ θ < 67.5 | h/λ is 0.026 to 0.05. |
| When 67.5 ≤ θ < 68.5 | h/λ is 0.0265 to 0.05. |
| When 68.5 ≤ θ < 70.5 | h/λ is 0.027 to 0.05. |
| When 70.5 ≤ θ < 71.5 | h/λ is 0.0275 to 0.05. |
| When 71.5 ≤ θ < 73.5 | h/λ is 0.028 to 0.05. |
| When 73.5 ≤ θ < 75.5 | h/λ is 0.0285 to 0.05. |
| When 75.5 ≤ θ < 77.5 | h/λ is 0.029 to 0.05. |
| When 77.5 ≤ θ < 79.5 | h/λ is 0.0295 to 0.05. |
| When 79.5 ≤ θ < 82.5 | h/λ is 0.3 to 0.05. |
| When 82.5 ≤ θ < 85.5 | h/λ is 0.305 to 0.05 |
| When 85.5 ≤ θ < 89.5 | h/λ is 0.031 to 0.05. |
| When 89.5 ≤ θ < 102.5 | h/λ is 0.0351 to 0.05. |
| When 102.5 ≤ θ < 103.5 | h/λ is 0.005 or 0.0315 to 0.05. |
| When 103.5 ≤ θ < 104.5 | h/λ is 0.005 to 0.006 or 0.0315 to 0.05. |
| When 104.5 ≤ θ < 105.5 | h/λ is 0.005 to 0.007 or 0.0315 to 0.05. |
| When 105.5 ≤ θ < 106.5 | h/λ is 0.005 to 0.008 or 0.031 to 0.05. |
| When 106.5 ≤ θ < 107.5 | h/λ is 0.005 to 0.009 or 0.031 to 0.05. |
| When 107.5 ≤ θ < 108.5 | h/λ is 0.005 to 0.01 or 0.0305 to 0.05. |
| When 108.5 ≤ θ < 109.5 | h/λ is 0.005 to 0.0115 or 0.0305 to 0.05. |
| When 109.5 ≤ θ < 110.5 | h/λ is 0.005 to 0.0125 or 0.03 to 0.05. |
| When 110.5 ≤ θ < 111.5 | h/λ is 0.005 to 0.014 or 0.029 to 0.05. |
| When 111.5 ≤ θ < 112.5 | h/λ is 0.005 to 0.016 or 0.028 to 0.05. |
| When 112.5 ≤ θ < 113.5 | h/λ is 0.005 to 0.0185 or 0.0265 to 0.05. |
| When 113.5 ≤ θ < 152.5 | h/λ is 0.005 to 0.05. |
| When 152.5 ≤ θ < 153.5 | h/λ is 0.008 to 0.05. |
| When 153.5 ≤ θ < 154.5 | h/λ is 0.0105 to 0.05. |
| When 154.5 ≤ θ < 155.5 | h/λ is 0.012 to 0.05. |
| When 155.5 ≤ θ < 156.5 | h/λ is 0.035 to 0.05. |
| When 156.5 ≤ θ < 157.5 | h/λ is 0.015 to 0.05. |
| When 157.5 ≤ θ < 158.5 | h/λ is 0.0165 to 0.05. |
| When 158.5 ≤ θ < 159.5 | h/λ is 0.0175 to 0.05. |
| When 159.5 ≤ θ < 160.5 | h/λ is 0.018 to 0.05. |
| When 160.5 ≤ θ < 161.5 | h/λ is 0.019 to 0.05. |
| When 161.5 ≤ θ < 162.5 | h/λ is 0.02 to 0.05. |
| When 162.5 ≤ θ < 163.5 | h/λ is 0.0205 to 0.05. |
| When 163.5 ≤ θ < 164.5 | h/λ is 0.021 to 0.05. |
| When 164.5 ≤ θ < 165.5 | h/λ is 0.022 to 0.05. |
| When 165.5 ≤ θ < 166.5 | h/λ is 0.0225 to 0.05. |
| When 166.5 ≤ θ < 168.5 | h/λ is 0.023 to 0.05. |
| When 168.5 ≤ θ < 169.5 | h/λ is 0.0235 to 0.05. |
| When 169.5 ≤ θ < 171.5 | h/λ is 0.024 to 0.05. |
| When 171.5 ≤ θ < 180 | h/λ is 0.0245 to 0.05. |

TABLE 26

For [0.35 ≤ H/λ < 0.45]

| | |
|---|---|
| When 0 ≤ θ < 2.5 | h/λ is 0.0235 to 0.05. |
| When 2.5 ≤ θ < 4.5 | h/λ is 0.023 to 0.05. |
| When 4.5 ≤ θ < 5.5 | h/λ is 0.0225 to 0.05. |
| When 5.5 ≤ θ < 7.5 | h/λ is 0.022 to 0.05. |
| When 7.5 ≤ θ < 8.5 | h/λ is 0.0215 to 0.05. |
| When 8.5 ≤ θ < 9.5 | h/λ is 0.021 to 0.05. |
| When 9.5 ≤ θ < 10.5 | h/λ is 0.0205 to 0.05. |
| When 10.5 ≤ θ < 11.5 | h/λ is 0.02 to 0.05. |
| When 11.5 ≤ θ < 12.5 | h/λ is 0.0195 to 0.05. |
| When 12.5 ≤ θ < 13.5 | h/λ is 0.0185 to 0.05. |
| When 13.5 ≤ θ < 14.5 | h/λ is 0.018 to 0.05. |
| When 14.5 ≤ θ < 15.5 | h/λ is 0.017 to 0.05. |

TABLE 26-continued

For [0.35 ≤ H/λ < 0.45]

| | |
|---|---|
| When 15.5 ≤ θ < 16.5 | h/λ is 0.016 to 0.05. |
| When 16.5 ≤ θ < 17.5 | h/λ is 0.015 to 0.05. |
| When 17.5 ≤ θ < 18.5 | h/λ is 0.0135 to 0.05. |
| When 18.5 ≤ θ < 19.5 | h/λ is 0.0125 to 0.05. |
| When 19.5 ≤ θ < 20.5 | h/λ is 0.0105 to 0.05. |
| When 20.5 ≤ θ < 21.5 | h/λ is 0.008 to 0.05. |
| When 21.5 ≤ θ < 22.5 | h/λ is 0.0055 to 0.05. |
| When 22.5 ≤ θ < 49.5 | h/λ is 0.005 to 0.05. |
| When 49.5 ≤ θ < 50.5 | h/λ is 0.0055 to 0.05. |
| When 50.5 ≤ θ < 51.5 | h/λ is 0.011 to 0.05. |
| When 51.5 ≤ θ < 52.5 | h/λ is 0.0135 to 0.05. |
| When 52.5 ≤ θ < 53.5 | h/λ is 0.0155 to 0.05. |
| When 53.5 ≤ θ < 54.5 | h/λ is 0.017 to 0.05. |
| When 54.5 ≤ θ < 55.5 | h/λ is 0.018 to 0.05. |
| When 55.5 ≤ θ < 56.5 | h/λ is 0.019 to 0.05. |
| When 56.5 ≤ θ < 57.5 | h/λ is 0.02 to 0.05. |
| When 57.5 ≤ θ < 58.5 | h/λ is 0.0205 to 0.05. |
| When 58.5 ≤ θ < 59.5 | h/λ is 0.0215 to 0.05. |
| When 59.5 ≤ θ < 60.5 | h/λ is 0.022 to 0.05. |
| When 60.5 ≤ θ < 61.5 | h/λ is 0.0225 to 0.05. |
| When 61.5 ≤ θ < 62.5 | h/λ is 0.023 to 0.05. |
| When 62.5 ≤ θ < 63.5 | h/λ is 0.0235 to 0.05. |
| When 63.5 ≤ θ < 64.5 | h/λ is 0.024 to 0.05. |
| When 64.5 ≤ θ < 65.5 | h/λ is 0.0245 to 0.05. |
| When 65.5 ≤ θ < 67.5 | h/λ is 0.025 to 0.05. |
| When 67.5 ≤ θ < 68.5 | h/λ is 0.0255 to 0.05. |
| When 68.5 ≤ θ < 69.5 | h/λ is 0.026 to 0.05. |
| When 69.5 ≤ θ < 71.5 | h/λ is 0.0265 to 0.05. |
| When 71.5 ≤ θ < 72.5 | h/λ is 0.027 to 0.05. |
| When 72.5 ≤ θ < 74.5 | h/λ is 0.0275 to 0.05. |
| When 74.5 ≤ θ < 76.5 | h/λ is 0.028 to 0.05. |
| When 76.5 ≤ θ < 79.5 | h/λ is 0.0285 to 0.05. |
| When 79.5 ≤ θ < 82.5 | h/λ is 0.029 to 0.05. |
| When 82.5 ≤ θ < 86.5 | h/λ is 0.0295 to 0.05. |
| When 86.5 ≤ θ < 101.5 | h/λ is 0.03 to 0.05. |
| When 101.5 ≤ θ < 103.5 | h/λ is 0.0295 to 0.05. |
| When 103.5 ≤ θ < 104.5 | h/λ is 0.005 or 0.0295 to 0.05. |
| When 104.5 ≤ θ < 105.5 | h/λ is 0.005 to 0.006 or 0.029 to 0.05. |
| When 105.5 ≤ θ < 106.5 | h/λ is 0.005 to 0.007 or 0.0285 to 0.05. |
| When 106.5 ≤ θ < 107.5 | h/λ is 0.005 to 0.0085 or 0.0285 to 0.05. |
| When 107.5 ≤ θ < 108.5 | h/λ is 0.005 to 0.0095 or 0.028 to 0.05. |
| When 108.5 ≤ θ < 109.5 | h/λ is 0.005 to 0.011 or 0.027 to 0.05. |
| When 109.5 ≤ θ < 110.5 | h/λ is 0.005 to 0.013 or 0.0265 to 0.05. |
| When 110.5 ≤ θ < 111.5 | h/λ is 0.005 to 0.0145 or 0.0255 to 0.05. |
| When 111.5 ≤ θ < 112.5 | h/λ is 0.005 to 0.019 or 0.0215 to 0.05. |
| When 112.5 ≤ θ < 151.5 | h/λ is 0.005 to 0.05. |
| When 151.5 ≤ θ < 152.5 | h/λ is 0.0055 to 0.05. |
| When 152.5 ≤ θ < 153.5 | h/λ is 0.0075 to 0.05. |
| When 153.5 ≤ θ < 154.5 | h/λ is 0.01 to 0.05. |
| When 154.5 ≤ θ < 155.5 | h/λ is 0.0115 to 0.05. |
| When 155.5 ≤ θ < 156.5 | h/λ is 0.013 to 0.05. |
| When 156.5 ≤ θ < 157.5 | h/λ is 0.014 to 0.05. |
| When 157.5 ≤ θ < 158.5 | h/λ is 0.0155 to 0.05. |
| When 158.5 ≤ θ < 159.5 | h/λ is 0.0165 to 0.05. |
| When 159.5 ≤ θ < 160.5 | h/λ is 0.017 to 0.05. |
| When 160.5 ≤ θ < 161.5 | h/λ is 0.018 to 0.05. |
| When 161.5 ≤ θ < 162.5 | h/λ is 0.018 to 0.05. |
| When 162.5 ≤ θ < 163.5 | h/λ is 0.0195 to 0.05. |
| When 163.5 ≤ θ < 164.5 | h/λ is 0.02 to 0.05. |
| When 164.5 ≤ θ < 165.5 | h/λ is 0.021 to 0.05. |
| When 165.5 ≤ θ < 166.5 | h/λ is 0.0215 to 0.05. |
| When 166.5 ≤ θ < 168.5 | h/λ is 0.022 to 0.05. |
| When 168.5 ≤ θ < 169.5 | h/λ is 0.0225 to 0.05. |
| When 169.5 ≤ θ < 171.5 | h/λ is 0.023 to 0.05. |
| When 171.5 ≤ θ < 175.5 | h/λ is 0.0235 to 0.05. |
| When 175.5 ≤ θ < 178.5 | h/λ is 0.024 to 0.05. |
| When 178.5 ≤ θ < 180 | h/λ is 0.0235 to 0.05. |

TABLE 27

For [0.45 ≤ H/λ < 0.55]

| | |
|---|---|
| When 0 ≤ θ < 2.5 | h/λ is 0.0225 to 0.045. |
| When 2.5 ≤ θ < 4.5 | h/λ is 0.022 to 0.045. |
| When 4.5 ≤ θ < 6.5 | h/λ is 0.0215 to 0.045. |

TABLE 27-continued

For [0.45 ≤ H/λ < 0.55]

| | |
|---|---|
| When 6.5 ≤ θ < 7.5 | h/λ is 0.021 to 0.045. |
| When 7.5 ≤ θ < 8.5 | h/λ is 0.0205 to 0.045. |
| When 8.5 ≤ θ < 9.5 | h/λ is 0.02 to 0.045. |
| When 9.5 ≤ θ < 10.5 | h/λ is 0.0195 to 0.045. |
| When 10.5 ≤ θ < 11.5 | h/λ is 0.019 to 0.045. |
| When 11.5 ≤ θ < 12.5 | h/λ is 0.0185 to 0.045. |
| When 12.5 ≤ θ < 13.5 | h/λ is 0.018 to 0.045. |
| When 13.5 ≤ θ < 14.5 | h/λ is 0.017 to 0.045. |
| When 14.5 ≤ θ < 15.5 | h/λ is 0.0165 to 0.045. |
| When 15.5 ≤ θ < 16.5 | h/λ is 0.0155 to 0.045. |
| When 16.5 ≤ θ < 17.5 | h/λ is 0.0145 to 0.045. |
| When 17.5 ≤ θ < 18.5 | h/λ is 0.013 to 0.045. |
| When 18.5 ≤ θ < 19.5 | h/λ is 0.0115 to 0.045. |
| When 19.5 ≤ θ < 20.5 | h/λ is 0.01 to 0.045. |
| When 20.5 ≤ θ < 21.5 | h/λ is 0.008 to 0.045. |
| When 21.5 ≤ θ < 50.5 | h/λ is 0.005 to 0.045. |
| When 50.5 ≤ θ < 51.5 | h/λ is 0.0105 to 0.045. |
| When 51.5 ≤ θ < 52.5 | h/λ is 0.013 to 0.045. |
| When 52.5 ≤ θ < 53.5 | h/λ is 0.015 to 0.045. |
| When 53.5 ≤ θ < 54.5 | h/λ is 0.016 to 0.045. |
| When 54.5 ≤ θ < 55.5 | h/λ is 0.0175 to 0.045. |
| When 55.5 ≤ θ < 56.5 | h/λ is 0.0185 to 0.045. |
| When 56.5 ≤ θ < 57.5 | h/λ is 0.019 to 0.045. |
| When 57.5 ≤ θ < 58.5 | h/λ is 0.02 to 0.045. |
| When 58.5 ≤ θ < 59.5 | h/λ is 0.0205 to 0.045. |
| When 59.5 ≤ θ < 60.5 | h/λ is 0.0215 to 0.045. |
| When 60.5 ≤ θ < 61.5 | h/λ is 0.022 to 0.045. |
| When 61.5 ≤ θ < 62.5 | h/λ is 0.0225 to 0.045. |
| When 62.5 ≤ θ < 63.5 | h/λ is 0.023 to 0.045. |
| When 63.5 ≤ θ < 65.5 | h/λ is 0.0235 to 0.045. |
| When 65.5 ≤ θ < 66.5 | h/λ is 0.024 to 0.045. |
| When 66.5 ≤ θ < 67.5 | h/λ is 0.0245 to 0.045. |
| When 67.5 ≤ θ < 69.5 | h/λ is 0.025 to 0.045. |
| When 69.5 ≤ θ < 70.5 | h/λ is 0.0255 to 0.045. |
| When 70.5 ≤ θ < 72.5 | h/λ is 0.026 to 0.045. |
| When 72.5 ≤ θ < 74.5 | h/λ is 0.0265 to 0.045. |
| When 74.5 ≤ θ < 76.5 | h/λ is 0.027 to 0.045. |
| When 76.5 ≤ θ < 79.5 | h/λ is 0.0275 to 0.045. |
| When 79.5 ≤ θ < 82.5 | h/λ is 0.028 to 0.045. |
| When 82.5 ≤ θ < 87.5 | h/λ is 0.0285 to 0.045. |
| When 87.5 ≤ θ < 96.5 | h/λ is 0.029 to 0.045. |
| When 96.5 ≤ θ < 100.5 | h/λ is 0.0285 to 0.045. |
| When 100.5 ≤ θ < 102.5 | h/λ is 0.028 to 0.045. |
| When 102.5 ≤ θ < 103.5 | h/λ is 0.0275 to 0.045. |
| When 103.5 ≤ θ < 153.5 | h/λ is 0.05 to 0.045. |
| When 153.5 ≤ θ < 154.5 | h/λ is 0.075 to 0.045. |
| When 154.5 ≤ θ < 155.5 | h/λ is 0.095 to 0.045. |
| When 155.5 ≤ θ < 156.5 | h/λ is 0.011 to 0.045. |
| When 156.5 ≤ θ < 157.5 | h/λ is 0.0125 to 0.045. |
| When 157.5 ≤ θ < 158.5 | h/λ is 0.0135 to 0.045. |
| When 158.5 ≤ θ < 159.5 | h/λ is 0.0145 to 0.045. |
| When 159.5 ≤ θ < 160.5 | h/λ is 0.016 to 0.045. |
| When 160.5 ≤ θ < 161.5 | h/λ is 0.0165 to 0.045. |
| When 161.5 ≤ θ < 162.5 | h/λ is 0.0175 to 0.045. |
| When 162.5 ≤ θ < 163.5 | h/λ is 0.018 to 0.045. |
| When 163.5 ≤ θ < 164.5 | h/λ is 0.019 to 0.045. |
| When 164.5 ≤ θ < 165.5 | h/λ is 0.0195 to 0.045. |
| When 165.5 ≤ θ < 166.5 | h/λ is 0.02 to 0.045. |
| When 166.5 ≤ θ < 167.5 | h/λ is 0.0205 to 0.045. |
| When 167.5 ≤ θ < 168.5 | h/λ is 0.021 to 0.045. |
| When 168.5 ≤ θ < 170.5 | h/λ is 0.0215 to 0.045. |
| When 170.5 ≤ θ < 172.5 | h/λ is 0.022 to 0.045. |
| When 172.5 ≤ θ < 175.5 | h/λ is 0.0225 to 0.045. |
| When 175.5 ≤ θ < 179.5 | h/λ is 0.023 to 0.045. |
| When 179.5 ≤ θ < 180 | h/λ is 0.0225 to 0.045. |

TABLE 28

For [0.55 ≤ H/λ < 0.65]

| | |
|---|---|
| When 0 ≤ θ < 0.5 | h/λ is 0.022 to 0.045. |
| When 0.5 ≤ θ < 3.5 | h/λ is 0.0215 to 0.045. |
| When 3.5 ≤ θ < 5.5 | h/λ is 0.021 to 0.045. |
| When 5.5 ≤ θ < 6.5 | h/λ is 0.0205 to 0.045. |
| When 6.5 ≤ θ < 7.5 | h/λ is 0.02 to 0.045. |

TABLE 28-continued

For [0.55 ≤ H/λ < 0.65]

| | |
|---|---|
| When 7.5 ≤ θ < 9.5 | h/λ is 0.0195 to 0.045. |
| When 9.5 ≤ θ < 10.5 | h/λ is 0.019 to 0.045. |
| When 10.5 ≤ θ < 11.5 | h/λ is 0.0185 to 0.045. |
| When 11.5 ≤ θ < 12.5 | h/λ is 0.0175 to 0.045. |
| When 12.5 ≤ θ < 13.5 | h/λ is 0.017 to 0.045. |
| When 13.5 ≤ θ < 14.5 | h/λ is 0.0165 to 0.045. |
| When 14.5 ≤ θ < 15.5 | h/λ is 0.0155 to 0.045. |
| When 15.5 ≤ θ < 16.5 | h/λ is 0.0145 to 0.045. |
| When 16.5 ≤ θ < 17.5 | h/λ is 0.0135 to 0.045. |
| When 17.5 ≤ θ < 18.5 | h/λ is 0.012 to 0.045. |
| When 18.5 ≤ θ < 19.5 | h/λ is 0.011 to 0.045. |
| When 19.5 ≤ θ < 20.5 | h/λ is 0.009 to 0.045. |
| When 20.5 ≤ θ < 21.5 | h/λ is 0.0065 to 0.045. |
| When 21.5 ≤ θ < 50.5 | h/λ is 0.005 to 0.045. |
| When 50.5 ≤ θ < 51.5 | h/λ is 0.0085 to 0.045. |
| When 51.5 ≤ θ < 52.5 | h/λ is 0.0115 to 0.045. |
| When 52.5 ≤ θ < 53.5 | h/λ is 0.0135 to 0.045. |
| When 53.5 ≤ θ < 54.5 | h/λ is 0.0155 to 0.045. |
| When 54.5 ≤ θ < 55.5 | h/λ is 0.0165 to 0.045. |
| When 55.5 ≤ θ < 56.5 | h/λ is 0.0175 to 0.045. |
| When 56.5 ≤ θ < 57.5 | h/λ is 0.0185 to 0.045. |
| When 57.5 ≤ θ < 58.5 | h/λ is 0.019 to 0.045. |
| When 58.5 ≤ θ < 59.5 | h/λ is 0.02 to 0.045. |
| When 59.5 ≤ θ < 60.5 | h/λ is 0.0205 to 0.045. |
| When 60.5 ≤ θ < 61.5 | h/λ is 0.021 to 0.045. |
| When 61.5 ≤ θ < 62.5 | h/λ is 0.0215 to 0.045. |
| When 62.5 ≤ θ < 63.5 | h/λ is 0.022 to 0.045. |
| When 63.5 ≤ θ < 64.5 | h/λ is 0.0225 to 0.045. |
| When 64.5 ≤ θ < 65.5 | h/λ is 0.023 to 0.045. |
| When 65.5 ≤ θ < 67.5 | h/λ is 0.0235 to 0.045. |
| When 67.5 ≤ θ < 68.5 | h/λ is 0.024 to 0.045. |
| When 68.5 ≤ θ < 70.5 | h/λ is 0.0245 to 0.045. |
| When 70.5 ≤ θ < 72.5 | h/λ is 0.025 to 0.045. |
| When 72.5 ≤ θ < 73.5 | h/λ is 0.0255 to 0.045. |
| When 73.5 ≤ θ < 75.5 | h/λ is 0.026 to 0.045. |
| When 75.5 ≤ θ < 78.5 | h/λ is 0.0265 to 0.045. |
| When 78.5 ≤ θ < 81.5 | h/λ is 0.027 to 0.045. |
| When 81.5 ≤ θ < 85.5 | h/λ is 0.0275 to 0.045. |
| When 85.5 ≤ θ < 95.5 | h/λ is 0.028 to 0.045. |
| When 95.5 ≤ θ < 98.5 | h/λ is 0.0275 to 0.045. |
| When 98.5 ≤ θ < 101.5 | h/λ is 0.027 to 0.045. |
| When 101.5 ≤ θ < 102.5 | h/λ is 0.0265 to 0.045. |
| When 102.5 ≤ θ < 103.5 | h/λ is 0.026 to 0.045. |
| When 103.5 ≤ θ < 154.5 | h/λ is 0.005 to 0.045. |
| When 154.5 ≤ θ < 155.5 | h/λ is 0.0055 to 0.045. |
| When 155.5 ≤ θ < 156.5 | h/λ is 0.008 to 0.045. |
| When 156.5 ≤ θ < 157.5 | h/λ is 0.01 to 0.045. |
| When 157.5 ≤ θ < 158.5 | h/λ is 0.0115 to 0.045. |
| When 158.5 ≤ θ < 159.5 | h/λ is 0.0125 to 0.045. |
| When 159.5 ≤ θ < 160.5 | h/λ is 0.014 to 0.045. |
| When 160.5 ≤ θ < 161.5 | h/λ is 0.015 to 0.045. |
| When 161.5 ≤ θ < 162.5 | h/λ is 0.016 to 0.045. |
| When 162.5 ≤ θ < 163.5 | h/λ is 0.0165 to 0.045. |
| When 163.5 ≤ θ < 164.5 | h/λ is 0.0175 to 0.045. |
| When 164.5 ≤ θ < 165.5 | h/λ is 0.018 to 0.045. |
| When 165.5 ≤ θ < 166.5 | h/λ is 0.0185 to 0.045. |
| When 166.5 ≤ θ < 168.5 | h/λ is 0.0195 to 0.045. |
| When 168.5 ≤ θ < 169.5 | h/λ is 0.02 to 0.045. |
| When 169.5 ≤ θ < 170.5 | h/λ is 0.0205 to 0.045. |
| When 171.5 ≤ θ < 172.5 | h/λ is 0.021 to 0.045. |
| When 172.5 ≤ θ < 175.5 | h/λ is 0.0215 to 0.045. |
| When 175.5 ≤ θ < 180 | h/λ is 0.022 to 0.045. |

TABLE 29

For [0.65 ≤ H/λ < 0.75]

| | |
|---|---|
| When 0 ≤ θ < 1.5 | h/λ is 0.021 to 0.045. |
| When 1.5 ≤ θ < 4.5 | h/λ is 0.0205 to 0.045. |
| When 4.5 ≤ θ < 5.5 | h/λ is 0.02 to 0.045. |
| When 5.5 ≤ θ < 7.5 | h/λ is 0.0195 to 0.045. |
| When 7.5 ≤ θ < 8.5 | h/λ is 0.019 to 0.045. |
| When 8.5 ≤ θ < 9.5 | h/λ is 0.0185 to 0.045. |
| When 9.5 ≤ θ < 10.5 | h/λ is 0.018 to 0.045. |
| When 10.5 ≤ θ < 11.5 | h/λ is 0.0175 to 0.045. |

TABLE 29-continued

For [0.65 ≤ H/λ < 0.75]

| | |
|---|---|
| When 11.5 ≤ θ < 12.5 | h/λ is 0.017 to 0.045. |
| When 12.5 ≤ θ < 13.5 | h/λ is 0.016 to 0.045. |
| When 13.5 ≤ θ < 14.5 | h/λ is 0.0155 to 0.045. |
| When 14.5 ≤ θ < 15.5 | h/λ is 0.0145 to 0.045. |
| When 15.5 ≤ θ < 16.5 | h/λ is 0.0135 to 0.045. |
| When 16.5 ≤ θ < 17.5 | h/λ is 0.0125 to 0.045. |
| When 17.5 ≤ θ < 18.5 | h/λ is 0.0115 to 0.045. |
| When 18.5 ≤ θ < 19.5 | h/λ is 0.0095 to 0.045. |
| When 19.5 ≤ θ < 20.5 | h/λ is 0.0075 to 0.045. |
| When 20.5 ≤ θ < 21.5 | h/λ is 0.0055 to 0.045. |
| When 21.5 ≤ θ < 50.5 | h/λ is 0.005 to 0.045. |
| When 50.5 ≤ θ < 51.5 | h/λ is 0.0065 to 0.045. |
| When 51.5 ≤ θ < 52.5 | h/λ is 0.0105 to 0.045. |
| When 52.5 ≤ θ < 53.5 | h/λ is 0.0125 to 0.045. |
| When 53.5 ≤ θ < 54.5 | h/λ is 0.014 to 0.045. |
| When 54.5 ≤ θ < 55.5 | h/λ is 0.0155 to 0.045. |
| When 55.5 ≤ θ < 56.5 | h/λ is 0.0165 to 0.045. |
| When 56.5 ≤ θ < 57.5 | h/λ is 0.0175 to 0.045. |
| When 57.5 ≤ θ < 58.5 | h/λ is 0.0185 to 0.045. |
| When 58.5 ≤ θ < 59.5 | h/λ is 0.019 to 0.045. |
| When 59.5 ≤ θ < 60.5 | h/λ is 0.0195 to 0.045. |
| When 60.5 ≤ θ < 61.5 | h/λ is 0.0205 to 0.045. |
| When 61.5 ≤ θ < 62.5 | h/λ is 0.021 to 0.045. |
| When 62.5 ≤ θ < 63.5 | h/λ is 0.0215 to 0.045. |
| When 63.5 ≤ θ < 64.5 | h/λ is 0.022 to 0.045. |
| When 64.5 ≤ θ < 66.5 | h/λ is 0.0225 to 0.045. |
| When 66.5 ≤ θ < 67.5 | h/λ is 0.023 to 0.045. |
| When 67.5 ≤ θ < 68.5 | h/λ is 0.0235 to 0.045. |
| When 68.5 ≤ θ < 70.5 | h/λ is 0.024 to 0.045. |
| When 70.5 ≤ θ < 72.5 | h/λ is 0.0245 to 0.045. |
| When 72.5 ≤ θ < 74.5 | h/λ is 0.025 to 0.045. |
| When 74.5 ≤ θ < 76.5 | h/λ is 0.0255 to 0.045. |
| When 76.5 ≤ θ < 79.5 | h/λ is 0.026 to 0.045. |
| When 79.5 ≤ θ < 82.5 | h/λ is 0.0265 to 0.045. |
| When 82.5 ≤ θ < 95.5 | h/λ is 0.027 to 0.045. |
| When 95.5 ≤ θ < 98.5 | h/λ is 0.0265 to 0.045. |
| When 98.5 ≤ θ < 100.5 | h/λ is 0.026 to 0.045. |
| When 100.5 ≤ θ < 101.5 | h/λ is 0.0255 to 0.045. |
| When 101.5 ≤ θ < 157.5 | h/λ is 0.005 to 0.045. |
| When 157.5 ≤ θ < 158.5 | h/λ is 0.0075 to 0.045. |
| When 158.5 ≤ θ < 159.5 | h/λ is 0.01 to 0.045. |
| When 159.5 ≤ θ < 160.5 | h/λ is 0.0115 to 0.045. |
| When 160.5 ≤ θ < 161.5 | h/λ is 0.0125 to 0.045. |
| When 161.5 ≤ θ < 162.5 | h/λ is 0.014 to 0.045. |
| When 162.5 ≤ θ < 163.5 | h/λ is 0.015 to 0.045. |
| When 163.5 ≤ θ < 164.5 | h/λ is 0.016 to 0.045. |
| When 164.5 ≤ θ < 165.5 | h/λ is 0.0165 to 0.045. |
| When 165.5 ≤ θ < 166.5 | h/λ is 0.0175 to 0.045. |
| When 166.5 ≤ θ < 167.5 | h/λ is 0.018 to 0.045. |
| When 167.5 ≤ θ < 168.5 | h/λ is 0.0185 to 0.045. |
| When 168.5 ≤ θ < 169.5 | h/λ is 0.019 to 0.045. |
| When 169.5 ≤ θ < 170.5 | h/λ is 0.0195 to 0.045. |
| When 170.5 ≤ θ < 172.5 | h/λ is 0.02 to 0.045. |
| When 172.5 ≤ θ < 175.5 | h/λ is 0.0205 to 0.045. |
| When 175.5 ≤ θ < 180 | h/λ is 0.021 to 0.045. |

TABLE 30

For [0.75 ≤ H/λ < 0.85]

| | |
|---|---|
| When 0 ≤ θ < 3.5 | h/λ is 0.02 to 0.045. |
| When 3.5 ≤ θ < 5.5 | h/λ is 0.0195 to 0.045. |
| When 5.5 ≤ θ < 6.5 | h/λ is 0.019 to 0.045. |
| When 6.5 ≤ θ < 8.5 | h/λ is 0.0185 to 0.045. |
| When 8.5 ≤ θ < 9.5 | h/λ is 0.018 to 0.045. |
| When 9.5 ≤ θ < 10.5 | h/λ is 0.0175 to 0.045. |
| When 10.5 ≤ θ < 11.5 | h/λ is 0.017 to 0.045. |
| When 11.5 ≤ θ < 12.5 | h/λ is 0.016 to 0.045. |
| When 12.5 ≤ θ < 13.5 | h/λ is 0.0155 to 0.045. |
| When 13.5 ≤ θ < 14.5 | h/λ is 0.0145 to 0.045. |
| When 14.5 ≤ θ < 15.5 | h/λ is 0.014 to 0.045. |
| When 15.5 ≤ θ < 16.5 | h/λ is 0.013 to 0.045. |
| When 16.5 ≤ θ < 17.5 | h/λ is 0.0115 to 0.045. |
| When 17.5 ≤ θ < 18.5 | h/λ is 0.0105 to 0.045. |
| When 18.5 ≤ θ < 19.5 | h/λ is 0.0085 to 0.045. |

TABLE 30-continued

For [0.75 ≤ H/λ < 0.85]

| | |
|---|---|
| When 19.5 ≤ θ < 20.5 | h/λ is 0.0065 to 0.045. |
| When 20.5 ≤ θ < 51.5 | h/λ is 0.005 to 0.045. |
| When 51.5 ≤ θ < 52.5 | h/λ is 0.0085 to 0.045. |
| When 52.5 ≤ θ < 53.5 | h/λ is 0.0115 to 0.045. |
| When 53.5 ≤ θ < 54.5 | h/λ is 0.013 to 0.045. |
| When 54.5 ≤ θ < 55.5 | h/λ is 0.0145 to 0.045. |
| When 55.5 ≤ θ < 56.5 | h/λ is 0.016 to 0.045. |
| When 56.5 ≤ θ < 57.5 | h/λ is 0.017 to 0.045. |
| When 57.5 ≤ θ < 58.5 | h/λ is 0.0175 to 0.045. |
| When 58.5 ≤ θ < 59.5 | h/λ is 0.0185 to 0.045. |
| When 59.5 ≤ θ < 60.5 | h/λ is 0.019 to 0.045. |
| When 60.5 ≤ θ < 61.5 | h/λ is 0.0195 to 0.045. |
| When 61.5 ≤ θ < 62.5 | h/λ is 0.0205 to 0.045. |
| When 62.5 ≤ θ < 63.5 | h/λ is 0.021 to 0.045. |
| When 63.5 ≤ θ < 65.5 | h/λ is 0.0215 to 0.045. |
| When 65.5 ≤ θ < 66.5 | h/λ is 0.022 to 0.045. |
| When 66.5 ≤ θ < 67.5 | h/λ is 0.0225 to 0.045. |
| When 67.5 ≤ θ < 68.5 | h/λ is 0.023 to 0.045. |
| When 68.5 ≤ θ < 70.5 | h/λ is 0.0235 to 0.045. |
| When 70.5 ≤ θ < 72.5 | h/λ is 0.024 to 0.045. |
| When 72.5 ≤ θ < 74.5 | h/λ is 0.0245 to 0.045. |
| When 74.5 ≤ θ < 76.5 | h/λ is 0.025 to 0.045. |
| When 76.5 ≤ θ < 79.5 | h/λ is 0.0255 to 0.045. |
| When 79.5 ≤ θ < 83.5 | h/λ is 0.026 to 0.045. |
| When 83.5 ≤ θ < 96.5 | h/λ is 0.0265 to 0.045. |
| When 96.5 ≤ θ < 98.5 | h/λ is 0.026 to 0.045. |
| When 98.5 ≤ θ < 99.5 | h/λ is 0.025 to 0.045. |
| When 99.5 ≤ θ < 100.5 | h/λ is 0.0245 to 0.045. |
| When 100.5 ≤ θ < 159.5 | h/λ is 0.005 to 0.045. |
| When 159.5 ≤ θ < 160.5 | h/λ is 0.0055 to 0.045. |
| When 160.5 ≤ θ < 161.5 | h/λ is 0.009 to 0.045. |
| When 161.5 ≤ θ < 162.5 | h/λ is 0.011 to 0.045. |
| When 162.5 ≤ θ < 163.5 | h/λ is 0.0125 to 0.045. |
| When 163.5 ≤ θ < 164.5 | h/λ is 0.014 to 0.045. |
| When 164.5 ≤ θ < 165.5 | h/λ is 0.015 to 0.045. |
| When 165.5 ≤ θ < 166.5 | h/λ is 0.016 to 0.045. |
| When 166.5 ≤ θ < 167.5 | h/λ is 0.0165 to 0.045. |
| When 167.5 ≤ θ < 168.5 | h/λ is 0.017 to 0.045. |
| When 168.5 ≤ θ < 169.5 | h/λ is 0.018 to 0.045. |
| When 169.5 ≤ θ < 171.5 | h/λ is 0.0185 to 0.045. |
| When 171.5 ≤ θ < 172.5 | h/λ is 0.019 to 0.045. |
| When 172.5 ≤ θ < 174.5 | h/λ is 0.0195 to 0.045. |
| When 174.5 ≤ θ < 180 | h/λ is 0.02 to 0.045. |

TABLE 31

For [0.85 ≤ H/λ < 0.95]

| | |
|---|---|
| When 0 ≤ θ < 2.5 | h/λ is 0.0195 to 0.045. |
| When 2.5 ≤ θ < 4.5 | h/λ is 0.019 to 0.045. |
| When 4.5 ≤ θ < 6.5 | h/λ is 0.0185 to 0.045. |
| When 6.5 ≤ θ < 7.5 | h/λ is 0.018 to 0.045. |
| When 7.5 ≤ θ < 9.5 | h/λ is 0.0175 to 0.045. |
| When 9.5 ≤ θ < 10.5 | h/λ is 0.017 to 0.045. |
| When 10.5 ≤ θ < 11.5 | h/λ is 0.016 to 0.045. |
| When 11.5 ≤ θ < 12.5 | h/λ is 0.0155 to 0.045. |
| When 12.5 ≤ θ < 13.5 | h/λ is 0.015 to 0.045. |
| When 13.5 ≤ θ < 14.5 | h/λ is 0.014 to 0.045. |
| When 14.5 ≤ θ < 15.5 | h/λ is 0.013 to 0.045. |
| When 15.5 ≤ θ < 16.5 | h/λ is 0.012 to 0.045. |
| When 16.5 ≤ θ < 17.5 | h/λ is 0.011 to 0.045. |
| When 17.5 ≤ θ < 18.5 | h/λ is 0.009 to 0.045. |
| When 18.5 ≤ θ < 19.5 | h/λ is 0.007 to 0.045. |
| When 19.5 ≤ θ < 51.5 | h/λ is 0.007 to 0.045. |
| When 51.5 ≤ θ < 52.5 | h/λ is 0.0065 to 0.045. |
| When 52.5 ≤ θ < 53.5 | h/λ is 0.0105 to 0.045. |
| When 53.5 ≤ θ < 54.5 | h/λ is 0.0125 to 0.045. |
| When 54.5 ≤ θ < 55.5 | h/λ is 0.014 to 0.045. |
| When 55.5 ≤ θ < 56.5 | h/λ is 0.015 to 0.045. |
| When 56.5 ≤ θ < 57.5 | h/λ is 0.016 to 0.045. |
| When 57.5 ≤ θ < 58.5 | h/λ is 0.017 to 0.045. |
| When 58.5 ≤ θ < 59.5 | h/λ is 0.018 to 0.045. |
| When 59.5 ≤ θ < 60.5 | h/λ is 0.0185 to 0.045. |
| When 60.5 ≤ θ < 61.5 | h/λ is 0.019 to 0.045. |
| When 61.5 ≤ θ < 62.5 | h/λ is 0.02 to 0.045. |

TABLE 31-continued

For [0.85 ≤ H/λ < 0.95]

| | |
|---|---|
| When 62.5 ≤ θ < 63.5 | h/λ is 0.0205 to 0.045. |
| When 63.5 ≤ θ < 64.5 | h/λ is 0.021 to 0.045. |
| When 64.5 ≤ θ < 65.5 | h/λ is 0.0215 to 0.045. |
| When 65.5 ≤ θ < 66.5 | h/λ is 0.022 to 0.045. |
| When 66.5 ≤ θ < 68.5 | h/λ is 0.0225 to 0.045. |
| When 68.5 ≤ θ < 70.5 | h/λ is 0.023 to 0.045. |
| When 70.5 ≤ θ < 72.5 | h/λ is 0.0235 to 0.045. |
| When 72.5 ≤ θ < 74.5 | h/λ is 0.024 to 0.045. |
| When 74.5 ≤ θ < 76.5 | h/λ is 0.0245 to 0.045. |
| When 76.5 ≤ θ < 79.5 | h/λ is 0.025 to 0.045. |
| When 79.5 ≤ θ < 82.5 | h/λ is 0.0255 to 0.045. |
| When 82.5 ≤ θ < 92.5 | h/λ is 0.026 to 0.045. |
| When 92.5 ≤ θ < 95.5 | h/λ is 0.0255 to 0.045. |
| When 95.5 ≤ θ < 97.5 | h/λ is 0.025 to 0.045. |
| When 97.5 ≤ θ < 98.5 | h/λ is 0.0245 to 0.045. |
| When 98.5 ≤ θ < 163.5 | h/λ is 0.05 to 0.045. |
| When 163.5 ≤ θ < 164.5 | h/λ is 0.0105 to 0.045. |
| When 164.5 ≤ θ < 165.5 | h/λ is 0.012 to 0.045. |
| When 165.5 ≤ θ < 166.5 | h/λ is 0.0135 to 0.045. |
| When 166.5 ≤ θ < 167.5 | h/λ is 0.015 to 0.045. |
| When 167.5 ≤ θ < 168.5 | h/λ is 0.016 to 0.045. |
| When 168.5 ≤ θ < 169.5 | h/λ is 0.0165 to 0.045. |
| When 169.5 ≤ θ < 170.5 | h/λ is 0.017 to 0.045. |
| When 170.5 ≤ θ < 171.5 | h/λ is 0.0175 to 0.045. |
| When 171.5 ≤ θ < 172.5 | h/λ is 0.018 to 0.045. |
| When 172.5 ≤ θ < 174.5 | h/λ is 0.0185 to 0.045. |
| When 174.5 ≤ θ < 176.5 | h/λ is 0.019 to 0.045. |
| When 176.5 ≤ θ < 180 | h/λ is 0.0195 to 0.045. |

TABLE 32

For [0.95 ≤ H/λ < 1.00]

| | |
|---|---|
| When 0 ≤ θ < 1.5 | h/λ is 0.019 to 0.04. |
| When 1.5 ≤ θ < 4.5 | h/λ is 0.0185 to 0.04. |
| When 4.5 ≤ θ < 6.5 | h/λ is 0.018 to 0.04. |
| When 6.5 ≤ θ < 7.5 | h/λ is 0.0175 to 0.04. |
| When 7.5 ≤ θ < 8.5 | h/λ is 0.017 to 0.04. |
| When 8.5 ≤ θ < 9.5 | h/λ is 0.0165 to 0.04. |
| When 9.5 ≤ θ < 10.5 | h/λ is 0.016 to 0.04. |
| When 10.5 ≤ θ < 11.5 | h/λ is 0.0155 to 0.04. |
| When 11.5 ≤ θ < 12.5 | h/λ is 0.015 to 0.04. |
| When 12.5 ≤ θ < 13.5 | h/λ is 0.014 to 0.04. |
| When 13.5 ≤ θ < 14.5 | h/λ is 0.0135 to 0.04. |
| When 14.5 ≤ θ < 15.5 | h/λ is 0.0125 to 0.04. |
| When 15.5 ≤ θ < 16.5 | h/λ is 0.0115 to 0.04. |
| When 16.5 ≤ θ < 17.5 | h/λ is 0.01 to 0.04. |
| When 17.5 ≤ θ < 18.5 | h/λ is 0.008 to 0.04. |
| When 18.5 ≤ θ < 19.5 | h/λ is 0.006 to 0.04. |
| When 19.5 ≤ θ < 52.5 | h/λ is 0.005 to 0.04. |
| When 52.5 ≤ θ < 53.5 | h/λ is 0.009 to 0.04. |
| When 53.5 ≤ θ < 54.5 | h/λ is 0.0115 to 0.04. |
| When 54.5 ≤ θ < 55.5 | h/λ is 0.013 to 0.04. |
| When 55.5 ≤ θ < 56.5 | h/λ is 0.0145 to 0.04. |
| When 56.5 ≤ θ < 57.5 | h/λ is 0.0155 to 0.04. |
| When 57.5 ≤ θ < 58.5 | h/λ is 0.0165 to 0.04. |
| When 58.5 ≤ θ < 59.5 | h/λ is 0.0175 to 0.04. |
| When 59.5 ≤ θ < 60.5 | h/λ is 0.018 to 0.04. |
| When 60.5 ≤ θ < 61.5 | h/λ is 0.019 to 0.04. |
| When 61.5 ≤ θ < 62.5 | h/λ is 0.0195 to 0.04. |
| When 62.5 ≤ θ < 63.5 | h/λ is 0.02 to 0.04. |
| When 63.5 ≤ θ < 64.5 | h/λ is 0.0205 to 0.04. |
| When 64.5 ≤ θ < 65.5 | h/λ is 0.021 to 0.04. |
| When 65.5 ≤ θ < 66.5 | h/λ is 0.0215 to 0.04. |
| When 66.5 ≤ θ < 68.5 | h/λ is 0.022 to 0.04. |
| When 68.5 ≤ θ < 69.5 | h/λ is 0.0225 to 0.04. |
| When 69.5 ≤ θ < 71.5 | h/λ is 0.023 to 0.04. |
| When 71.5 ≤ θ < 73.5 | h/λ is 0.0235 to 0.04. |
| When 73.5 ≤ θ < 75.5 | h/λ is 0.024 to 0.04. |
| When 75.5 ≤ θ < 78.5 | h/λ is 0.0245 to 0.04. |
| When 78.5 ≤ θ < 81.5 | h/λ is 0.025 to 0.04. |
| When 81.5 ≤ θ < 92.5 | h/λ is 0.0255 to 0.04. |
| When 92.5 ≤ θ < 94.5 | h/λ is 0.025 to 0.04. |
| When 94.5 ≤ θ < 95.5 | h/λ is 0.0245 to 0.04. |
| When 95.5 ≤ θ < 166.5 | h/λ is 0.005 to 0.04. |

TABLE 32-continued

For [0.95 ≤ H/λ < 1.00]

| | |
|---|---|
| When 166.5 ≤ θ < 167.5 | h/λ is 0.0115 to 0.04. |
| When 167.5 ≤ θ < 168.5 | h/λ is 0.0135 to 0.04. |
| When 168.5 ≤ θ < 169.5 | h/λ is 0.015 to 0.04. |
| When 169.5 ≤ θ < 170.5 | h/λ is 0.0155 to 0.04. |
| When 170.5 ≤ θ < 171.5 | h/λ is 0.0165 to 0.04. |
| When 171.5 ≤ θ < 172.5 | h/λ is 0.017 to 0.04. |
| When 172.5 ≤ θ < 173.5 | h/λ is 0.0175 to 0.04. |
| When 173.5 ≤ θ < 175.5 | h/λ is 0.018 to 0.04. |
| When 175.5 ≤ θ < 178.5 | h/λ is 0.0185 to 0.04. |
| When 178.5 ≤ θ < 180 | h/λ is 0.019 to 0.04. |

The results shown in FIGS. 20 to 28 illustrate that in order to adjust the electromechanical coupling coefficient $K^2$ to about 2% or greater, θ of the Euler angles and the normalized thickness h/λ of IDT electrodes may be combined as shown in Tables 33 to 42 depending on the normalized thickness H/λ of $SiO_2$ films.

TABLE 33

For [0.05 ≤ H/λ < 0.15]

| | |
|---|---|
| When 0 ≤ θ < 48.5 | h/λ does not exist. |
| When 48.5 ≤ θ < 49.5 | h/λ is 0.04 to 0.0415. |
| When 49.5 ≤ θ < 50.5 | h/λ is 0.0255 to 0.05. |
| When 50.5 ≤ θ < 51.5 | h/λ is 0.02 to 0.05. |
| When 51.5 ≤ θ < 52.5 | h/λ is 0.016 to 0.05. |
| When 52.5 ≤ θ < 53.5 | h/λ is 0.0135 to 0.05. |
| When 53.5 ≤ θ < 54.5 | h/λ is 0.011 to 0.05. |
| When 54.5 ≤ θ < 55.5 | h/λ is 0.0095 to 0.05. |
| When 55.5 ≤ θ < 56.5 | h/λ is 0.008 to 0.05. |
| When 56.5 ≤ θ < 57.5 | h/λ is 0.0065 to 0.05. |
| When 57.5 ≤ θ < 58.5 | h/λ is 0.0055 to 0.05. |
| When 58.5 ≤ θ < 122.5 | h/λ is 0.005 to 0.05. |
| When 122.5 ≤ θ < 123.5 | h/λ is 0.0055 to 0.05. |
| When 123.5 ≤ θ < 124.5 | h/λ is 0.007 to 0.05. |
| When 124.5 ≤ θ < 125.5 | h/λ is 0.0055 to 0.05. |
| When 125.5 ≤ θ < 129.5 | h/λ is 0.005 to 0.05. |
| When 129.5 ≤ θ < 130.5 | h/λ is 0.0105 to 0.05. |
| When 130.5 ≤ θ < 132.5 | h/λ is 0.012 to 0.05. |
| When 132.5 ≤ θ < 142.5 | h/λ is 0.0115 to 0.05. |
| When 142.5 ≤ θ < 143.5 | h/λ is 0.012 to 0.05. |
| When 143.5 ≤ θ < 144.5 | h/λ is 0.0125 to 0.05. |
| When 144.5 ≤ θ < 146.5 | h/λ is 0.013 to 0.05. |
| When 146.5 ≤ θ < 150.5 | h/λ is 0.0135 to 0.05. |
| When 150.5 ≤ θ < 152.5 | h/λ is 0.013 to 0.05. |
| When 152.5 ≤ θ < 154.5 | h/λ is 0.005 or 0.013 to 0.05. |
| When 154.5 ≤ θ < 155.5 | h/λ is 0.005 to 0.0055 or 0.013 to 0.05. |
| When 155.5 ≤ θ < 156.5 | h/λ is 0.005 to 0.0055 or 0.0125 to 0.05. |
| When 156.5 ≤ θ < 157.5 | h/λ is 0.005 or 0.0125 to 0.05 |
| When 157.5 ≤ θ < 158.5 | h/λ is 0.005 to 0.0055 or 0.0125 to 0.05. |
| When 158.5 ≤ θ < 159.5 | h/λ is 0.005 to 0.006 or 0.0125 to 0.05. |
| When 159.5 ≤ θ < 160.5 | h/λ is 0.005 or 0.0125 to 0.05. |
| When 160.5 ≤ θ < 161.5 | h/λ is 0.005 to 0.0055 or 0.0125 to 0.05. |
| When 161.5 ≤ θ < 162.5 | h/λ is 0.005 to 0.0065 or 0.0125 to 0.05. |
| When 162.5 ≤ θ < 163.5 | h/λ is 0.005 to 0.0055 or 0.0125 to 0.05. |
| When 163.5 ≤ θ < 171.5 | h/λ is 0.0125 to 0.05. |
| When 171.5 ≤ θ < 172.5 | h/λ is 0.0125 to 0.0485. |
| When 172.5 ≤ θ < 173.5 | h/λ is 0.0125 to 0.0455. |
| When 173.5 ≤ θ < 174.5 | h/λ is 0.0125 to 0.042. |
| When 174.5 ≤ θ < 175.5 | h/λ is 0.0125 to 0.038. |
| When 175.5 ≤ θ < 176.5 | h/λ is 0.0125 to 0.032. |
| When 176.5 ≤ θ < 180 | h/λ is 0.013 to 0.0145. |

TABLE 34

For [0.15 ≤ H/λ < 0.25]

| | |
|---|---|
| When 0 ≤ θ < 0.5 | h/λ is 0.01 to 0.0345. |
| When 0.5 ≤ θ < 1.5 | h/λ is 0.014 to 0.0285. |
| When 1.5 ≤ θ < 45.5 | h/λ does not exist. |
| When 45.5 ≤ θ < 46.5 | h/λ is 0.0235 to 0.05. |
| When 46.5 ≤ θ < 47.5 | h/λ is 0.0165 to 0.05. |

TABLE 34-continued

For [0.15 ≤ H/λ < 0.25]

| | |
|---|---|
| When 47.5 ≤ θ < 48.5 | h/λ is 0.0115 to 0.05. |
| When 48.5 ≤ θ < 49.5 | h/λ is 0.008 to 0.05. |
| When 49.5 ≤ θ < 130.5 | h/λ is 0.005 to 0.05. |
| When 130.5 ≤ θ < 131.5 | h/λ is 0.006 to 0.05. |
| When 131.5 ≤ θ < 132.5 | h/λ is 0.007 to 0.05. |
| When 132.5 ≤ θ < 142.5 | h/λ is 0.0075 to 0.05. |
| When 142.5 ≤ θ < 144.5 | h/λ is 0.008 to 0.05. |
| When 144.5 ≤ θ < 148.5 | h/λ is 0.0085 to 0.05. |
| When 148.5 ≤ θ < 157.5 | h/λ is 0.008 to 0.05. |
| When 157.5 ≤ θ < 166.5 | h/λ is 0.0075 to 0.05. |
| When 166.5 ≤ θ < 169.5 | h/λ is 0.007 to 0.05. |
| When 169.5 ≤ θ < 170.5 | h/λ is 0.0065 to 0.05. |
| When 170.5 ≤ θ < 171.5 | h/λ is 0.007 to 0.05. |
| When 171.5 ≤ θ < 172.5 | h/λ is 0.0075 to 0.05. |
| When 172.5 ≤ θ < 175.5 | h/λ is 0.008 to 0.05. |
| When 175.5 ≤ θ < 176.5 | h/λ is 0.008 to 0.0485. |
| When 176.5 ≤ θ < 177.5 | h/λ is 0.0085 to 0.0455. |
| When 177.5 ≤ θ < 178.5 | h/λ is 0.0085 to 0.0425. |
| When 178.5 ≤ θ < 179.5 | h/λ is 0.0085 to 0.0385. |
| When 179.5|[M5] ≤ θ < 180 | h/λ is 0.009 to 0.0345. |

TABLE 35

For [0.25 ≤ H/λ < 0.35]

| | |
|---|---|
| When 0 ≤ θ < 0.5 | h/λ is 0.005 to 0.0455. |
| When 0.5 ≤ θ < 1.5 | h/λ is 0.005 to 0.0445. |
| When 1.5 ≤ θ < 2.5 | h/λ is 0.005 to 0.041. |
| When 2.5 ≤ θ < 3.5 | h/λ is 0.005 to 0.037. |
| When 3.5 ≤ θ < 4.5 | h/λ is 0.005 to 0.032. |
| When 4.5 ≤ θ < 5.5 | h/λ is 0.005 to 0.025. |
| When 5.5 ≤ θ < 42.5 | h/λ does not exist. |
| When 42.5 ≤ θ < 43.5 | h/λ is 0.023 to 0.05. |
| When 43.5 ≤ θ < 44.5 | h/λ is 0.015 to 0.05. |
| When 44.5 ≤ θ < 45.5 | h/λ is 0.01 to 0.05. |
| When 45.5 ≤ θ < 46.5 | h/λ is 0.006 to 0.05. |
| When 46.5 ≤ θ < 179.5 | h/λ is 0.005 to 0.05. |
| When 179.5 ≤ θ < 180 | h/λ is 0.005 to 0.048. |

TABLE 36

For [0.35 ≤ H/λ < 0.45]

| | |
|---|---|
| When 0 ≤ θ < 2.5 | h/λ is 0.005 to 0.045. |
| When 2.5 ≤ θ < 3.5 | h/λ is 0.005 to 0.0475. |
| When 3.5 ≤ θ < 4.5 | h/λ is 0.005 to 0.044. |
| When 4.5 ≤ θ < 5.5 | h/λ is 0.005 to 0.04. |
| When 5.5 ≤ θ < 6.5 | h/λ is 0.005 to 0.0355. |
| When 6.5 ≤ θ < 7.5 | h/λ is 0.005 to 0.029. |
| When 7.5 ≤ θ < 39.5 | h/λ does not exist. |
| When 39.5 ≤ θ < 40.5 | h/λ is 0.0355 to 0.05. |
| When 40.5 ≤ θ < 41.5 | h/λ is 0.021 to 0.05. |
| When 41.5 ≤ θ < 42.5 | h/λ is 0.0135 to 0.05. |
| When 42.5 ≤ θ < 43.5 | h/λ is 0.008 to 0.05. |
| When 43.5 ≤ θ < 180 | h/λ is 0.005 to 0.05. |

TABLE 37

For [0.45 ≤ H/λ < 0.55]

| | |
|---|---|
| When 0 ≤ θ < 7.5 | h/λ is 0.005 to 0.045. |
| When 7.5 ≤ θ < 8.5 | h/λ is 0.006 to 0.045. |
| When 8.5 ≤ θ < 9.5 | h/λ is 0.0105 to 0.045. |
| When 9.5 ≤ θ < 38.5 | h/λ is 0.0455 to 0.045. |
| When 38.5 ≤ θ < 39.5 | h/λ is 0.0265 to 0.045. |
| When 39.5 ≤ θ < 40.5 | h/λ is 0.016 to 0.045. |
| When 41.5 ≤ θ < 180 | h/λ is 0.005 to 0.045. |

TABLE 38

For [0.55 ≤ H/λ < 0.65]

| | |
|---|---|
| When 0 ≤ θ < 8.5 | h/λ is 0.005 to 0.045. |
| When 8.5 ≤ θ < 9.5 | h/λ is 0.006 to 0.045. |
| When 9.5 ≤ θ < 10.5 | h/λ is 0.0115 to 0.045. |
| When 10.5 ≤ θ < 36.5 | h/λ is 0.0455 to 0.045. |
| When 36.5 ≤ θ < 37.5 | h/λ is 0.044 to 0.045. |
| When 37.5 ≤ θ < 38.5 | h/λ is 0.026 to 0.045. |
| When 38.5 ≤ θ < 39.5 | h/λ is 0.0155 to 0.045. |
| When 39.5 ≤ θ < 40.5 | h/λ is 0.009 to 0.045. |
| When 40.5 ≤ θ < 180 | h/λ is 0.005 to 0.045. |

TABLE 39

For [0.65 ≤ H/λ < 0.75]

| | |
|---|---|
| When 0 ≤ θ < 7.5 | h/λ is 0.005 to 0.045. |
| When 7.5 ≤ θ < 8.5 | h/λ is 0.005 to 0.0435. |
| When 8.5|[M6] ≤ θ < 9.5 | h/λ is 0.005 to 0.0385. |
| When 9.5 ≤ θ < 10.5 | h/λ is 0.009 to 0.032. |
| When 10.5 ≤ θ < 36.5 | h/λ does not exist. |
| When 36.5 ≤ θ < 37.5 | h/λ is 0.0305 to 0.045. |
| When 37.5 ≤ θ < 38.5 | h/λ is 0.0185 to 0.045. |
| When 38.5 ≤ θ < 39.5 | h/λ is 0.0105 to 0.045. |
| When 39.5 ≤ θ < 40.5 | h/λ is 0.0055 to 0.045. |
| When 40.5 ≤ θ < 180 | h/λ is 0.005 to 0.045. |

TABLE 40

For [0.75 ≤ H/λ < 0.85]

| | |
|---|---|
| When 0 ≤ θ < 8.5 | h/λ is 0.005 to 0.045. |
| When 8.5 ≤ θ < 9.5 | h/λ is 0.005 to 0.0405. |
| When 9.5 ≤ θ < 10.5 | h/λ is 0.009 to 0.035. |
| When 10.5 ≤ θ < 11.5 | h/λ is 0.017 to 0.023. |
| When 11.5 ≤ θ < 35.5 | h/λ does not exist. |
| When 35.5 ≤ θ < 36.5 | h/λ is 0.042 to 0.045. |
| When 36.5 ≤ θ < 37.5 | h/λ is 0.0245 to 0.045. |
| When 37.5 ≤ θ < 38.5 | h/λ is 0.014 to 0.045. |
| When 38.5 ≤ θ < 39.5 | h/λ is 0.0075 to 0.045. |
| When 39.5 ≤ θ < 180 | h/λ is 0.005 to 0.045. |

TABLE 41

For [0.85 ≤ H/λ < 0.95]

| | |
|---|---|
| When 0 ≤ θ < 8.5 | h/λ is 0.005 to 0.045. |
| When 8.5 ≤ θ < 9.5 | h/λ is 0.007 to 0.0415. |
| When 9.5 ≤ θ < 10.5 | h/λ is 0.01 to 0.036. |
| When 10.5 ≤ θ < 11.5 | h/λ is 0.018 to 0.0255. |
| When 11.5 ≤ θ < 35.5 | h/λ does not exist. |
| When 35.5 ≤ θ < 36.5 | h/λ is 0.037 to 0.045. |
| When 36.5 ≤ θ < 37.5 | h/λ is 0.0215 to 0.045. |
| When 37.5 ≤ θ < 38.5 | h/λ is 0.012 to 0.045. |
| When 38.5 ≤ θ < 39.5 | h/λ is 0.006 to 0.045. |
| When 39.5 ≤ θ < 180 | h/λ is 0.005 to 0.045. |

TABLE 42

For [0.95 ≤ H/λ < 1.00]

| | |
|---|---|
| When 0 ≤ θ < 7.5 | h/λ is 0.005 to 0.04. |
| When 7.5 ≤ θ < 8.5 | h/λ is 0.007 to 0.04. |
| When 8.5 ≤ θ < 9.5 | h/λ is 0.009 to 0.04. |
| When 9.5 ≤ θ < 10.5 | h/λ is 0.012 to 0.04. |
| When 10.5 ≤ θ < 11.5 | h/λ is 0.02 to 0.04. |
| When 11.5 ≤ θ < 35.5 | h/λ does not exist. |
| When 35.5 ≤ θ < 36.5 | h/λ is 0.034 to 0.04. |
| When 36.5 ≤ θ < 37.5 | h/λ is 0.0195 to 0.04. |
| When 37.5 ≤ θ < 38.5 | h/λ is 0.0105 to 0.04. |
| When 38.5 ≤ θ < 180 | h/λ is 0.005 to 0.04. |

In Experiments 1 to 3, the IDT electrodes were made of Au. The IDT electrodes may be made of another metal. When the IDT electrodes are made of a metal other than Au, the range of (h/λ)×a may be selected as the range of h/λ of the IDT electrodes made of Au for the normalized thickness h/λ. That is, the range of (h/λ)×a may preferably be selected as shown in Tables 1 to 20. Herein, a represents the ratio of the density of a metal of the IDT electrodes to the density of Au.

The reason why the range of (h/λ)×a may be used instead of the range of h/λ when the IDT electrodes are made of a metal other than Au is that substantially the same boundary acoustic wave velocity as the boundary acoustic wave velocity of the IDT electrodes made of Au is obtained by normalizing the thickness of the IDT electrodes as applied to the density of the metal.

When the IDT electrodes are made of a metal other than Au, (h/λ)×a may preferably be used instead of h/λ, which is used for Au. Electrodes including the IDT electrodes may each include a metal laminate film formed by stacking a plurality of metal layers, which are preferably each made of a corresponding one of Pt or Al. The metal laminate film preferably includes Pt layers and Al layers as main electrode layers, for example. This enables the resistance of electrode fingers to be reduced and, therefore, enables properties thereof to be improved. The Pt layers may preferably be disposed on the piezoelectric substrate side or the first medium layer side. A Pt layer may preferably be disposed between two of the Al layers.

The metal laminate film, which is formed by stacking the metal layers, preferably includes a metal layer abutting the piezoelectric substrate, a metal layer abutting the first medium layer, and a metal layer which is arranged at at least one location between the metal layers abutting the piezoelectric substrate and the first medium layer and which is made of at least one material selected from the group consisting of Ti, Ni, and NiCr, for example. The metal layer provides increased adhesion to the piezoelectric substrate, increased adhesion to the first medium layer, and/or increased adhesion between the metal layers.

Experiments performed by the inventors have verified that substantially the same results are obtained even if φ and ψ of Euler angles slightly shift from 0° with respect to Euler angles (0°, θ, 0°). That is, when φ is within the range of about 0°±5° and ψ is within the range of about 0°±25°, substantially the same results are obtained.

The Euler angles of LiTaO₃ may be Euler angles equivalent in boundary acoustic wave properties from Equation (A) below.

$$F(\varphi, \theta, \psi) = F(60° + \varphi, -\theta, \psi)$$
$$= F(60° - \varphi, -\theta, 180° - \psi)$$
$$= F(\varphi, 180° + \theta, 180° - \psi)$$
$$= F(\varphi, \theta, 180° + \psi)$$

Equation (A)

Experiment 4

Figure 7:
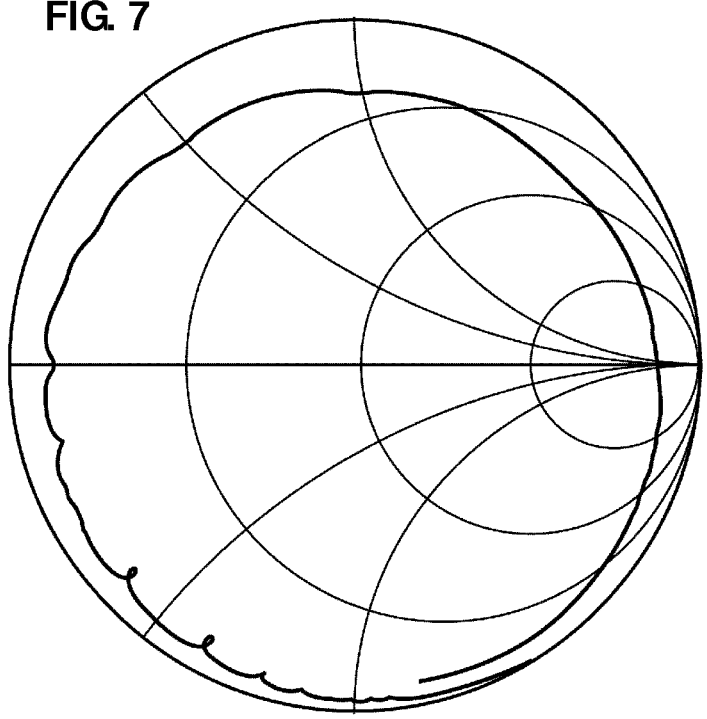
FIG. 7 is an impedance Smith chart of a one-port type boundary acoustic wave resonator including a first medium layer which is made of $SiO_2$ with Euler angles (0°, 132°, 0°) and which has a normalized thickness H/λ of about 40% and IDT electrodes which are made of Pt and which have a normalized thickness (h/λ)×a of about 3.0%.
Figure 8:
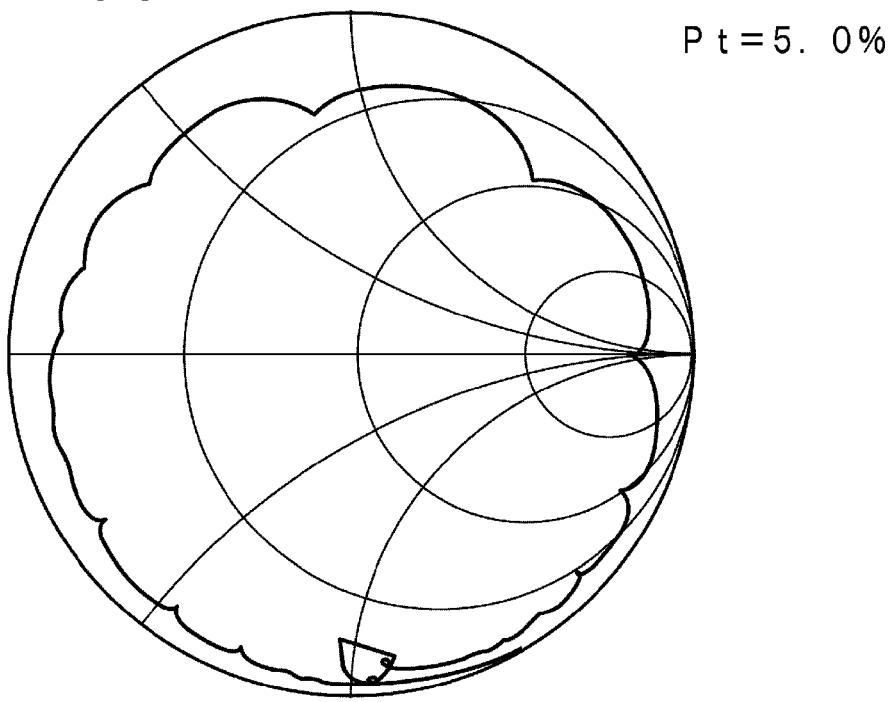
FIG. 8 is an impedance Smith chart of a one-port type boundary acoustic wave resonator including a first medium layer which is made of $SiO_2$ with Euler angles (0°, 132°, 0°) and which has a normalized thickness H/λ of about 40% and IDT electrodes which are made of Pt and which have a normalized thickness (h/λ)×a of about 5.0%.
Figure 9:
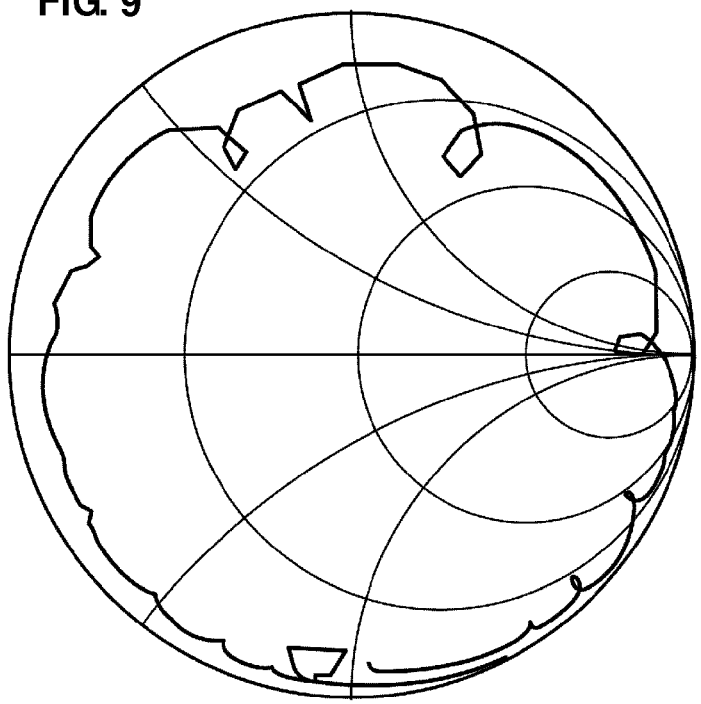
FIG. 9 is an impedance Smith chart of a one-port type boundary acoustic wave resonator including a first medium layer which is made of $SiO_2$ with Euler angles (0°, 132°, 0°) and which has a normalized thickness H/λ of about 40% and IDT electrodes which are made of Pt and which have a normalized thickness (h/λ)×a of about 6.0%.

Boundary acoustic wave devices were prepared in substantially the same manner as described in Experiment 1, except that IDT electrodes were made of Pt films and the normalized thickness h/λ of the IDT electrodes was adjusted such that (h/λ)×a was about 3.0%, about 5.0%, or about 6.0%. The normalized thickness H/λ (%) of SiO₂ was about 40%. The Euler angles of LiTaO₃ were (0°, 132°, 0°). FIGS. 7 to 9 show the impedance Smith charts of the boundary acoustic wave devices, in which the normalized thickness of the Pt films was about 3.0%, about 5.0%, or about 6.0%.

As is clear from FIGS. 7 to 9, a transverse-mode ripple can be effectively suppressed by reducing (h/λ)×a from about 6.0% to about 5.0% or less.

Therefore, it is clear that in a structure including first and second medium layers disposed on LiTaO₃, a transverse-mode ripple can be effectively suppressed by adjusting the normalized thickness (h/λ)×a of IDT electrodes to about 5% or less, that is, about 0.05 or less.

In each of Experiments 1 to 4, the first medium layer 3 was made of SiO₂ and the second medium layer 4 was made of SiN. Substantially the same results were obtained when using SiON and AlN, instead of SiN.

Therefore, a second medium layer 4 can preferably be formed from at least one material selected from the group consisting of SiN, SiON, AlN, AlO, Si, SiC, diamond-like carbon, and polysilicon, for example.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A boundary acoustic wave device comprising:
   a piezoelectric substrate made of single-crystalline LiTaO₃;
   a first medium layer disposed on the piezoelectric substrate and made of a dielectric material;
   a second medium layer disposed on the first medium layer and made of a dielectric material having a sound velocity different from a sound velocity of the dielectric of the first medium layer; and
   at least one interdigital electrode disposed at a boundary between the piezoelectric substrate and the first medium layer and made of a metal; wherein
   the sound velocity of the first medium layer is less than a sound velocity of LiTaO₃, the sound velocity of the second medium layer is greater than the sound velocity of LiTaO₃, and the inequality (h/λ)×a≤0.05 is satisfied, where H is the thickness of the first medium layer, h is the thickness of the interdigital electrode, λ is a period of electrode fingers of the interdigital electrode, and a is a ratio of a density of the metal defining the interdigital electrode to a density of Au, and
   when the LiTaO₃ has Euler angles (0°±5°, θ, 0°±25°), the normalized thickness (h/λ)×a of the interdigital electrode is within one of ranges shown in Tables 16 and 17 with respect to the value of H/λ and the value of θ:

TABLE 16

| For [0.55 ≤ H/λ < 0.65] | |
|---|---|
| When 0 ≤ θ < 8.5 | (h/λ) X a is 0.005 to 0.045. |
| When 8.5 ≤ θ < 9.5 | (h/λ) X a is 0.006 to 0.045. |
| When 9.5 ≤ θ < 10.5 | (h/λ) X a is 0.0115 to 0.045. |
| When 10.5 ≤ θ < 36.5 | (h/λ) X a is 0.0455 to 0.045. |
| When 36.5 ≤ θ < 37.5 | (h/λ) X a is 0.044 to 0.045. |
| When 37.5 ≤ θ < 38.5 | (h/λ) X a is 0.026 to 0.045. |
| When 38.5 ≤ θ < 39.5 | (h/λ) X a is 0.0155 to 0.045. |
| When 39.5 ≤ θ < 40.5 | (h/λ) X a is 0.009 to 0.045. |
| When 40.5 ≤ θ < 180 | (h/λ) X a is 0.005 to 0.045. |

TABLE 17

| For [0.65 ≤ H/λ < 0.75] | |
|---|---|
| When 0 ≤ θ < 7.5 | (h/λ) X a is 0.005 to 0.045. |
| When 7.5 ≤ θ < 8.5 | (h/λ) X a is 0.005 to 0.0435. |
| When 8.5 ≤ θ < 9.5 | (h/λ) X a is 0.005 to 0.0385. |
| When 9.5 ≤ θ < 10.5 | (h/λ) X a is 0.009 to 0.032. |
| When 10.5 ≤ θ < 36.5 | (h/λ) X a does not exist. |
| When 36.5 ≤ θ < 37.5 | (h/λ) X a is 0.0305 to 0.045. |
| When 37.5 ≤ θ < 38.5 | (h/λ) X a is 0.0185 to 0.045. |
| When 38.5 ≤ θ < 39.5 | (h/λ) X a is 0.0105 to 0.045. |
| When 39.5 ≤ θ < 40.5 | (h/λ) X a is 0.0055 to 0.045. |
| When 40.5 ≤ θ < 180 | (h/λ) X a is 0.005 to 0.045. |

2. The boundary acoustic wave device according to claim 1, wherein the dielectric material of the first medium layer primarily includes $SiO_2$.

3. The boundary acoustic wave device according to claim 1, wherein the dielectric material of the second medium layer primarily includes at least one material selected from the group consisting of SiN, SiON, AlN, AlO, Si, SiC, diamond-like carbon, and polysilicon.

4. The boundary acoustic wave device according to claim 1, wherein the Euler angles of the $LiTaO_3$ are Euler angles equivalent in boundary acoustic wave properties from Equation (A):

$$F(\varphi, \theta, \psi) = F(60° + \varphi, -\theta, \psi)$$
$$= F(60° - \varphi, -\theta, 180° - \psi)$$
$$= F(\varphi, 180° + \theta, 180° - \psi)$$
$$= F(\varphi, \theta, 180° + \psi).$$

Equaiton (A)

5. The boundary acoustic wave device according to claim 1, wherein the interdigital electrode is made of Pt.

6. The boundary acoustic wave device according to claim 1, wherein the interdigital electrode includes an Al film disposed on a first medium layer side and a Pt film disposed on a piezoelectric substrate side.

7. The boundary acoustic wave device according to claim 1, wherein the interdigital electrode includes a Pt film disposed on a first medium layer side and an Al film disposed on a piezoelectric substrate side.

8. The boundary acoustic wave device according to claim 1, wherein the interdigital electrode includes a metal laminate film including a first metal layer abutting the piezoelectric substrate, a second metal layer abutting the first medium layer, and a third metal layer which is arranged in at least one location between the first and second metal layers, and the third metal layer being made of at least one material selected from the group consisting of Ti, Ni, and NiCr.

\* \* \* \* \*